(12) United States Patent
Tsuchimura

(10) Patent No.: US 7,935,741 B2
(45) Date of Patent: May 3, 2011

(54) INK COMPOSITION, INKJET RECORDING METHOD, PRINTED MATERIAL, PROCESS FOR PRODUCING LITHOGRAPHIC PRINTING PLATE, AND LITHOGRAPHIC PRINTING PLATE

(75) Inventor: Tomotaka Tsuchimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 306 days.

(21) Appl. No.: 11/506,913

(22) Filed: Aug. 21, 2006

(65) Prior Publication Data

US 2007/0048506 A1 Mar. 1, 2007

(30) Foreign Application Priority Data

Aug. 31, 2005 (JP) .................. 2005-251500
Sep. 5, 2005 (JP) .................. 2005-256550
Sep. 8, 2005 (JP) .................. 2005-260685

(51) Int. Cl.
*C03C 25/10* (2006.01)
*B41M 5/00* (2006.01)
*B44C 1/17* (2006.01)
*G03G 7/00* (2006.01)
*B41J 2/435* (2006.01)

(52) U.S. Cl. ............ 522/172; 522/12; 522/67; 522/170; 428/195.1; 347/172; 427/511; 427/514

(58) Field of Classification Search .................. 522/170, 522/12, 67, 172; 427/511, 514; 428/195.1; 347/224
See application file for complete search history.

(56) References Cited

U.S. PATENT DOCUMENTS

| | | | | |
|---|---|---|---|---|
| 4,229,274 A * | 10/1980 | Carlblom | ........................ | 522/8 |
| 4,233,421 A * | 11/1980 | Worm | ........................ | 525/150 |
| 5,691,100 A * | 11/1997 | Kudo et al. | .................. | 430/170 |
| 2003/0222961 A1* | 12/2003 | Nakajima | .................... | 347/102 |
| 2004/0106700 A1* | 6/2004 | Yamanouchi et al. | ........ | 523/160 |
| 2004/0121399 A1* | 6/2004 | Brock et al. | .................. | 435/7.1 |
| 2005/0113477 A1* | 5/2005 | Oxman et al. | .................... | 522/6 |
| 2005/0113483 A1 | 5/2005 | Takabayashi | | |
| 2005/0221226 A1* | 10/2005 | Yamasaki | ................. | 430/270.1 |
| 2005/0260522 A1* | 11/2005 | Weber et al. | ............... | 430/270.1 |
| 2006/0211785 A1* | 9/2006 | Aoai | ................ | 522/7 |

FOREIGN PATENT DOCUMENTS

| | | |
|---|---|---|
| EP | 0 135 887 A2 | 4/1985 |
| EP | 0 927 726 A1 | 7/1999 |
| JP | 2004-091566 A | 3/2004 |

OTHER PUBLICATIONS

B. M. Monroe, et al.., "Photoinitiators for Free-Radical-Initiated Photoimaging Systems", Chem. Rev. vol. 93, p. 435-448 (1993).
European Search Report dated Jan. 30, 2007.

* cited by examiner

*Primary Examiner* — Mark Eashoo
*Assistant Examiner* — Jessica Paul
(74) *Attorney, Agent, or Firm* — Sughrue Mion, PLLC

(57) ABSTRACT

An ink composition is provided that includes a condensed polycyclic aromatic compound, a polymerization initiator, and a polymerizable compound, and the condensed polycyclic aromatic compound is a compound selected from the group consisting of a compound represented by the formula below, a compound having at least three hydroxy groups, alkoxy groups, and/or aryloxy groups on a condensed polycyclic aromatic ring, and a compound having at least one atom having an atomic weight of 32 or greater bonded to a condensed polycyclic aromatic ring and/or one group bonded to the condensed polycyclic aromatic ring via an atom having an atomic weight of 32 or greater. There are also provided a printed material obtained by employing the ink composition, a process for producing a lithographic printing plate employing the ink composition, and a lithographic printing plate obtained by the production process.

$$R^4{}_m\text{—Ar-}(A\text{-SiR}^1R^2R^3)_n$$

8 Claims, No Drawings

INK COMPOSITION, INKJET RECORDING METHOD, PRINTED MATERIAL, PROCESS FOR PRODUCING LITHOGRAPHIC PRINTING PLATE, AND LITHOGRAPHIC PRINTING PLATE

BACKGROUND OF THE INVENTION

1. Field of the Invention

The present invention relates to an ink composition suitably used for inkjet recording, an inkjet recording method, and a printed material employing same; furthermore, it relates to a lithographic printing plate obtained using the ink, and a process for producing a lithographic printing plate. More particularly, it relates to an ink composition suitable for inkjet recording that cures with high sensitivity upon exposure to radiation, can form a high quality image, and has good storage stability, an inkjet recording method, a printed material employing same, a lithographic printing plate obtained using the ink, and a process for producing a lithographic printing plate.

2. Description of the Related Art

With regard to an image recording method for forming an image on a recording medium such as paper based on an image data signal, there are an electrophotographic system, sublimation type and melt type thermal transfer systems, an inkjet system, etc. In the electrophotographic system, a process of forming an electrostatic latent image on a photosensitive drum by electrically charging and exposing is required, and the system is complicated; as a result, there is the problem that the production cost is high. With regard to the thermal transfer system, although the equipment is inexpensive, due to the use of an ink ribbon there is the problem that the running cost is high and waste material is generated. On the other hand, with regard to the inkjet system, the equipment is inexpensive and, since an image is formed directly on a recording medium by discharging an ink only on a required image area, the ink can be used efficiently and the running cost is low. Furthermore, there is little noise and it is excellent as an image recording system.

An ink composition that can be cured by exposure to radiation such as ultraviolet rays and, in particular, an inkjet recording ink (radiation curing type inkjet recording ink) are required to have sufficiently high sensitivity and provide a high image quality. By achieving higher sensitivity, a large number of benefits are provided, such as high curability toward radiation, a reduction in power consumption, longer lifetime due to a decrease in the load on a radiation generator, and prevention of formation of low molecular weight material originating from insufficient curing. Furthermore, higher sensitivity particularly improves the cure strength of an image formed using the ink composition and, in particular, the inkjet recording ink, particularly for the formation of a lithographic printing plate, and high plate life can be obtained.

In recent years, the UV-curing inkjet system has been attracting attention since it has relatively low odor and can record on a recording medium that does not have rapid drying properties or ink absorbing properties. In particular, benzil, benzoin, benzoin ethyl ether, Michler's ketone, anthraquinone, acridine, phenazine, benzophenone, 2-ethylanthraquinone, etc. are generally used as photopolymerization initiators (ref. e.g. Bruce M. Monroe et al., Chemical Reviews, Vol. 93, p. 435-448 (1993)). However, when these photopolymerization initiators are used, since the curing sensitivity of a photopolymerizable composition is low, a long period of time is required for image exposure in the formation of an image. Because of this, in the case of a fine image, if there is slight vibration during operation, the image cannot be reproduced with good image quality and, moreover, since it is necessary to increase the amount of energy radiation from an exposure light source, it is necessary to take into consideration the radiation of a large amount of heat generated thereby.

JP-A-2004-91556 (JP-A denotes a Japanese unexamined patent application publication) proposes the combined use of an oxetane compound and a sensitizer for the purpose of providing an actinic radiation-curing composition and an actinic radiation-curing ink that enable very stable recording of a highly precise image, even under various printing environments, with excellent character quality and without the mingling of colors.

BRIEF SUMMARY OF THE INVENTION

It is an object of the present invention, which has been accomplished while taking into consideration the above-mentioned problems, to provide an ink composition that cures with high sensitivity by exposure to radiation, can form a high quality image, has excellent adhesion to a recording medium, and has good storage stability, and an inkjet recording method employing the ink composition.

It is another object of the present invention to provide a printed material and a lithographic printing plate obtained using an ink composition that has excellent storage stability and can be cured with high sensitivity by exposure to ultraviolet rays, and a process for producing a lithographic printing plate.

The above-mentioned objects can be accomplished by (1), (6), and (8) to (10) below. (2) to (5) and (7), which are preferred embodiments, are also shown below.

(1) An ink composition comprising (a) a condensed polycyclic aromatic compound,
(b) a polymerization initiator, and (c) a polymerizable compound, the condensed polycyclic aromatic compound (a) being a compound selected from the group consisting of (a-1) a compound represented by Formula (1-I) below, (a-2) a compound having at least three hydroxy groups, alkoxy groups, and/or aryloxy groups on a condensed polycyclic aromatic ring, and (a-3) a compound having at least one atom having an atomic weight of 32 or greater bonded to a condensed polycyclic aromatic ring and/or one group bonded to the condensed polycyclic aromatic ring via an atom having an atomic weight of 32 or greater,

$$R^4{}_m\text{—Ar-}(A\text{-SiR}^1R^2R^3)_n \qquad (1\text{-I})$$

(in Formula (1-I), Ar denotes a group formed by removing (m+n) hydrogen atoms from the condensed polycyclic aromatic ring, A denotes a divalent connecting group, $R^1$ to $R^3$ independently denote a hydrogen atom, a hydrocarbon group, or an alkoxy group, $R^4$ denotes a monovalent organic group, the substitution number n for -(A-SiR$^1$R$^2$R$^3$) denotes an integer of 1 or greater, and the substitution number m for $R^4$ denotes an integer of 0 or greater, provided that (m+n) is no greater than the number of aromatic hydrogen atoms on the condensed polycyclic aromatic ring)

(2) the ink composition according to (1) above, wherein the ink composition comprises a colorant, (3) the ink composition according to (2) above, wherein the colorant is a pigment or an oil-soluble dye, (4) the ink composition according to (3) above, wherein the oil-soluble dye has an oxidation potential of 1.0 V (vs SCE) or greater, (5) the ink composition according to any one of (1) to (4) above, wherein it is for inkjet recording, (6) an inkjet recording method comprising (a') a step of discharging an ink composition onto a recording medium, and (b') a step of curing the ink composition by irradiating the discharged ink composition with actinic radiation, wherein the ink composition is the ink composition according to any one of (1) to (5) above, (7) the inkjet recording method according to (6) above, wherein the actinic radiation is ultraviolet radiation emitted by a light emitting diode that has a light emission peak wavelength in the range of 350 to 420 nm and generates ultraviolet radiation whose maximum illumination intensity on the surface of a recording medium is 10 to 2,000 mW/cm$^2$, (8) a printed material recorded by the inkjet recording method according to either (6) or (7) above, (9) a process for producing a lithographic printing plate, the process comprising (a") a step of discharging the ink composition according to any one of (1) to (5) above onto a hydrophilic support and (b") a step of curing the ink composition by irradiating the discharged ink composition with actinic radiation so as to form a hydrophobic image on the hydrophilic support from the cured ink composition,

(10) a lithographic printing plate produced by the process for producing a lithographic printing plate according to (9) above.

DETAILED DESCRIPTION OF THE INVENTION

The ink composition of the present invention is an ink composition comprising (a) a condensed polycyclic aromatic compound, (b) a polymerization initiator, and (c) a polymerizable compound, wherein the condensed polycyclic aromatic compound (a) is a compound selected from the group consisting of a compound (a-1) represented by Formula (1-I) below, a compound (a-2) having at least three hydroxy groups, alkoxy groups, and/or aryloxy groups on a condensed polycyclic aromatic ring, and a compound (a-3) having at least one atom having an atomic weight of 32 or greater bonded to a condensed polycyclic aromatic ring and/or one group bonded to the condensed polycyclic aromatic ring via an atom having an atomic weight of 32 or greater.

$$R^4{}_m\text{—Ar–}(A\text{-SiR}^1R^2R^3)_n \qquad (1\text{-I})$$

(In Formula (1-I), Ar denotes a group formed by removing (m+n) hydrogen atoms from the condensed polycyclic aromatic ring, A denotes a divalent connecting group, $R^1$ to $R^3$ independently denote a hydrogen atom, a hydrocarbon group, or an alkoxy group, $R^4$ denotes a monovalent organic group, the substitution number n for -(A-SiR$^1$R$^2$R$^3$) denotes an integer of 1 or greater, and the substitution number m for $R^4$ denotes an integer of 0 or greater, provided that (m+n) is no greater than the number of aromatic hydrogen atoms on the condensed polycyclic aromatic ring.)

The present invention is explained in detail below.

(1) Ink Composition

The ink composition of the present invention (hereinafter, also simply called an 'ink') can be cured by radiation, comprises (a) the above-mentioned condensed polycyclic aromatic compound, (b) a polymerization initiator, and (c) a polymerizable compound, and may comprise as necessary (d) a colorant, (e) a cosensitizer, and (f) another component.

The 'radiation' referred to in the present invention is not particularly limited as long as it is actinic radiation that can provide energy that enables an initiating species to be generated in the ink composition when irradiated, and broadly covers α rays, γ rays, X rays, ultraviolet rays, visible light, and an electron beam; among these ultraviolet rays and an electron beam are preferable from the viewpoint of curing sensitivity and the availability of equipment, and ultraviolet rays are particularly preferable. The ink composition of the present invention is therefore preferably an ink composition that can be cured by exposure to ultraviolet rays as radiation.

(a) Condensed Polycyclic Aromatic Compound (a-1) Compound represented by Formula (1-I)

The ink composition of the present invention preferably comprises a compound (a-1) represented by Formula (1-I) above. The compound represented by Formula (1-I) above may preferably be used singly or in a combination of two or more types.

Examples of the condensed polycyclic aromatic ring include anthracene, phenanthrene, naphthalene, indacene, acenaphthylene, fluoranthene, acephenanthrylene, aceanthrylene, tetracene, triphenylene, benzo[a]anthracene, pyrene, and chrysene; among these anthracene, phenanthrene, benzo[a]anthracene, and pyrene are preferable, and anthracene, phenanthrene, and pyrene are more preferable. Ar in Formula (1-I) is a group formed by removing a number of hydrogen atoms from the condensed polycyclic aromatic ring, the number being the sum of the substitution number n for -(A-SiR$^1$R$^2$R$^3$) and the substitution number m for $R^4$.

Examples of the divalent connecting group A in Formula (1-I) include a single bond, a divalent hydrocarbon group, a divalent heterocyclic group, —O—, —S—, —NH—, —NR— (R denotes a monovalent substituent), —SiR'R"— (R' and R" independently denote a monovalent substituent), —CO—, —SO$_2$—, —SO—, or a combination of two or more of these connecting groups.

In Formula (1-I) above, A is a divalent connecting group, and provides a connection between the silyl group and any position on the condensed polycyclic aromatic ring, and the substitution number for -(A-SiR$^1$R$^2$R$^3$) is n.

The substitution number n for A in Formula (1-I) denotes an integer of 1 or greater, preferably 1 to 10, more preferably 1 to 4, yet more preferably 1 to 3, and particularly preferably 1 or 2.

Furthermore, when n is 2 or greater, a divalent connecting group can be selected independently for each -(A-SiR$^1$R$^2$R$^3$) on the condensed polycyclic aromatic ring, and if it is possible two or more -(A-SiR$^1$R$^2$R$^3$) may be bonded together to form a ring. Furthermore, -(A-SiR$^1$R$^2$R$^3$) and $R^4$ may be bonded to form a ring.

Examples of the divalent hydrocarbon group include an alkylene group having 1 to 30 carbons (preferably 1 to 20 carbons, and more preferably 1 to 8 carbons), an alkenylene group having 2 to 30 carbons (preferably 2 to 20 carbons, and more preferably 2 to 8 carbons), an alkynylene group having 2 to 30 carbons (preferably 2 to 20 carbons, and more preferably 2 to 8 carbons), an arylene group having 6 to 30 carbons (preferably 6 to 20 carbons, and more preferably 6 to 10 carbons), a divalent hydrocarbon ring group having 3 to 30 carbons (preferably 3 to 20 carbons, and more preferably 3 to 10 carbons), or a group formed by combining the above, the above optionally having a substituent.

The divalent heterocyclic group is preferably a divalent heterocyclic group having 4 to 30 carbons, more preferably 4 to 20 carbons, and yet more preferably 4 to 10 carbons. Furthermore, the divalent heterocyclic group may have a substituent.

R in —NR— denotes a monovalent hydrocarbon group or a monovalent heterocyclic group, is preferably an alkyl group, alkenyl group, alkynyl group, aryl group, hydrocarbon ring group, or heterocyclic group, and may have a substituent.

R' and R" in —SiR'R"— independently denote a monovalent hydrocarbon group, a monovalent heterocyclic group, or an alkoxy group, which will be described later, are preferably an alkyl group, an alkenyl group, an alkynyl group, an aryl group, a hydrocarbon ring group, a heterocyclic group, or an alkoxy group, and may have a substituent.

With regard to the substituent, a monovalent non-metallic atomic group other than hydrogen is used, and preferred examples thereof include a halogen atom (—F, —Br, —Cl, —I), a hydroxy group, an alkyl group, an aryl group, an alkenyl group, an alkynyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and conjugate base group thereof (hereinafter, called a carboxylate), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and conjugate base group thereof (hereinafter, called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and conjugate base group thereof, an N-alkylsulfonylsulfamoyl group (—$SO_2NHSO_2$(alkyl)) and conjugate base group thereof, an N-arylsulfonylsulfamoyl group (—$SO_2NHSO_2$(aryl)) and conjugate base group thereof, an N-alkylsulfonylcarbamoyl group (—$CONHSO_2$(alkyl)) and conjugate base group thereof, an N-arylsulfonylcarbamoyl group (—$CONHSO_2$(aryl)) and conjugate base group thereof, a silyl group, an alkoxysilyl group (—Si(O-alkyl)$_3$), an aryloxysilyl group (—Si(O-aryl)$_3$), a hydroxysilyl group (—Si(OH)$_3$) and conjugate base group thereof, a phosphono group (—$PO_3H_2$) and conjugate base group thereof (hereinafter, called a phosphonate group), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and conjugate base group thereof (hereinafter, called an alkylphosphonate group), a monoarylphosphono group (—$PO_3H$(aryl)) and conjugate base group thereof (hereinafter, called an arylphosphonate group), a phosphonooxy group (—$OPO_3H_2$) and conjugate base group thereof (hereinafter, called a phosphonatooxy group), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and conjugate base group thereof (hereinafter, called an alkylphosphonatooxy group), a monoarylphosphonooxy group (—$OPO_3H$(aryl)) and conjugate base group thereof (hereinafter, called an arylphosphonatooxy group), a cyano group, and a nitro group. These substituents may be further substituted with the above-mentioned substituent, and may form a ring if this is possible.

Preferred examples of the divalent connecting group A include a single bond, a divalent hydrocarbon group (hereinafter, also expressed as '$L^1$'), a divalent heterocyclic group (hereinafter, also expressed as '$L^2$'), —O—, —$OL^1$-, —$OL^2$-, -$L^1OL^1$-, —$COL^1$-, -$L^1COL^1$-, —$CONL^1$-, -$L^1CONL^1$-, —N(R)$L^1$-, —N(R)$L^2$-, —$SL^1$-, —$SL^2$-, -$L^1N(R)L^1$-, -$L^1SiR'R''L^1$-, -$L^1SO_2L^1$-, -$L^1SOL^1$-, -$L^1OL^1OL^1$-, -$L^1OL^1COL^1$-, -$L^1COL^1COL^1$-, -$L^1OL^1OL^1OL^1$-, -$L^1OL^1COL^1OL^1$-, -$L^1COL^1OL^1COL^1$-, and -$L^1COL^1COL^1COL^1$-.

Specific preferred examples of the divalent connecting group A include the structures —O—$CH_2$—, —O—$C_2H_4$—, —O—$C_3H_6$—, —$CH_2$—, —$C_2H_4$—, —$C_3H_6$—, —O—$C_2H_4$—O—$C_2H_4$—, and —NH—$CH_2$—.

From the viewpoint of achieving high sensitivity, the divalent connecting group A is preferably a divalent hydrocarbon group, and most preferably —$CH_2$—.

In Formula (1-I) above, $R^1$ to $R^3$ independently denote a hydrogen atom, a hydrocarbon group, or an alkoxy group, and the hydrocarbon group and the alkoxy group may have the above-mentioned substituent.

Preferred examples of $R^1$ to $R^3$ include an alkyl group having 1 to 30 carbons (preferably 1 to 20 carbons, and more preferably 1 to 8 carbons), an alkenyl group having 2 to 30 carbons (preferably 2 to 20 carbons, and more preferably 2 to 8 carbons), an alkynyl group having 2 to 30 carbons (preferably 2 to 20 carbons, and more preferably 2 to 8 carbons), an aryl group having 6 to 30 carbons (preferably 6 to 20 carbons, and more preferably 6 to 10 carbons), a hydrocarbon ring group having 3 to 30 carbons (preferably 3 to 20 carbons, and more preferably 3 to 10 carbons), and an alkoxy group having 1 to 30 carbons, and more preferred examples thereof include an alkyl group having 1 to 20 carbons, an aryl group having 6 to 20 carbons, and an alkoxy group having 1 to 20 carbons.

Specific examples of —$SiR^1R^2R^3$ include a trimethylsilyl group, a triethylsilyl group, a t-butyldimethylsilyl group, a triisopropylsilyl group, a t-butyldiphenyl group, a trimethoxysilyl group, and a triethoxysilyl group, and among them the trimethylsilyl group is particularly preferable.

In Formula (1-I) above, $R^4$ denotes a monovalent organic group, and is bonded to any position of the condensed polycyclic aromatic ring.

The number m of $R^4$ groups denotes an integer of 0 or greater.

When m is 0, it means that there is no $R^4$ group on the condensed polycyclic aromatic ring of the condensed polycyclic aromatic compound represented by Formula (1-I), and when m is 1 or greater, for example, when m is 3, it means that there are three $R^4$ groups on the condensed polycyclic aromatic ring.

When m is 2 or more, the monovalent organic groups may be selected independently for each $R^4$ on the condensed polycyclic aromatic ring, and they may be bonded to each other to form a ring.

The monovalent organic group denotes a halogen atom, an alkyl group having 1 to 20 carbons, an alkenyl group having 2 to 20 carbons, an alkynyl group having 2 to 20 carbons, an aryl group having 6 to 20 carbons, an arylalkyl group having 7 to 21 carbons, an acyl group having 2 to 20 carbons, an alkoxycarbonyl group having 2 to 20 carbons, a hydrocarbon ring group having 3 to 20 carbons, a heterocyclic group having 4 to 20 carbons, or —$SO_3$—$R^0$, $R^0$ denoting a hydrogen atom, an alkyl group having 1 to 20 carbons, an alkenyl group having 2 to 20 carbons, an alkynyl group having 2 to 20 carbons, an aryl group having 6 to 20 carbons, an arylalkyl group having 7 to 21 carbons, an alkali metal atom, or quaternary ammonium.

Examples of the halogen atom denoted by $R^4$ include a fluorine atom, a chlorine atom, a bromine atom, and an iodine atom, and the fluorine atom, the chlorine atom, or the bromine atom is preferable.

The alkyl group denoted by $R^4$ preferably has 1 to 18 carbons, and particularly preferably 1 to 12 carbons, and it may be a straight chain and may have a substituent.

The alkenyl group denoted by $R^4$ preferably has 2 to 18 carbons, and particularly preferably 2 to 12 carbons, and it may further have a substituent.

The alkynyl group denoted by $R^4$ preferably has 2 to 18 carbons, and particularly preferably 2 to 12 carbons, and it may further have a substituent.

The aryl group denoted by $R^4$ preferably has 6 to 14 carbons, and particularly preferably 6 to 10 carbons, and it may further have a substituent.

The arylalkyl group denoted by $R^4$ preferably has 7 to 15 carbons, and particularly preferably 7 to 11 carbons, and it may further have a substituent.

In the acyl group or the alkoxycarbonyl group denoted by $R^4$, it is particularly preferable for the number of carbons on the carbon chain side to be 1 to 12, and it may be a straight chain and may have a substituent.

The hydrocarbon ring group denoted by $R^4$ is a hydrocarbon ring group other than the aryl group above, and is preferably a substituted or unsubstituted hydrocarbon ring group having 3 to 14 carbons.

The heterocyclic group denoted by $R^4$ is preferably a substituted or unsubstituted heterocyclic group having 3 to 13 carbons, and the hetero atom contained in the heterocyclic group is preferably a nitrogen atom, an oxygen atom, or a sulfur atom.

$R^0$ in —$SO_3$—$R^0$ denoted by $R^4$ is preferably a hydrogen atom, the above-mentioned alkyl group, the above-mentioned aryl group, the above-mentioned arylalkyl group, a lithium atom, a sodium atom, or a potassium atom.

As the substituents that the alkyl group, alkenyl group, alkynyl group, aryl group, arylalkyl group, acyl group, alkoxycarbonyl group, hydrocarbon ring group, and heterocyclic group denoted by $R^4$, and the group cited as $R^0$ may have, the above-mentioned substituents can be cited.

The compound (a-1) represented by Formula (1-I) is preferably a compound represented by Formulae (1-II) to (1-IV) below.

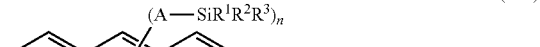

(1-II)

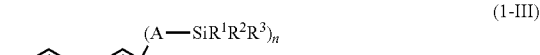

(1-III)

(1-IV)

(In Formulae (1-II) to (1-IV), A denotes a divalent connecting group, $R^1$ to $R^3$ independently denote a hydrogen atom, a hydrocarbon group, or an alkoxy group, $R^4$ denotes a monovalent organic group, n denotes an integer of 1 to 10, and m denotes an integer of 0 to 9. A and $R^4$ are bonded to any position of the anthracene ring, the phenanthrene ring or the pyrene ring.)

In Formulae (1-II) to (1-IV) above, the divalent connecting group A has the same meaning as that of A in Formula (1-I) above unless otherwise specified, may have the aforementioned substituent, and a preferred range thereof is also the same.

Furthermore, the divalent connecting group A is bonded to any position of the anthracene ring, the phenanthrene ring or the pyrene ring.

With regard to the substitution position of the divalent connecting group A, in the case of a compound represented by Formula (1-II), it is preferably at least the 9-position or the 10-position of the anthracene ring, in the case of a compound represented by Formula (1-III), it is preferably at least the 9-position or the 10-position of the phenanthrene ring, and in the case of a compound represented by Formula (1-IV), it is preferably at least the 1-position of the pyrene ring.

With regard to the 9-position and the 10-position of the anthracene ring or the phenanthrene ring in Formula (1-II) or Formula (1-III), among the three condensed 6-membered rings, for the two substitution positions of the middle 6-membered ring, the 9-position has first priority, and the other is the 10-position.

The number n of substituents on the divalent connecting group A of the Formulae (1-II) to (1-IV) above denotes an integer of 1 to 10, preferably 1 to 4, more preferably 1 to 3, and yet more preferably 1 to 2.

$R^1$ to $R^3$ in Formulae (1-II) to (1-IV) above have the same meanings as those of $R^1$ to $R^3$ in Formula (1-I) above, may have the aforementioned substituents, and preferred ranges thereof are also the same. They denote a hydrogen atom, a hydrocarbon group, or an alkoxy group, and the hydrocarbon group and the alkoxy group may have the aforementioned substituent.

In Formulae (1-II) to (1-IV), $R^4$ denotes a monovalent organic group, and is bonded to any position of the anthracene ring, the phenanthrene ring, or the pyrene ring.

The number m of $R^4$ groups denotes an integer of 0 to 9.

When m is 0, it means that there is no $R^4$ group on the anthracene ring or the phenanthrene ring of the compound represented by Formulae (1-II) to (1-IV), and when m is 1 to 9, there are respectively 1 to 9 $R^4$ groups on the anthracene ring or the phenanthrene ring.

Furthermore, when m is 2 or greater, for the $R^4$ groups on the anthracene ring, the phenanthrene ring, or the pyrene ring, monovalent organic groups can be selected independently from each other, and they may be bonded to each other to form a ring.

In Formulae (1-II) to (1-IV) above, the monovalent organic group for $R^4$ has the same meaning as that for the monovalent substituent of $R^4$ in Formula (1-I) above, and may have the aforementioned substituent, and a preferred range is also the same.

Since the ink composition of the present invention comprises the compound represented by Formula (1-I) (hereinafter, also called 'specific sensitizing dye (A-1)'), the efficiency of absorption of irradiated actinic radiation increases, and the curing sensitivity improves. Furthermore, since the above-mentioned compound when excited upon absorption of actinic radiation, and ultraviolet rays in particular, efficiently carries out electron transfer or energy transfer to a polymerization initiator, thus forming an active polymerization initiation species of the polymerization initiator, a curing reaction of the ink composition can be carried out with high sensitivity.

Furthermore, since the compound represented by Formula (1-I) has a silyl group, compared with a sensitizing dye having no silyl group, electron transfer from the polymerization active species back to the specific sensitizing dye (A-1) is suppressed, the electron transfer efficiency improves, and the sensitivity of the curing reaction of the ink composition can be increased.

A synthetic method for the compound represented by the Formula (1-I) above is not particularly limited, but synthesis may be carried out by a method described in, for example, J. Org. Chem., 64, 4255-4266 (1999), Bull. Chem. Soc. Jpn., 1976, 49, 1958-1969, J. Organomet. Chem., 1310, 269-284 (1986), Chem. Eur. J., 8, 979-991 (2002), etc.

Among the compounds represented by Formula (1-I) above, compounds denoted by 1-I-1 to 1-I-37 below can be cited as preferred embodiments.

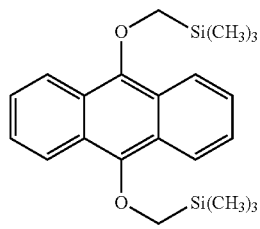

(1-I-1)

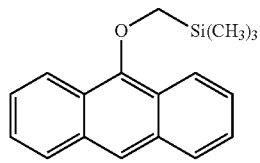

(1-I-2)

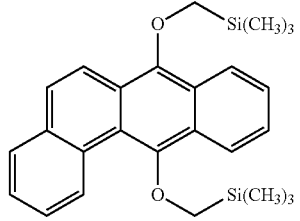

(1-I-3)

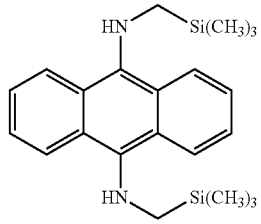

(1-I-4)

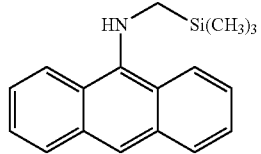

(1-I-5)

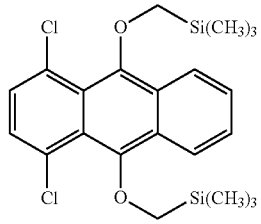

(1-I-6)

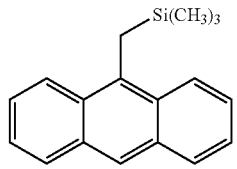

(1-I-7)

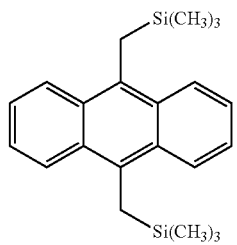

(1-I-8)

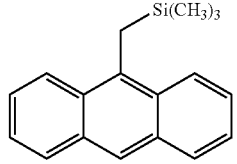

(1-I-9)

-continued
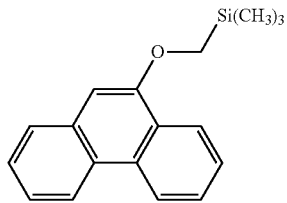
(1-I-10)
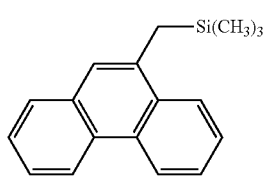
(1-I-11)
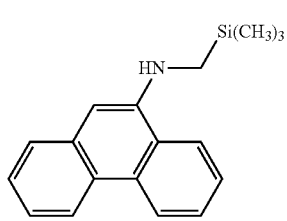
(1-I-12)
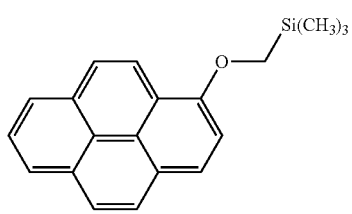
(1-I-13)
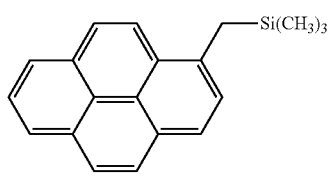
(1-I-14)
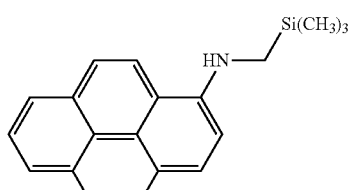
(1-I-15)
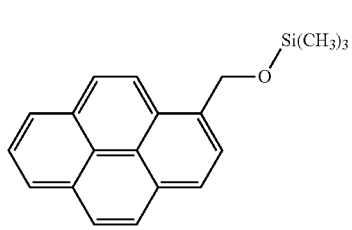
(1-I-16)
-continued
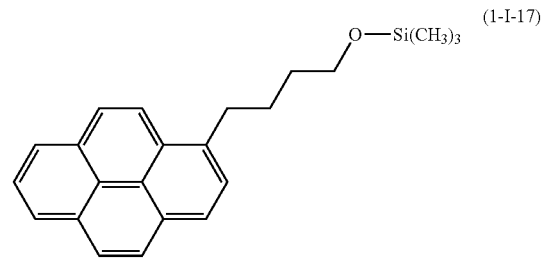
(1-I-17)
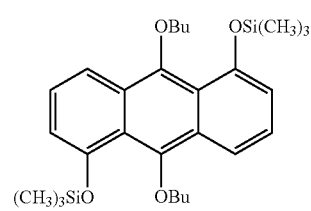
(1-I-18)
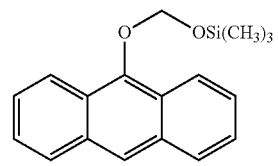
(1-I-19)
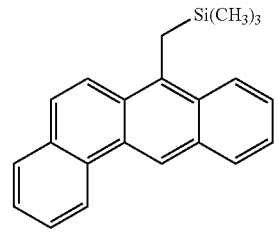
(1-I-20)
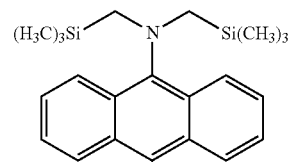
(1-I-21)
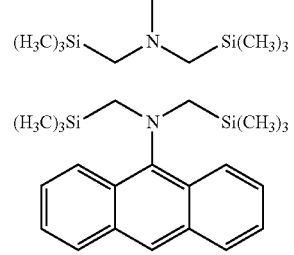
(1-I-22)
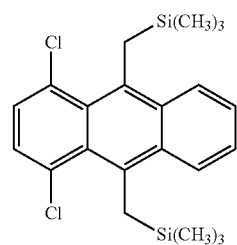
(1-I-23)

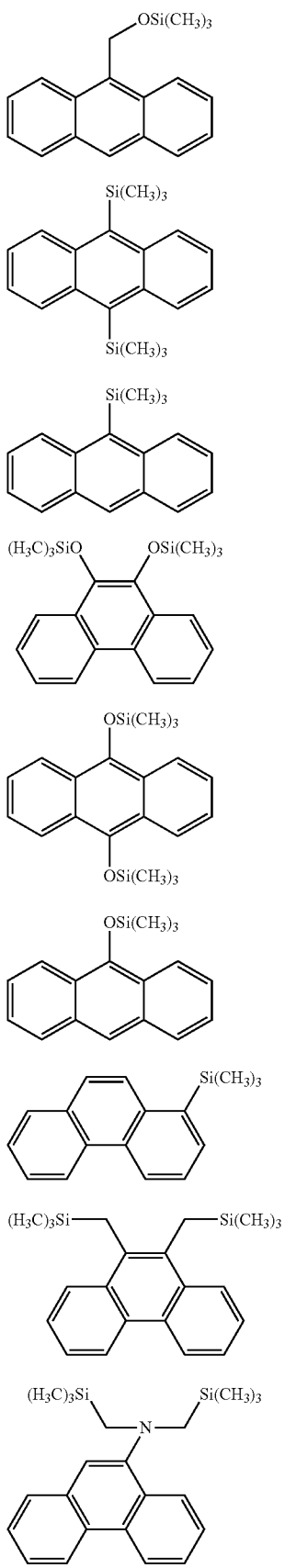

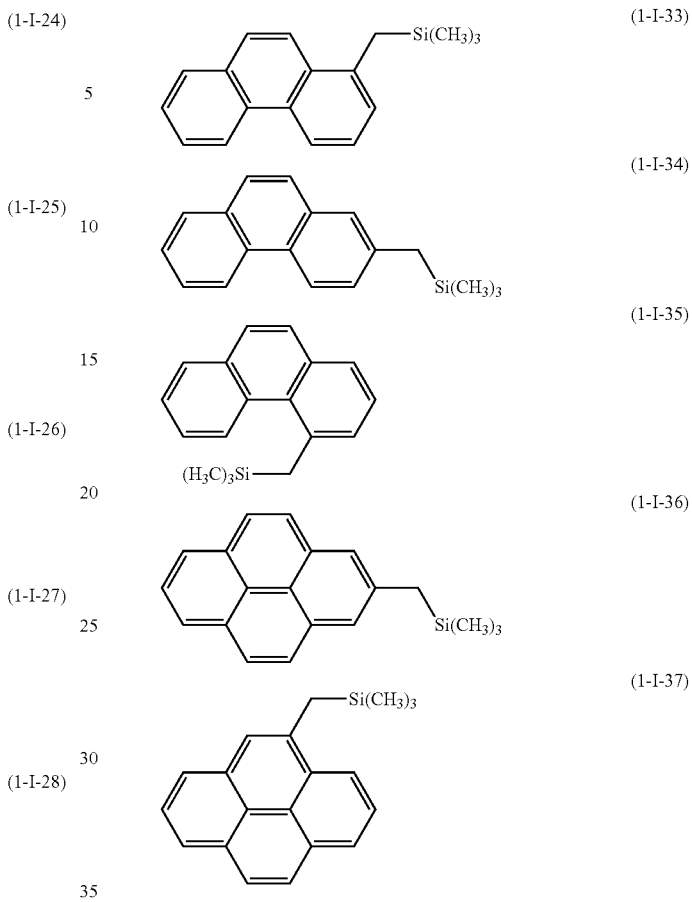

(a-2) Compound having at Least Three Hydroxy Groups, Alkoxy Groups, and/or Aryloxy Groups on Condensed Polycyclic Aromatic Ring The condensed polycyclic aromatic compound that can be used in the present invention is a compound having at least three hydroxy groups, alkoxy groups, and/or aryloxy groups on a condensed polycyclic aromatic ring.

Furthermore, the compound (a-2) having at least three hydroxy groups, alkoxy groups, and/or aryloxy groups on the condensed polycyclic aromatic ring that can be used in the present invention may be used singly or in a combination of two or more types.

The compound (a-2) having at least three hydroxy groups, alkoxy groups, and/or aryloxy groups on the condensed polycyclic aromatic ring that can be used in the present invention may be represented by Formula (2-I) below.

(2-I)

(In Formula (2-I), Ar denotes a group formed by removing (p+q) hydrogen atoms from a condensed polycyclic aromatic ring, OR denotes a hydroxy group, an alkoxy group, or an aryloxy group, R' denotes a monovalent organic group, the substitution number p for OR denotes an integer of 3 or greater, and the substitution number q for R' denotes an integer of 0 or greater, provided that (p+q) is no greater than the number of aromatic hydrogen atoms on the condensed polycyclic aromatic ring.)

Examples of the condensed polycyclic aromatic ring include anthracene, phenanthrene, naphthalene, indacene, acenaphtylene, fluoranthene, acephenanthrylene, aceanthrylene, benzo[a]anthracene, tetracene, triphenylene, pyrene, perylene, and chrysene; among these anthracene, triphenylene, perylene, and phenanthrene are preferable, anthracene, triphenylene, and phenanthrene are more preferable, and anthracene is particularly preferable. Ar in Formula (2-I) is a group formed by removing from the condensed polycyclic aromatic ring a number of hydrogen atoms that is equal to the sum of the number p of OR groups and the number q of R' groups.

In the condensed polycyclic aromatic compound, at least three of the hydroxy groups, alkoxy groups, and/or aryloxy groups (hereinafter, the three hydroxy, alkoxy, and aryloxy groups are also called generally 'OR groups') are directly bonded to the condensed polycyclic aromatic ring; the number p thereof is preferably 3 to 6, and more preferably 3 or 4.

Examples of R of the OR group that the condensed polycyclic aromatic compound has on the condensed polycyclic aromatic ring include a hydrogen atom (corresponding to a hydroxy group), an alkyl group, an alkenyl group, an alkynyl group, a hydrocarbon ring group, a heterocyclic group other than aromatic (the above corresponding to an alkoxy group), an aryl group, and an aromatic heterocyclic group (the above corresponding to an aryloxy group), and the above-mentioned alkyl group, alkenyl group, alkynyl group, hydrocarbon ring group, heterocyclic group other than aromatic, aryl group, and aromatic heterocyclic group may each have a substituent, which will be described later.

In Formula (2-I) above, the R groups in said at least three OR groups may be identical to or different from each other, and 2 or more R groups may be bonded to each other to form a ring structure containing at least 2 oxygen atoms.

The alkyl group denoted by R of the OR group preferably has 1 to 30 carbons, more preferably 1 to 20 carbons, and yet more preferably 1 to 8 carbons.

The alkenyl group denoted by R of the OR group preferably has 2 to 30 carbons, more preferably 2 to 20 carbons, and yet more preferably 2 to 8 carbons.

The alkynyl group denoted by R of the OR group preferably has 2 to 30 carbons, more preferably 2 to 20 carbons, and yet more preferably 2 to 8 carbons.

The hydrocarbon ring group denoted by R of the OR group preferably has 3 to 30 carbons, more preferably 3 to 20 carbons, and yet more preferably 3 to 10 carbons, and may be a monocyclic group or a polycyclic group having two or more rings.

The heterocyclic group denoted by R of the OR group may be an aromatic heterocyclic group or non-aromatic heterocyclic group, preferably has 4 to 30 carbons, more preferably 4 to 20 carbons, and yet more preferably 4 to 10 carbons, and may be a monocyclic group or a polycyclic group having two or more rings.

The aryl group denoted by R of the OR group preferably has 6 to 30 carbons, more preferably 6 to 20 carbons, and yet more preferably 6 to 10 carbons, and may be a monocyclic group or a polycyclic group having two or more rings.

Specific examples of R include a methyl group, an ethyl group, a propyl group, an isopropyl group, an n-butyl group, a t-butyl group, a pentyl group, a, hexyl group, a heptyl group, an octyl group, an allyl group, a phenyl group, a benzyl group, a dodecyl group, and a pyridyl group, and among them a methyl group, an ethyl group, a propyl group, an isopropyl group, an n-butyl group, a t-butyl group, a hexyl group, and a benzyl group are particularly preferable.

The condensed polycyclic aromatic compound may have an R' group as a group other than the OR group on the condensed polycyclic aromatic ring, and the number of R' groups is not particularly limited as long as it is possible.

Examples of the monovalent organic group R' that may be possessed by the condensed polycyclic aromatic compound include a halogen atom, an alkyl group, an alkenyl group, an alkynyl group, an aryl group, an amino group, an alkoxycarbonyl group, an aryloxycarbonyl group, a hydrocarbon ring group, and a heterocyclic group, which may have a substituent that will be described later. It is important that the presence of R' on the condensed polycyclic aromatic ring does not reduce the excited oxidation potential of the condensed polycyclic aromatic compound.

When R' is a halogen atom, an alkoxycarbonyl group, and/or an aryloxycarbonyl group, etc, which are electron-withdrawing groups, in order to increase the excited oxidation potential, the condensed polycyclic aromatic compound preferably has at least four OR groups on the condensed polycyclic aromatic ring.

Preferred ranges for the alkyl group, the alkenyl group, the alkynyl group, the aryl group, the hydrocarbon ring group, and the heterocyclic group denoted by the monovalent organic group R' are the same as those cited for the OR group.

Examples of the halogen atom in the monovalent organic group R' include a fluorine atom, a chlorine atom, a bromine atom, and an iodine atom, and among them a fluorine atom and a chlorine atom are preferable.

Examples of the amino group in the monovalent organic group R' include $—NH_2$, $—NHR^a$, and $—NR^aR^b$; $R^a$ and $R^b$ have the same meanings as that of R of the OR group, and preferred ranges are also the same.

With regard to the alkoxycarbonyl group in the monovalent organic group R', a preferred range for the alkyl group in the alkoxycarbonyl group is the same as for the alkyl group cited for the OR group above.

With regard to the aryloxycarbonyl group in the monovalent organic group R', a preferred range for the aryl group in the aryloxycarbonyl group is the same as for the aryl group cited for the OR group above.

In Formula (2-I), the number q of R' groups is an integer of 0 or greater, provided that (p+q) is no greater than the number of aromatic hydrogen atoms on the condensed polycyclic aromatic ring.

When q is 0, it means that there is no R' group on the condensed polycyclic aromatic ring of the compound represented by Formula (2-I), and when q is 1 to r (r being an integer of 2 or greater), it means that there are 1 to r R' groups on the condensed polycyclic aromatic ring.

Furthermore, when q is 2 or more, the R' groups on the condensed polycyclic aromatic ring may, independently from each other, be selected from a halogen atom, an alkyl group, an alkenyl group, an alkynyl group, an aryl group, an amino group, a hydrocarbon ring group, and a heterocyclic group, and 2 or more R' groups may be bonded to each other to form a ring. Moreover, if it is possible, R and R' may be bonded to each other to form a ring containing at least one oxygen atom.

With regard to the substituent that may be possessed by the above-mentioned alkyl group, alkenyl group, alkynyl group, hydrocarbon ring group, aryl group, and heterocyclic group cited for R or R' in Formula (2-I) above, a monovalent non-metallic atomic group other than hydrogen is used, and preferred examples thereof include a halogen atom (—F, —Br, —Cl, —I), a hydroxy group, an alkyl group, an aryl group, an alkenyl group, an alkynyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and conjugate base group thereof (hereinafter, called a carboxylate), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and conjugate base group thereof (hereinafter, called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and conjugate base group thereof, an N-alkylsulfonylsulfamoyl group (—SO$_2$NHSO$_2$(alkyl)) and conjugate base group thereof, an N-arylsulfonylsulfamoyl group (—SO$_2$NHSO$_2$(aryl)) and conjugate base group thereof, an N-alkylsulfonylcarbamoyl group (—CONHSO$_2$(alkyl)) and conjugate base group thereof, an N-arylsulfonylcarbamoyl group (—CONHSO$_2$(aryl)) and conjugate base group thereof, a silyl group, an alkoxysilyl group (—Si(O-alkyl)$_3$), an aryloxysilyl group (—Si(O-aryl)$_3$), a hydroxysilyl group (—Si(OH)$_3$) and conjugate base group thereof, a phosphono group (—PO$_3$H$_2$) and conjugate base group thereof (hereinafter, called a phosphonate group), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and conjugate base group thereof (hereinafter, called an alkylphosphonate group), a monoarylphosphono group (—PO$_3$H(aryl)) and conjugate base group thereof (hereinafter, called an arylphosphonate group), a phosphonooxy group (—OPO$_3$H$_2$) and conjugate base group thereof (hereinafter, called a phosphonatooxy group), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and conjugate base group thereof (hereinafter, called an alkylphosphonatooxy group), a monoarylphosphonooxy group (—OPO$_3$H(aryl)) and conjugate base group thereof (hereinafter, called an arylphosphonatooxy group), a cyano group, and a nitro group. These substituents may be further substituted with the above-mentioned substituent, and may form a ring if this is possible.

As an anthracene compound or a phenanthrene compound that can be used as the condensed polycyclic aromatic compound, compounds represented by Formula (2-II) or (2-III) below can be cited as preferable examples. The compound represented by Formula (2-II) or (2-III) below may suitably be used singly or in a combination of two or more types.

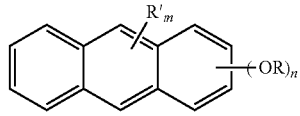
(2-II)

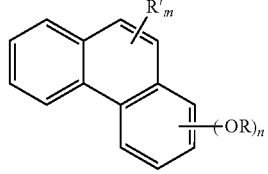
(2-III)

(In Formula (2-II) and (2-III), R denotes a hydrogen atom, an alkyl group, an alkenyl group, an alkynyl group, an aryl group, a hydrocarbon ring group, or a heterocyclic group, R' denotes an alkyl group, an alkenyl group, an alkynyl group, an aryl group, a hydrocarbon ring group, or a heterocyclic group, n is an integer of 3 to 10, and m is an integer of 0 to 7. OR and R' are bonded to any position of the anthracene ring or the phenanthrene ring.)

In Formula (2-II) and (2-III) above, the OR group is bonded to any position (1 to 10-position) on the anthracene ring or the phenanthrene ring, and the number thereof is n.

The number of OR groups in Formula (2-II) or (2-III) is an integer of 3 to 10, preferably 3 to 6, and more preferably 3 or 4.

The R groups in the OR group may be identical to or different from each other, and 2 or more R groups may be bonded to each other to form a ring.

The substitution number m for R' in Formula (2-II) or (2-III) denotes an integer of 0 to 7.

When m is 0, it means that there is no R' group on the anthracene ring or the phenanthrene ring of the compound represented by Formula (2-II) or (2-III), and when m is 1 to 7, it means that there are respectively 1 to 7 R' groups on the anthracene ring or the phenanthrene ring.

Furthermore, when m is 2 or more, the R' groups on the anthracene ring or the phenanthrene ring may, independently from each other, be selected from an alkyl group, an alkenyl group, an alkynyl group, an aryl group, a hydrocarbon ring group, and a heterocyclic group, and 2 or more R' groups may be bonded to each other to form a ring. Moreover, if it is possible, R and R' may be bonded to each other to form a ring containing at least one oxygen atom.

In Formulae (2-II) and (2-III) above, R denotes a hydrogen atom, an alkyl group, an alkenyl group, an alkynyl group, an aryl group, a hydrocarbon ring group, and a heterocyclic group, and may have a substituent described above for Formula (2-I). If it is possible, two or more R groups may be bonded to each other to form a ring structure.

In Formulae (2-II) and (2-III) above, R' denotes a halogen atom, an alkyl group, an alkenyl group, an alkynyl group, an aryl group, an amino group, an alkoxycarbonyl group, an aryloxycarbonyl group, a hydrocarbon ring group, or a heterocyclic group, and may have a substituent described above for Formula (2-I). If it is possible, two or more R' groups or R and R' may be bonded to each other to form a ring structure.

The halogen atom, alkyl group, alkenyl group, alkynyl group, aryl group, amino group, alkoxycarbonyl group, aryloxycarbonyl group, hydrocarbon ring group, and heterocyclic group cited for R and R' in Formulae (2-II) and (2-III) above have the same meanings as those for the halogen atom, alkyl group, alkenyl group, alkynyl group, aryl group, amino group, alkoxycarbonyl group, aryloxycarbonyl group, hydrocarbon ring group, and heterocyclic group cited for the OR group and R' in Formula (2-I) above, and preferred ranges are also the same.

Furthermore, when R' is a halogen atom, an alkoxycarbonyl group, and/or an aryloxycarbonyl group, etc, which are electron-withdrawing groups, in order to increase the excited oxidation potential, the compound represented by Formula (2-II) or (2-III) preferably has at least four OR groups on the anthracene ring or the phenanthrene ring.

Since the ink composition of the present invention comprises the above-mentioned condensed polycyclic aromatic compound (a-2), the efficiency of absorption of irradiated actinic radiation increases, and the curing sensitivity improves. Furthermore, since the above-mentioned compound can be excited to a high energy state upon absorption of actinic radiation, and ultraviolet rays in particular, and the compound efficiently carries out electron transfer or energy transfer to a polymerization initiator, thus forming an active polymerization initiation species of the polymerization initiator, a curing reaction of the ink composition can be carried out with high sensitivity.

Furthermore, since the above-mentioned condensed polycyclic aromatic compound (a-2) that can be used in the present invention has an OR group, which is an electron-donating group, it is possible to increase the excited oxidation potential of the condensed polycyclic aromatic ring, improve the efficiency of electron transfer with the polymerization initiator, and improve the efficiency of decomposition of the polymerization initiator, and the sensitivity of the curing reaction of the ink composition of the present invention can be increased.

Although a method for synthesizing the condensed polycyclic aromatic compound (a-2) is not particularly limited, it may be synthesized by, for example, a method described in Michael Diekers, Chuping Luo, Dirk M. Guldi, and Andreas Hirsch, Chem. Eur. J., 8, 979-991 (2002), and various types of compounds may be synthesized by known functional group conversion methods.

Among the condensed polycyclic aromatic compounds (a-2), compounds 2-I-1 to 2-I-52 shown below can be cited as preferred embodiments. Abbreviations in the compounds are as follows.

Me: $CH_3$
Et: $CH_2CH_3$
Bu: $CH_2CH_2CH_2CH_3$
Ph: $C_6H_5$

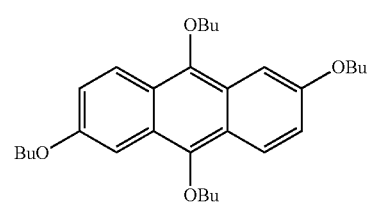
(2-I-1)

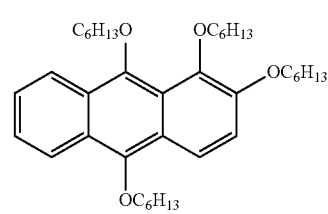
(2-I-2)

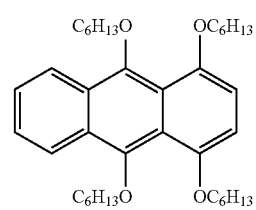
(2-I-3)

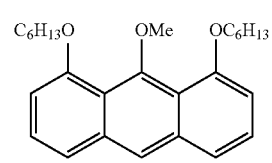
(2-I-4)

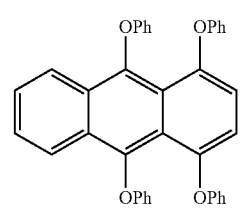
(2-I-5)

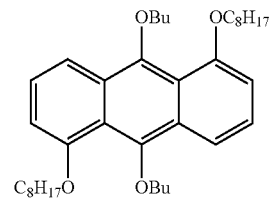
(2-I-6)

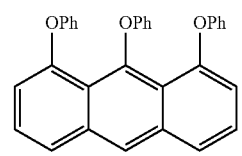
(2-I-7)

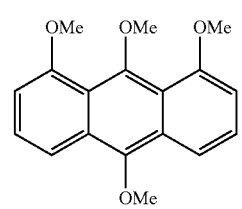
(2-I-8)

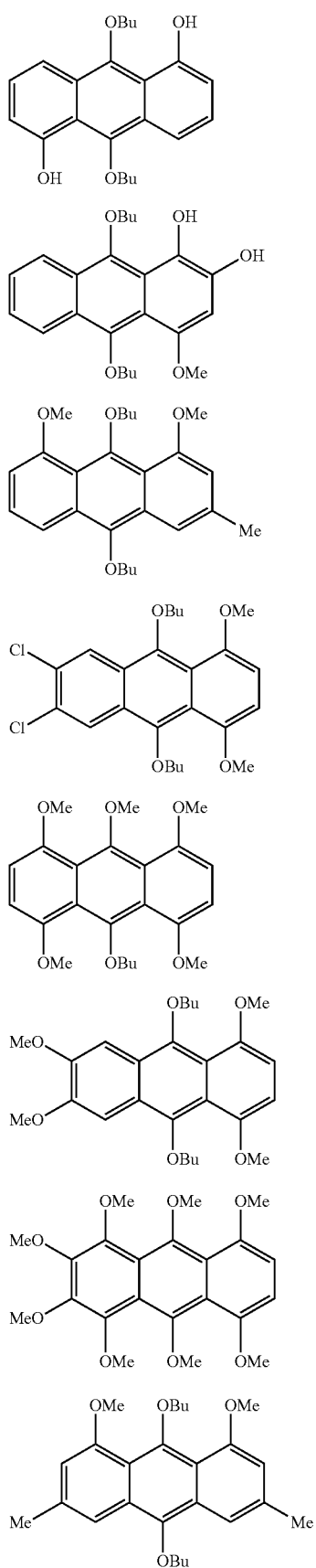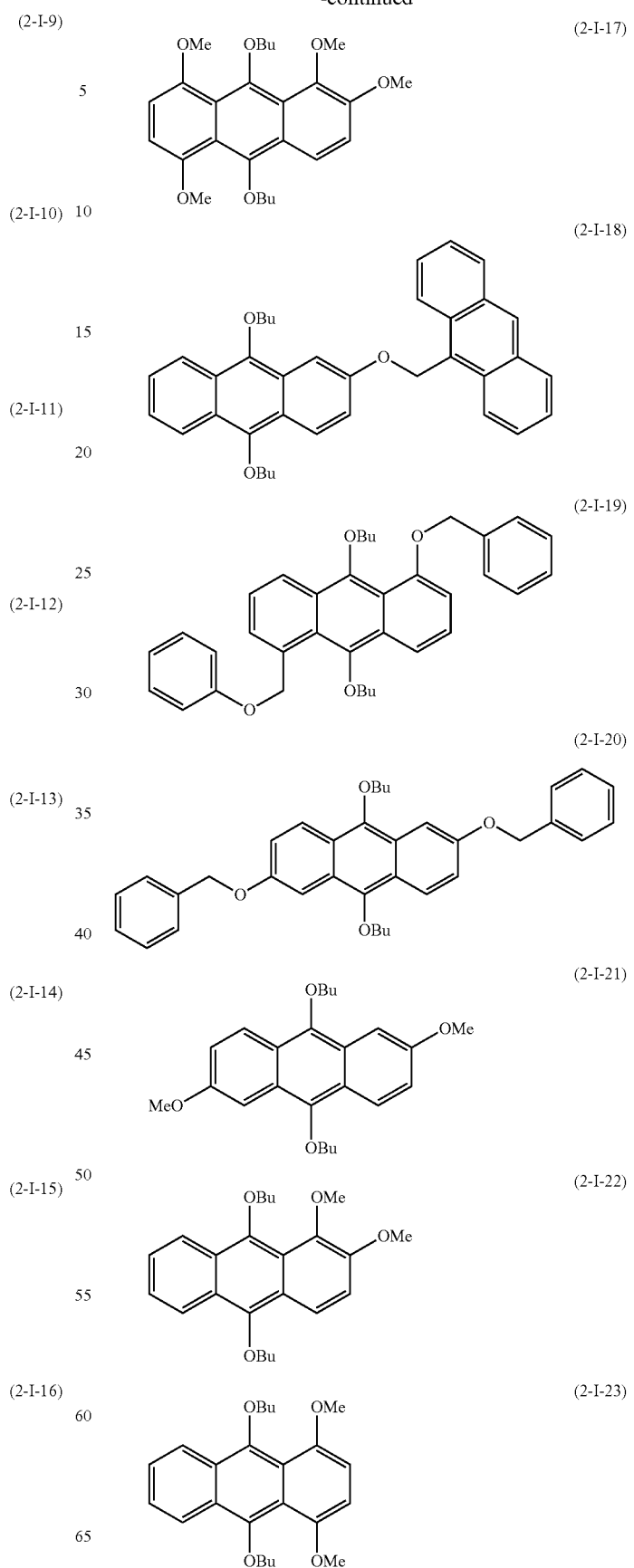

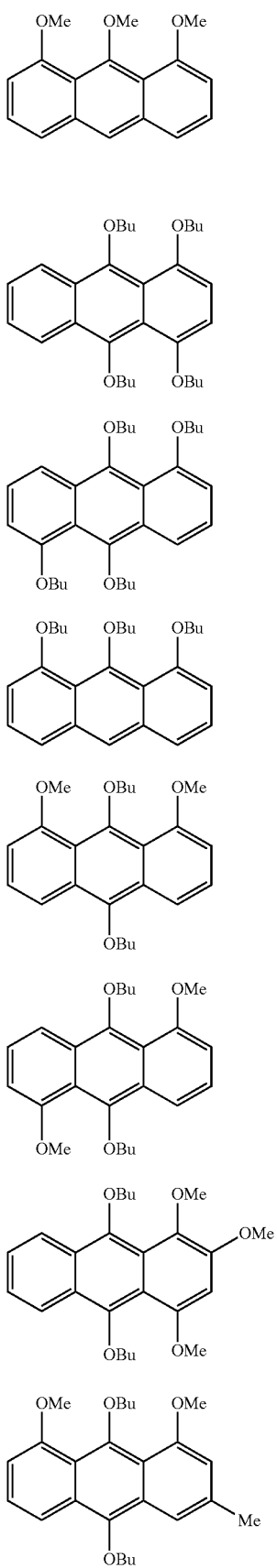
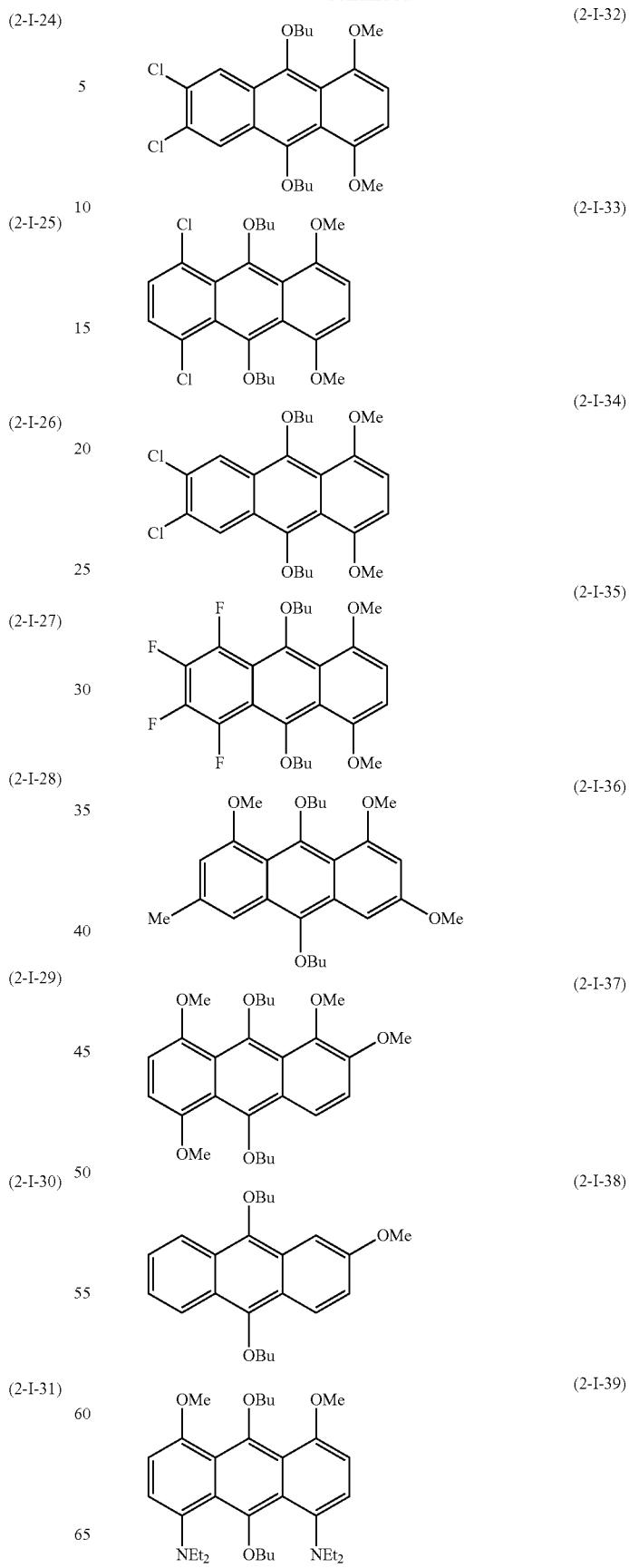

(2-I-40) 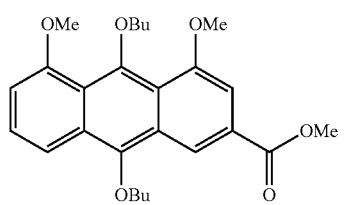

(2-I-41) 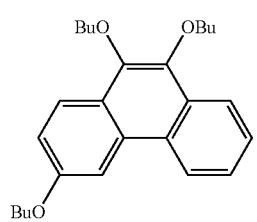

(2-I-42) 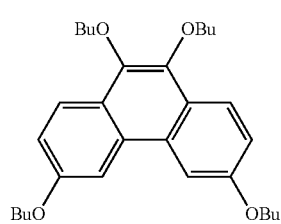

(2-I-43) 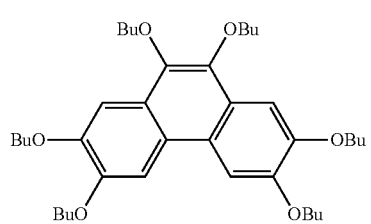

(2-I-44) 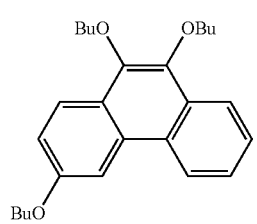

(2-I-45) 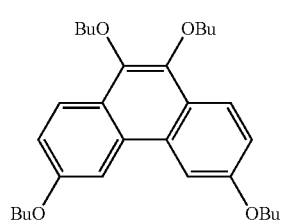

(2-I-46) 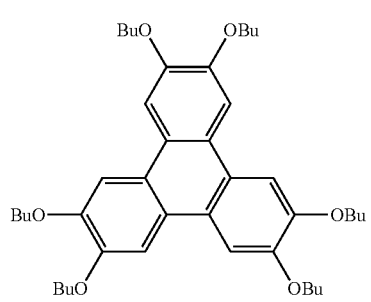

(2-I-47)

(2-I-48)

(2-I-49)

(2-I-50)

(2-I-51)

(2-I-52)

(a-3) Compound having at least One Atom having an Atomic Weight of 32 or Greater Bonded to the Condensed Polycyclic Aromatic Ring and/or One Group Bonded to the Condensed Polycyclic Aromatic Ring via an Atom having an Atomic Weight of 32 or Greater The condensed polycyclic aromatic compound that can be used in the present invention is preferably a compound having at least one atom having an atomic weight of 32 or greater bonded to the condensed polycyclic aromatic ring and/or one group bonded to the condensed polycyclic aromatic ring via an atom having an atomic weight of 32 or greater.

The compound having at least one atom having an atomic weight of 32 or greater bonded to the condensed polycyclic aromatic ring and/or one group bonded to the condensed polycyclic aromatic ring via an atom having an atomic weight of 32 or greater that can be used in the present invention may be used singly or in a combination of two or more types.

The compound having at least one atom having an atomic weight of 32 or greater bonded to the condensed polycyclic aromatic ring and/or one group bonded to the condensed polycyclic aromatic ring via an atom having an atomic weight of 32 or greater that can be used in the present invention may be represented by Formula (3-I) below.

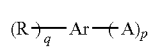

(3-I)

(In Formula (3-I), Ar denotes a group formed by removing (p+q) hydrogen atoms from a condensed polycyclic aromatic ring, A denotes an atom having an atomic weight of 32 or greater bonded to the condensed polycyclic aromatic ring or a group bonded to the condensed polycyclic aromatic ring via an atom having an atomic weight of 32 or greater, R denotes a monovalent organic group, the substitution number p for A denotes an integer of 1 or greater, and the substitution number q for R denotes an integer of 0 or greater, provided that (p+q) is no greater than the number of aromatic hydrogen atoms on the condensed polycyclic aromatic ring.)

Examples of the condensed polycyclic aromatic ring include anthracene, phenanthrene, naphthalene, indacene, acenaphtylene, fluoranthene, acephenanthrylene, aceanthrylene, benzo[a]anthracene, tetracene, triphenylene, pyrene, and chrysene, and among these anthracene and phenanthrene are preferable. Ar in Formula (3-I) is a group formed by removing, from the condensed polycyclic aromatic ring, a number of hydrogen atoms that is the sum of the number p for A and the number q for R.

In Formula (3-I) above, A denotes an atom having an atomic weight of 32 or greater (e.g. a chlorine atom) bonded to the condensed polycyclic aromatic ring, or a group bonded to the condensed polycyclic aromatic ring via an atom having an atomic weight of 32 or greater (e.g. —SCH$_3$, etc.), and is bonded to any position on the condensed polycyclic aromatic ring; and the substitution number thereof is p.

The substitution number p for A in Formula (3-I) denotes an integer of 1 or greater, preferably 1 to 4, and more preferably 1 or 2.

When p is 2 or greater, for each A on the condensed polycyclic aromatic ring, the atom having an atomic weight of 32 or greater bonded to the condensed polycyclic aromatic ring or the group bonded to the condensed polycyclic aromatic ring via an atom having an atomic weight of 32 or greater may be selected independently from each other, and if it is possible two or more A groups may be bonded to each other to form a ring.

In Formula (3-I) above, A denotes an atom having an atomic weight of 32 or greater bonded to the condensed polycyclic aromatic ring or a group bonded to the condensed polycyclic aromatic ring via an atom having an atomic weight of 32 or greater.

The atom having an atomic weight of 32 or greater is preferably an atom of groups 14 to 17, more preferably Cl, Br, I, S, Se, Te, Ge, Sn, or Pb, and yet more preferably Cl, Br, I, S, or Se.

Specific preferred examples of A include Cl, Br, I, $SR^1$, $SO_3H$, $SO_3M$, $SO_2R^2$, $SOR^2$, $SeR^1$, $TeR^1$, $GeR^2R^3R^4$, $SnR^2R^3R^4$, and $PbR^2R^3R^4$. Among them, from the viewpoint of higher sensitivity, A is preferably Cl, Br, I, $SR^1$, or $SeR^1$, particularly preferably Br, I, or $SR^1$, and most preferably $SR^1$.

$R^1$ denotes a hydrogen atom, a hydrocarbon group, or a heterocyclic group, and is preferably a hydrocarbon group or a heterocyclic group.

$R^2$ to $R^4$ denote a hydrogen atom, a hydrocarbon group, a heterocyclic group, an alkoxy group, an aryloxy group, or an amino group, and are preferably a hydrocarbon group, a heterocyclic group, an alkoxy group, an aryloxy group, or an amino group.

Examples of the hydrocarbon group denoted by $R^1$ to $R^4$ include an alkyl group having 1 to 30 carbons (preferably 1 to 20 carbons, and more preferably 1 to 8 carbons), an alkenyl group having 2 to 30 carbons (preferably 2 to 20 carbons, and more preferably 2 to 8 carbons), an alkynyl group having 2 to 30 carbons (preferably 2 to 20 carbons, and more preferably 2 to 8 carbons), an aryl group having 6 to 30 carbons (preferably 6 to 20 carbons, and more preferably 6 to 10 carbons), a hydrocarbon ring group having 3 to 30 carbons (preferably 3 to 20 carbons, and more preferably 3 to 10 carbons), and a group formed by combining the above, which may further have a substituent that will be described later.

The heterocyclic group denoted by $R^1$ to $R^4$ is preferably a heterocyclic group having 4 to 30 carbons, more preferably 4 to 20 carbons, and yet more preferably 4 to 10 carbons. The heterocyclic group may further have a substituent, which will be described later.

The alkoxy group denoted by $R^2$ to $R^4$ is preferably an alkoxy group having 1 to 30 carbons, more preferably 1 to 20 carbons, and yet more preferably 1 to 8 carbons. The alkoxy group may have a substituent, which will be described later, and the alkyl moiety of the alkoxy group may be an alkenyl group, an alkynyl group, a hydrocarbon ring group, or a non-aromatic heterocyclic group.

The aryloxy group denoted by $R^2$ to $R^4$ is preferably an aryloxy group having 6 to 30 carbons, more preferably 6 to 20 carbons, and yet more preferably 6 to 10 carbons. Furthermore, the aryloxy group may have a substituent, which will be described later, and the aryl moiety of the aryloxy group may be a heteroaromatic group.

The amino group denoted by $R^2$ to $R^4$ may be $NH_2$, $NHR^5$, or $NR^5R^6$, in which $R^5$ and $R^6$ denote the above-mentioned hydrocarbon group or heterocyclic group, and preferred ranges thereof are the same.

M denotes an alkali metal atom or quaternary ammonium.

With regard to the substituent that may be possessed by the above-mentioned hydrocarbon group, heterocyclic group, alkoxy group, aryloxy group, or amino group, a monovalent non-metallic atomic group other than hydrogen is used, and preferred examples thereof include a halogen atom (—F, —Br, —Cl, —I), a hydroxy group, an alkyl group, an aryl group, an alkenyl group, an alkynyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and conjugate base group thereof (hereinafter, called a carboxylate), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and conjugate base group thereof (hereinafter, called a sulfonate group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and conjugate base group thereof, an N-alkylsulfonylsulfamoyl group (—SO$_2$NHSO$_2$(alkyl)) and conjugate base group thereof, an N-arylsulfonylsulfamoyl group (—SO$_2$NHSO$_2$(aryl)) and conjugate base group thereof, an N-alkylsulfonylcarbamoyl group (—CONHSO$_2$(alkyl)) and conjugate base group thereof, an N-arylsulfonylcarbamoyl group (—CONHSO$_2$(aryl)) and conjugate base group thereof, a silyl group, an alkoxysilyl group (—Si(O-alkyl)$_3$), an aryloxysilyl group (—Si(O-aryl)$_3$), a hydroxysilyl group (—Si(OH)$_3$) and conjugate base group thereof, a phosphono group (—PO$_3$H$_2$) and conjugate base group thereof (hereinafter, called a phosphonate group), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and conjugate base group thereof (hereinafter, called an alkylphosphonate group), a monoarylphosphono group (—PO$_3$H(aryl)) and conjugate base group thereof (hereinafter, called an arylphosphonate group), a phosphonooxy group (—OPO$_3$H$_2$) and conjugate base group thereof (hereinafter, called a phosphonatooxy group), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and conjugate base group thereof (hereinafter, called an alkylphosphonatooxy group), a monoarylphosphonooxy group (—OPO$_3$H(aryl)) and conjugate base group thereof (hereinafter, called an arylphosphonatooxy group), a cyano group, and a nitro group. These substituents may be further substituted with the above-mentioned substituent, and may form a ring if this is possible.

Preferred specific examples of A in Formula (3-I) above include Cl, Br, I, and an optionally substituted alkylthio group, and more preferred examples thereof include Br, I, SCH$_3$, SC$_2$H$_5$, SC$_3$H$_7$, S(i-C$_3$H$_7$), SC$_4$H$_9$, S(t-C$_4$H$_9$), SC$_6$H$_{11}$, S(cyclo-C$_6$H$_{11}$), SC$_6$H$_5$, SC$_8$H$_{17}$, SC$_{10}$H$_{21}$, SC$_{12}$H$_{25}$, SO$_3$H, SO$_3$Na, SO$_2$CH$_3$, and SO$_2$N(CH$_3$)$_2$.

In Formula (3-I) above, R denotes a monovalent organic group, and the substitution number q for R in Formula (3-I) denotes an integer of 0 or greater, provided that (p+q) is no greater than the number of aromatic hydrogen atoms on the condensed polycyclic aromatic ring.

When q is 0, it means that there is no R group on the condensed polycyclic aromatic ring of the compound represented by Formula (3-I), and when q is 1 to r (r being an integer of 2 or greater), it means that there are 1 to r R groups on the condensed polycyclic aromatic ring.

Furthermore, when q is 2 or more, the R groups on the condensed polycyclic aromatic ring may, independently from each other, be selected from an alkyl group, an alkenyl group, an alkynyl group, an aryl group, a hydrocarbon ring group, and a heterocyclic group, and 2 or more R groups may bond to each other to form a ring. Moreover, if it is possible, A and R may bond to each other to form a ring containing at least one oxygen atom.

The monovalent organic group in R denotes a halogen atom (fluorine, chlorine, bromine, iodine), a hydroxy group, an alkyl group having 1 to 20 carbons, an alkenyl group having 2 to 20 carbons, an alkynyl group having 2 to 20 carbons, an aryl group having 4 to 20 carbons, an arylalkyl group having 5 to 21 carbons, an alkoxy group having 1 to 20 carbons, an aryloxy group having 4 to 20 carbons, an acyl group having 2 to 20 carbons, an alkoxycarbonyl group having 2 to 20 carbons, an acyloxy group having 1 to 20 carbons, a hydrocarbon ring group having 3 to 20 carbons, a heterocyclic group having 4 to 20 carbons, an amino group, an alkylamino group having 1 to 20 carbons, an arylamino group having 4 to 20 carbons, an alkylamino group having 1 to 20 carbons, a dialkylamino group having 2 to 20 carbons, a diarylamino group having 8 to 20 carbons, an alkylarylamino group having 5 to 20 carbons, a cyano group, a silyl group having 3 to 40 carbons, a nitro group, or —SO$_3$—R$^0$, and R$^0$ denotes a hydrogen atom, an alkyl group having 1 to 20 carbons, an alkenyl group having 2 to 20 carbons, an alkynyl group having 2 to 20 carbons, an aryl group having 6 to 20 carbons, an arylalkyl group having 7 to 21 carbons, an alkali metal atom, or quaternary ammonium.

The alkyl group denoted by R preferably has 1 to 18 carbons, and particularly preferably 1 to 12 carbons, and may be a straight chain and may have a substituent.

The alkenyl group denoted by R preferably has 2 to 18 carbons, and particularly preferably 2 to 12 carbons, and it may further have a substituent.

The alkynyl group denoted by R preferably has 2 to 18 carbons, and particularly preferably 2 to 12 carbons, and it may further have a substituent.

The aryl group denoted by R preferably has 6 to 14 carbons, and particularly preferably 6 to 10 carbons, and it may further have a substituent.

The arylalkyl group denoted by R preferably has 7 to 15 carbons, and particularly preferably 7 to 11 carbons, and it may further have a substituent.

The alkoxy group denoted by R preferably has 1 to 18 carbons, and particularly preferably 1 to 12 carbons, and may be a straight chain and may have a substituent. Furthermore, examples of the alkyl moiety of the alkoxy group include, in addition to the above-mentioned alkyl group, an alkenyl group, an alkynyl group, an arylalkyl group, a hydrocarbon ring group, and a non-aromatic heterocyclic group.

The aryloxy group denoted by R preferably has 6 to 14 carbons, and particularly preferably 6 to 10 carbons, and it may further have a substituent. Furthermore, examples of the aryl moiety of the aryloxy group include, in addition to the above-mentioned aryl group, a heteroaromatic group.

The acyl group or the alkoxycarbonyl group denoted by R particularly preferably has 1 to 12 carbons on the carbon chain, and may be a straight chain and may have a substituent.

The acyloxy group denoted by R preferably has 1 to 18 carbons, and particularly preferably 1 to 12 carbons, and may be a straight chain and may have a substituent.

The hydrocarbon ring group denoted by R is a hydrocarbon ring group other than the above-mentioned aryl group, and is preferably a substituted or unsubstituted hydrocarbon ring group having 3 to 14 carbons.

The heterocyclic group denoted by R is preferably a substituted or unsubstituted heterocyclic group having 3 to 13 carbons, and the hetero atom contained in the heterocyclic group is preferably a nitrogen atom, an oxygen atom, or a sulfur atom.

The alkyl group or aryl group in the arylamino group, alkylamino group, dialkylamino group, diarylamino group, and alkylarylamino group denoted by R is preferably the above-mentioned alkyl group, aryl group, arylalkyl group, hydrocarbon ring group, or heterocyclic group.

$R^0$ in the —$SO_3$—$R^0$ group denoted by R is preferably a hydrogen atom, the above-mentioned alkyl group, aryl group, arylalkyl group, hydrocarbon ring group, or heterocyclic group-, a lithium atom, a sodium atom, or a potassium atom.

With regard to the substituent that may be possessed by the alkyl group, alkenyl group, alkynyl group, aryl group, arylalkyl group, alkoxy group, aryloxy group, acyl group, alkoxycarbonyl group, hydrocarbon ring group, and heterocyclic group denoted by R or the group cited for $R^0$, the above-mentioned substituents for A can be cited as examples.

Preferred examples of the anthracene compound or the phenanthrene compound that can be used as the condensed polycyclic aromatic compound include compounds represented by Formula (3-II) or (3-III) below. The compounds represented by Formula (3-II) or (3-III) below may preferably be used singly or in a combination of two or more types.

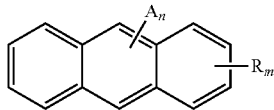

(3-II)

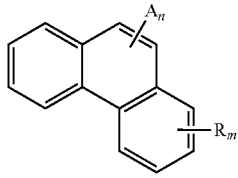

(3-III)

(In Formulae (3-II) and (3-III), A denotes an atom having an atomic weight of 32 or greater bonded to the condensed polycyclic aromatic ring or a group bonded to the condensed polycyclic aromatic ring via an atom having an atomic weight of 32 or greater, R denotes a monovalent organic group, the substitution number n for A denotes an integer of 1 to 10, and the substitution number m for R denotes an integer of 0 to 9. A is bonded to any position on the anthracene ring or the phenanthrene ring.)

In Formulae (3-II) and (3-III) above, A is bonded to any position (1 to 10-position) of the anthracene ring or the phenanthrene ring, and the substitution number thereof is n.

The substitution number n for A in Formula (3-II) or (3-III) denotes an integer of 1 to 10, preferably 1 to 4, and more preferably 1 or 2.

Furthermore, when n is 2 or greater, for each R group on the anthracene ring or the phenanthrene ring, the atom having an atomic weight of 32 or greater bonded to the condensed polycyclic aromatic ring and/or the group bonded to the condensed polycyclic aromatic ring via an atom having an atomic weight of 32 or greater may be selected independently from each other, and if it is possible two or more A groups may bond to each other to form a ring.

A in Formulae (3-II) and (3-III) above has the same meaning as that for A in Formula (3-I) above, and may have the above-mentioned substituent, and a preferred range is also the same.

In Formulae (3-II) and (3-III) above, R denotes a monovalent organic group, and the substitution number m for R in Formula (3-II) or (3-III) denotes an integer of 0 to 9.

When m is 0, it means that there is no R group on the anthracene ring or the phenanthrene ring of the compound represented by Formula (3-II) or (3-III), and when m is 1 to 9, it means that there are respectively 1 to 9 R groups on the anthracene ring or the phenanthrene ring.

Furthermore, when m is 2 or more, the R groups on the anthracene ring or the phenanthrene ring may, independently from each other, be selected from a monovalent organic group, and 2 or more R groups may be bonded to each other to form a ring. Moreover, if it is possible, A and R may be bonded to each other to form a ring.

The monovalent organic group denoted by R has the same meaning as that of the monovalent organic group denoted by R in Formula (3-I) above, and may have the above-mentioned substituent, and a preferred range is also the same.

Since the ink composition of the present invention comprises the condensed polycyclic aromatic compound (a-3) having at least one atom having an atomic weight of 32 or greater bonded to the condensed polycyclic aromatic ring and/or one group bonded to the condensed polycyclic aromatic ring via an atom having an atomic weight of 32 or greater, the efficiency of absorption of irradiated actinic radiation increases, and the curing sensitivity improves. Furthermore, since the above-mentioned compound, which is excited upon absorption of actinic radiation, in particular ultraviolet rays, efficiently undergoes intersystem crossing into a triplet, and subsequently efficiently carries out electron transfer or energy transfer to a polymerization initiator, thus forming an active polymerization initiator species of the polymerization initiator, the sensitivity of a curing reaction of the ink composition can be increased.

Furthermore, since the above-mentioned condensed polycyclic aromatic compound (a-3) used in the present invention has at least one heavy atom bonded to the condensed polycyclic aromatic ring, when the above-mentioned condensed polycyclic aromatic compound (a-3) is photo-excited, the possibility of the occurrence of intersystem crossing in which transfer from an excited singlet to an excited triplet is carried out becomes high. Since the excited triplet state has a longer lifespan than that of the excited singlet state, the electron transfer efficiency between the excited condensed polycyclic aromatic compound (a-3) and the polymerization initiator improves, the decomposition efficiency of the polymerization initiator improves, and the sensitivity of the curing reaction of the ink composition of the present invention can be increased.

A method for synthesizing the above-mentioned condensed polycyclic aromatic compound (a-3) is not particularly limited, and synthesis may be carried out by a method described in, for example, Chem. Eur. J., 8, 979-991 (2002), Tetrahedron Letters, 45, 457-459 (2002), etc., and various types of condensed polycyclic aromatic compounds may be synthesized using known functional group conversion methods.
Among the condensed polycyclic aromatic compounds (a-3) above, compounds shown in (3-I-1) to (3-I-36) below can be cited as preferred embodiments.
(3-I-1)
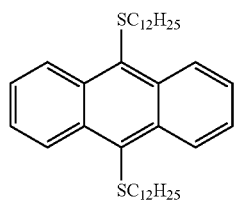
(3-I-2)
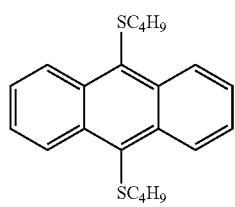
(3-I-3)
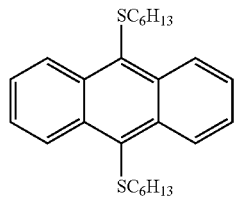
(3-I-4)
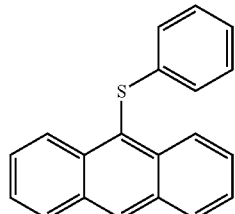
(3-I-5)
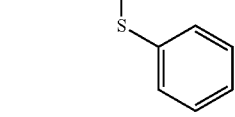
(3-I-6)
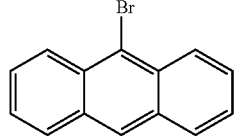
(3-I-7)
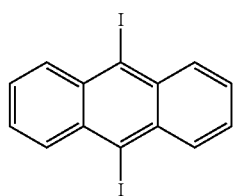
(3-I-8)
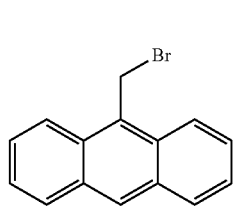
(3-I-9)
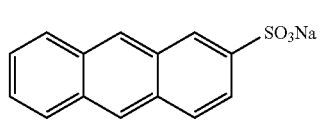
(3-I-10)
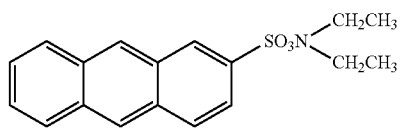
(3-I-11)
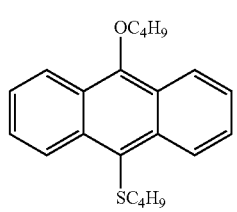
(3-I-12)
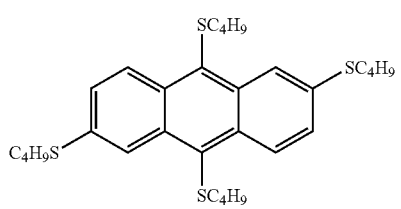
(3-I-13)
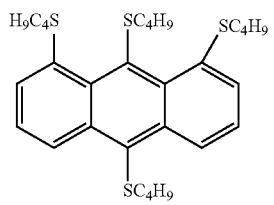
(3-I-14)
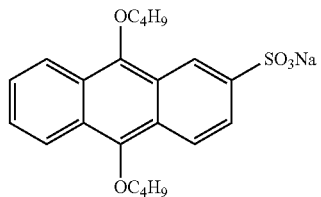

-continued
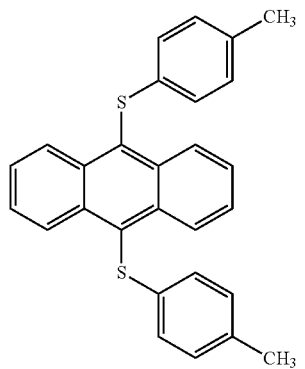
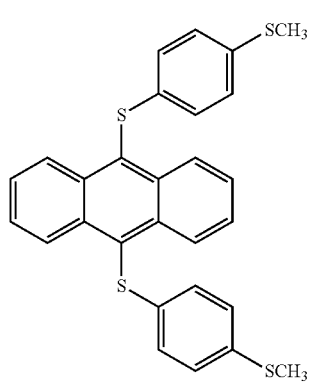
(3-I-17)
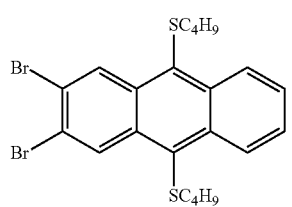
(3-I-18)
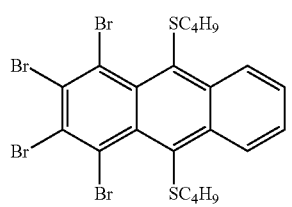
(3-I-19)
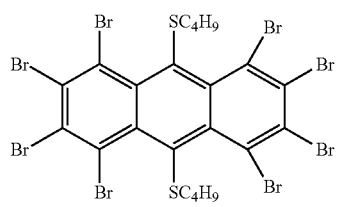
(3-I-20)
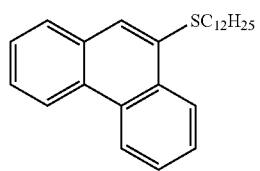
-continued
(3-I-21)
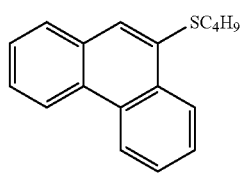
(3-I-22)
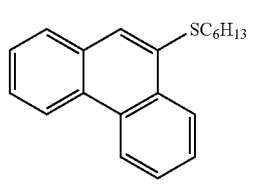
(3-I-23)
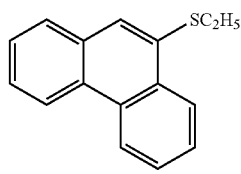
(3-I-24)
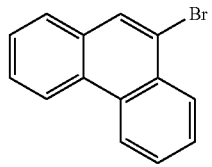
(3-I-25)
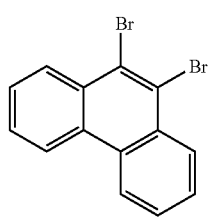
(3-I-26)
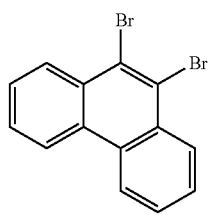
(3-I-27)
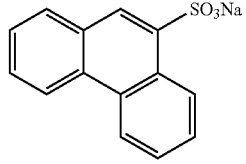
(3-I-28)
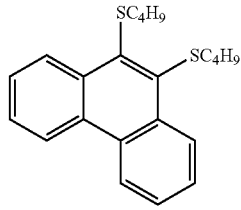

(3-I-29)
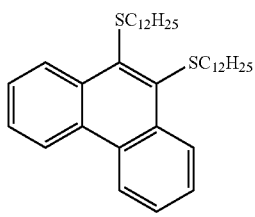

(3-I-30)
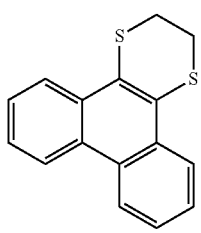

(3-I-31)
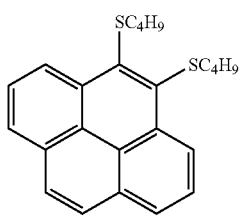

(3-I-32)
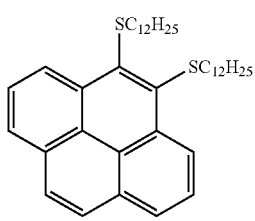

(3-I-33)
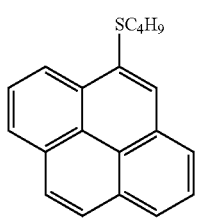

(3-I-34)
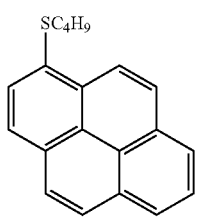

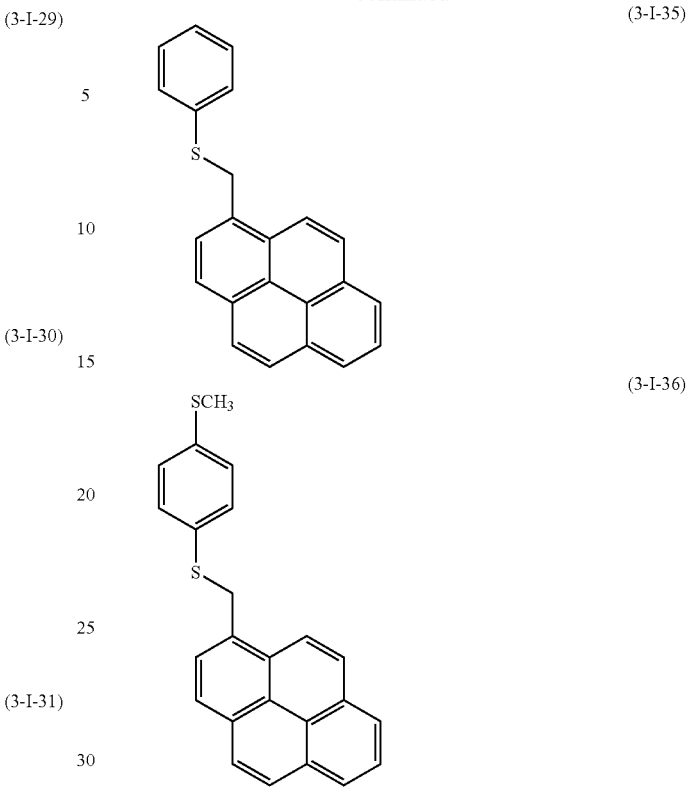

(b) Polymerization Initiator

The ink composition of the present invention preferably comprises (b) a polymerization initiator. As the polymerization initiator that can be used in the present invention, a known radical polymerization initiator or cationic polymerization initiator may be used. From the viewpoint of sensitivity, the ink composition of the present invention preferably employs a cationic polymerization initiator and a cationically polymerizable compound, which will be described later. The polymerization initiators may be used singly or in a combination of two or more types.

The radical polymerization initiator or the cationic polymerization initiator that can be used in the ink composition of the present invention is a compound that forms a polymerization initiating species by absorbing external energy. The external energy used for initiating polymerization is roughly divided into heat and actinic radiation, and a thermal polymerization initiator and a photopolymerization initiator are used respectively. Examples of the actinic radiation include γ rays, β rays, an electron beam, UV rays, visible light, and IR rays.

Radical Polymerization Initiator

Preferred examples of the radical polymerization initiator that can be used in the present invention include (a) aromatic ketones, (b) aromatic onium salt compounds, (c) organic peroxides, (d) thio compounds, (e) hexaarylbiimidazole compounds, (f) ketoxime ester compounds, (g) borate compounds, (h) azinium compounds, (i) metallocene compounds, (j) active ester compounds, (k) compounds having a carbon-halogen bond, and (l) alkylamine compounds. These radical polymerization initiators may be used singly or in a combination of the above-mentioned compounds (a) to (l). The radical polymerization initiators of the present invention are suitably used singly or in a combination of two or more types.

Cationic Polymerization Initiator

As the cationic polymerization initiator (photo-acid generator) that can be used in the present invention, for example, compounds that are used for chemically amplified photoresists or cationic photopolymerization are preferably cited (ref. 'Imejingu you Yukizairyou' (Organic Materials for Imaging) Ed. The Japanese Research Association for Organic Electronics Materials, Bunshin Publishing Co. (1993), pp. 187-192). Examples of the cationic polymerization initiator suitably used in the present invention are listed below.

Firstly, $B(C_6F_5)_4^-$, $PF_6^-$, $AsF_6^-$, $SbF_6^-$, and $CF_3SO_3^-$ salts of aromatic onium compounds such as diazonium, ammonium, iodonium, sulfonium, and phosphonium can be cited. Secondly, sulfonates that generate a sulfonic acid can be cited. Thirdly, halides that photogenerate a hydrogen halide can also be used. Fourthly, iron allene complexes can be cited.

As the onium ion in the cationic polymerization initiator that can be used in the present invention, a triarylsulfonium salt is preferable from the viewpoint of sensitivity and thermal stability. Furthermore, the onium ion is preferably, from the viewpoint of improvement of sensitivity, a triarylsulfonium salt that is substituted with at least one electron-withdrawing group such as a trifluoromethyl group, a halogen atom, an ester group, a sulfoxide group, a cyano group, an amide group, a carboxyl group, and/or a carbonyl group, more preferably a triarylsulfonium salt that is substituted with at least one —F, —$CF_3$, —Cl, and/or —Br, yet more preferably a triarylsulfonium salt whose aryl skeleton is substituted with at least one halogen atom (—F, —Cl, and/or —Br), and most preferably a triarylsulfonium salt that is substituted with three chloro groups (—Cl).

(c) Polymerizable Compound

The ink composition of the present invention comprises (c) a polymerizable compound. Examples of the polymerizable compound that can be used in the present invention include a radically polymerizable compound and a cationically polymerizable compound. From the viewpoint of sensitivity, the ink composition of the present invention preferably employs a cationic polymerization initiator and a cationically polymerizable compound.

As the radically polymerizable compound, photocuring materials employing photopolymerizable compositions described in, for example, JP-A-7-159983, JP-B-7-31399, JP-A-8-224982, and JP-A-10-863 are known. As the cationically polymerizable compound, for example, a cationically polymerizable type photocuring resin is known, and in recent years cationically photopolymerizable type photocuring resins sensitized to a visible light wavelength region of 400 nm or longer have been disclosed in, for example, JP-A-6-43633 and JP-A-8-324137.

<Radically Polymerizable Compound>

The radically polymerizable compound is a compound having a radically polymerizable ethylenically unsaturated bond, and may be any compound as long as it has at least one radically polymerizable ethylenically unsaturated bond in the molecule; examples thereof include those having a chemical configuration such as a monomer, an oligomer, or a polymer. One type of radically polymerizable compound may be used, or two or more types thereof may be used in combination in order to improve an intended property. It is more preferable to use a polyfunctional compound having two or more functional groups than it is to use a monofunctional compound. It is yet more preferable to use two or more types of polyfunctional compounds in combination in terms of controlling aspects of performance such as reactivity or physical properties.

Examples of the polymerizable compound having a radically polymerizable ethylenically unsaturated bond include unsaturated carboxylic acids such as acrylic acid, methacrylic acid, itaconic acid, crotonic acid, isocrotonoic acid, and maleic acid, and salts thereof, anhydrides having an ethylenically unsaturated group, acrylonitrile, styrene, and various types of radically polymerizable compounds such as unsaturated polyesters, unsaturated polyethers, unsaturated polyamides, and unsaturated urethanes.

Specific examples thereof include acrylic acid derivatives such as 2-ethylhexyl acrylate, 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentylglycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, polypropylene glycol diacrylate, pentaerythritol triacrylate, pentaerythritol tetraacrylate, dipentaerythritol tetraacrylate, trimethylolpropane triacrylate, tetramethylolmethane tetraacrylate, oligoester acrylate, N-methylol acrylamide, diacetone acrylamide, and epoxyacrylate; methacrylic derivatives such as methyl methacrylate, n-butyl methacrylate, 2-ethylhexyl methacrylate, lauryl methacrylate, allyl methacrylate, glycidyl methacrylate, benzyl methacrylate, dimethylaminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane trimethacrylate, trimethylolpropane trimethacrylate, and 2,2-bis(4-methacryloxypolyethoxyphenyl)propane; and allyl compound derivatives such as allyl glycidyl ether, diallyl phthalate, and triallyl trimellitate. More specifically, commercial products, radically polymerizable or crosslinking monomers, oligomers, and polymers known in the art such as those described in 'Kakyozai Handobukku' (Crosslinking Agent Handbook), Ed. S. Yamashita (Taiseisha, 1981); 'UV•EB Koka Handobukku' (UV•EB Curing Handbook (Starting Materials) Ed. K. Kato (Kobunshi Kankoukai, 1985); 'UV•EB Koka Gijutsu no Oyo to Shijyo' (Application and Market of UV•EB Curing Technology', p. 79, Ed. Rad Tech (CMC, 1989); and E. Takiyama 'Poriesuteru Jushi Handobukku' (Polyester Resin Handbook), (The Nikkan Kogyo Shimbun Ltd., 1988) can be used.

It is preferable to use the radically polymerizable compound and the cationically polymerizable compound in combination since, due to high sensitivity characteristic of radical polymerization and low volume shrinkage characteristic of cationic polymerization, a printed material or a lithographic printing plate having both high sensitivity and adhesion is obtained.

<Cationically Polymerizable Compound>

The cationically polymerizable compound used in the present invention is not particularly limited as long as it is a compound that undergoes a polymerization reaction by virtue of an acid generated by the photo-acid generator, which will be described later, and is cured, and various types of cationically polymerizable monomers known as photo-cationically polymerizable monomers may be used. Examples of the cationically polymerizable monomer include epoxy compounds, vinyl ether compounds, oxetane compounds described in JP-A-6-9714, JP-A-2001-31892, JP-A-2001-40068, JP-A-2001-55507, JP-A-2001-310938, JP-A-2001-310937, JP-A-2001-220526, etc.

Examples of the epoxy compounds include aromatic epoxides, alicyclic epoxides, and aliphatic epoxides, and examples of the aromatic epoxide include di- or polyglycidyl ethers produced by a reaction between epichlorohydrin and a polyhydric phenol having at least one aromatic nucleus or an alkylene oxide adduct thereof; specific examples include di- or polyglycidyl ethers of bisphenol A or an alkylene oxide adduct thereof, di- or polyglycidyl ethers of hydrogenated bisphenol A or an alkylene oxide adduct thereof, and novolac type epoxy resins. Examples of the alkylene oxide above include ethylene oxide and propylene oxide.

Examples of the alicyclic epoxides include cyclohexene oxide- and cyclopentene oxide-containing compounds obtained by epoxidizing a compound having at least one cycloalkene ring such as a cyclohexene ring or a cyclopentene ring with an appropriate oxidizing agent such as hydrogen peroxide or a peracid.

Examples of the aliphatic epoxides include di- or polyglycidyl ethers of an aliphatic polyhydric alcohol or an alkylene oxide adduct thereof, and representative examples thereof include diglycidyl ethers of an alkylene glycol such as the diglycidyl ether of ethylene glycol, the diglycidyl ether of propylene glycol, and the diglycidyl ether of 1,6-hexanediol, polyglycidyl ethers of a polyhydric alcohol such as the di- or triglycidyl ether of glycerol or an alkylene oxide adduct thereof, and diglycidyl ethers of a polyalkylene glycol such as the diglycidyl ether of polyethylene glycol or an alkylene oxide adduct thereof and the diglycidyl ether of polypropylene glycol or an alkylene oxide adduct thereof. Examples of the alkylene oxide above include ethylene oxide and propylene oxide.

Detailed examples of monofunctional and polyfunctional epoxy compounds that can be used in the present invention are now given.

Examples of monofunctional epoxy compounds used in the present invention include phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Furthermore, examples of polyfunctional epoxy compounds include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexenylmethyl-3',4'-epoxycyclohexenecarboxylate, 2-(3,4-epoxycyclohexyl-5,5-spiro-3,4-epoxy)cyclohexane-meta-dioxane, bis(3,4-epoxycyclohexylmethyl) adipate, vinylcyclohexene dioxide, 4-vinylepoxycyclohexane, bis(3,4-epoxy-6-methylcyclohexylmethyl) adipate, 3,4-epoxy-6-methylcyclohexenyl 3',4'-epoxy-6'-methylcyclohexenecarboxylate, methylenebis(3,4-epoxycyclohexane), dicyclopentadiene diepoxide, the di(3,4-epoxycyclohexylmethyl) ether of ethylene glycol, ethylene bis(3,4-epoxycyclohexanecarboxylate), dioctyl epoxyhexahydrophthalate, di-2-ethylhexyl epoxyhexahydrophthalate, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ether, 1,13-tetradecadiene dioxide, limonene dioxide, 1,2,7,8-diepoxyoctane, and 1,2,5,6-diepoxycyclooctane.

Among these epoxy compounds, the aromatic epoxides and the alicyclic epoxides are preferable from the viewpoint of excellent curing speed, and the alicyclic epoxides are particularly preferable.

Examples of the vinyl ether compounds include di- or tri-vinyl ether compounds such as ethylene glycol divinyl ether, diethylene glycol divinyl ether, triethylene glycol divinyl ether, propylene glycol divinyl ether, dipropylene glycol divinyl ether, butanediol divinyl ether, hexanediol divinyl ether, cyclohexanedimethanol divinyl ether, and trimethylolpropane trivinyl ether, and monovinyl ether compounds such as ethyl vinyl ether, n-butyl vinyl ether, isobutyl vinyl ether, octadecyl vinyl ether, cyclohexyl vinyl ether, hydroxybutyl vinyl ether, 2-ethylhexyl vinyl ether, cyclohexanedimethanol monovinyl ether, n-propyl vinyl ether, isopropyl vinyl ether, isopropenyl vinyl ether-O-propylene carbonate, dodecyl vinyl ether, and diethylene glycol monovinyl ether.

Detailed examples of monofunctional vinyl ethers and polyfunctional vinyl ethers are given below.

Specific examples of monofunctional vinyl ethers include methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxypolyethylene glycol vinyl ether.

Furthermore, examples of polyfunctional vinyl ethers include divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and polyfunctional vinyl ethers such as trimethylolethane trivinyl ether, trimethylolpropane trivinyl ether, ditrimethylolpropane tetravinyl ether, glycerol trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipentaerythritol hexavinyl ether.

As the vinyl ether compound, the di- or tri-vinyl ether compounds are preferable from the viewpoint of curability, adhesion to a recording medium, surface hardness of the image formed, etc., and the divinyl ether compounds are particularly preferable.

The oxetane compound in the present invention means a compound having at least one oxetane ring, and may be selected freely from known oxetane compounds such as those described in JP-A-2001-220526, JP-A-2001-310937, and JP-A-2003-341217.

As the compound having an oxetane ring that can be used in the ink composition of the present invention, a compound having 1 to 4 oxetane rings in the structure is preferable. In accordance with use of such a compound, it becomes easy to maintain the viscosity of the ink composition in a range that gives good handling properties and, furthermore, the cured ink can be given high adhesion to the recording medium, which is preferable.

Examples of compounds having 1 to 2 oxetane rings in the molecule include compounds represented by Formulae (1) to (3) below.

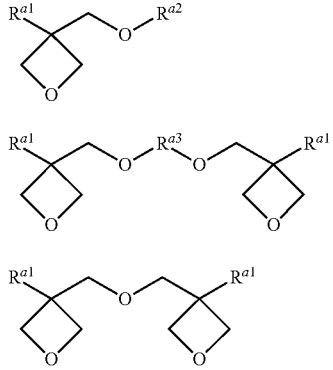

$R^{a1}$ denotes a hydrogen atom, an alkyl group having 1 to 6 carbons, a fluoroalkyl group having 1 to 6 carbons, an allyl group, an aryl group, a furyl group, or a thienyl group. When there are two $R^{a1}$ in the molecule, they may be identical to or different from each other.

Examples of the alkyl group include a methyl group, an ethyl group, a propyl group, and a butyl group, and preferred examples of the fluoroalkyl group include those obtained by substituting any of the hydrogen atoms of the above alkyl groups with a fluorine atom.

$R^{a2}$ denotes a hydrogen atom, an alkyl group having 1 to 6 carbons, an alkenyl group having 2 to 6 carbons, a group having an aromatic ring, an alkylcarbonyl group having 2 to 6 carbons, an alkoxycarbonyl group having 2 to 6 carbons, or an N-alkylcarbamoyl group having 2 to 6 carbons. Examples of the alkyl group include a methyl group, an ethyl group, a propyl group, and a butyl group, examples of the alkenyl group include a 1-propenyl group, a 2-propenyl group, a 2-methyl-1-propenyl group, a 2-methyl-2-propenyl group, a 1-butenyl group, a 2-butenyl group, and a 3-butenyl group, and examples of the group having an aromatic ring include a phenyl group, a benzyl group, a fluorobenzyl group, a methoxybenzyl group, and a phenoxyethyl group. Examples of the alkylcarbonyl group include an ethylcarbonyl group, a propylcarbonyl group, and a butylcarbonyl group, examples of the alkoxycarbonyl group include an ethoxycarbonyl group, a propoxycarbonyl group, and a butoxycarbonyl group, and examples of the N-alkylcarbamoyl group include an ethylcarbamoyl group, a propylcarbamoyl group, a butylcarbamoyl group, and a pentylcarbamoyl group. Furthermore, it is possible for $R^2$ to have a substituent, and the examples of the substituent include alkyl group, having 1 to 6 carbons and fluorine atom $R^{a3}$ denotes a linear or branched alkylene group, a linear or branched poly(alkyleneoxy) group, a linear or branched unsaturated hydrocarbon group, a carbonyl group, a carbonyl group-containing alkylene group, a carboxyl group-containing alkylene group, a carbamoyl group-containing alkylene group, or a group shown below. Examples of the alkylene group include an ethylene group, a propylene group, and a butylene group, and examples of the poly(alkyleneoxy) group include a poly(ethyleneoxy) group and a poly(propyleneoxy) group. Examples of the unsaturated hydrocarbon group include a propenylene group, a methylpropenylene group, and a butenylene group.

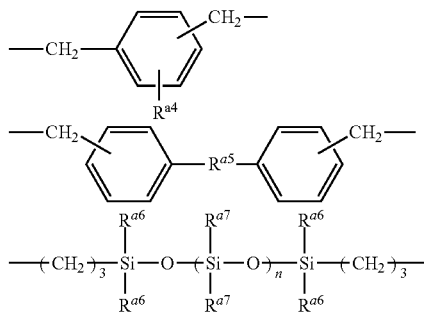

When $R^{a3}$ is the above-mentioned polyvalent group, $R^{a4}$ denotes a hydrogen atom, an alkyl group having 1 to 4 carbons, an alkoxy group having 1 to 4 carbons, a halogen atom, a nitro group, a cyano group, a mercapto group, a lower alkylcarboxyl group, a carboxyl group, or a carbamoyl group.

$R^{a5}$ denotes an oxygen atom, a sulfur atom, a methylene group, NH, SO, $SO_2$, $C(CF_3)_2$, or, $C(CH_3)_2$.

$R^{a6}$ denotes an alkyl group having 1 to 4 carbons or an aryl group, and n is an integer of 0 to 2,000. $R^{a7}$ denotes an alkyl group having 1 to 4 carbons, an aryl group, or a monovalent group having the structure below. In the formula, $R^{a8}$ denotes an alkyl group having 1 to 4 carbons or an aryl group, and m is an integer of 0 to 100.

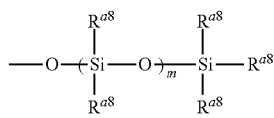

Examples of the compound represented by Formula (1) include 3-ethyl-3-hydroxymethyloxetane (OXT-101: manufactured by Toagosei Co., Ltd.), 3-ethyl-3-(2-ethylhexyloxymethyl)oxetane (OXT-212: manufactured by Toagosei Co., Ltd.), and 3-ethyl-3-phenoxymethyloxetane (OXT-211: manufactured by Toagosei Co., Ltd.). Examples of the compound represented by Formula (2) include 1,4-bis[(3-ethyl-3-oxetanylmethoxy)methyl]benzene (OXT-121: Toagosei Co., Ltd.). Examples of the compound represented by Formula (3) include bis(3-ethyl-3-oxetanylmethyl) ether (OXT-221: Toagosei Co., Ltd.).

Examples of the compound having 3 to 4 oxetane rings in the molecule include compounds represented by Formula (4) below.

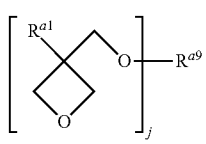

In Formula (4), $R^{a1}$ denotes the same as in Formula (1) above. Furthermore, examples of $R^{a9}$, which is a polyvalent linking group, include a branched alkylene group having 1 to 12 carbons such as a group represented by A to C below, a branched poly(alkyleneoxy) group such as a group represented by D below, and a branched polysiloxane group such as a group represented by E below. j is 3 or 4.

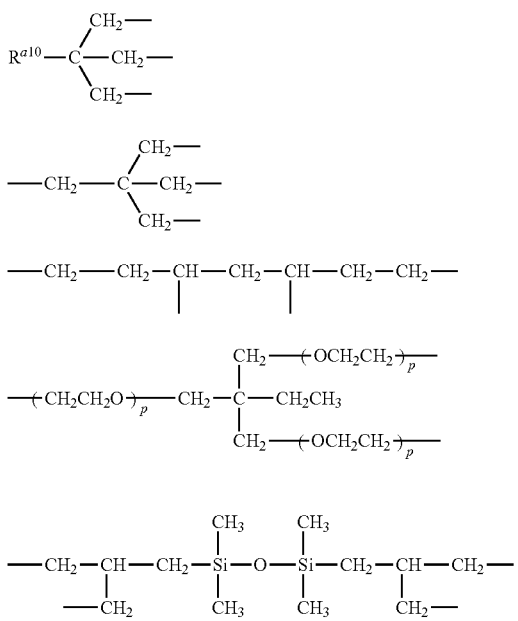

In the above A, $R^{a10}$ denotes a methyl group, an ethyl group, or a propyl group. Furthermore, in the above D, p is an integer of 1 to 10.

Moreover, as another embodiment of the oxetane compound that can be suitably used in the present invention, a compound having an oxetane ring on a side chain, represented by Formula (5) below, can be cited.

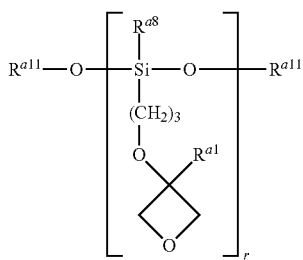

In Formula (5), $R^{a1}$ and $R^{a8}$ denote the same as in the above-mentioned formulae. $R^{a11}$ is an alkyl group having 1 to 4 carbons such as a methyl group, an ethyl group, a propyl group, or a butyl group, or a trialkylsilyl group, and r is 1 to 4.

Such compounds having an oxetane ring are described in detail in paragraph Nos. (0021) to (0084) of JP-A-2003-341217 above, and the compounds described here may be suitably used in the present invention.

The oxetane compounds described in JP-A-2004-91556 can be used in the present invention. The details are described in paragraph Nos. (0022) to (0058).

Among the oxetane compounds used in the present invention, from the viewpoint of ink composition viscosity and tackiness, it is preferable to use a compound having one oxetane ring.

The ink composition of the present invention may comprise only one type of cationically polymerizable compound or two or more types thereof in combination, but from the viewpoint of suppressing effectively shrinkage during ink curing, it is preferable to use a combination of a vinyl ether compound and at least one type of compound selected from the oxetane compounds and the epoxy compounds.

The content of the cationically polymerizable compound in the ink composition is suitably in the range of 10 to 95 wt % relative to the total solids content of the composition, preferably 30 to 90 wt %, and more preferably 50 to 85 wt %.

<Preferable Polymerizable Compound>

The polymerizable compound that can be used in the present invention preferably employs such as a (meth)acryl type monomer or prepolymer, a epoxy type monomer or prepolymer, a oxetane type monomer or prepolymer, and a urethane type monomer or prepolymer. A compound described below is further preferable.

2-Ethylhexyl-diglycol acrylate, 2-hydroxy-3-phenoxypropyl acrylate, 2-hydroxybutyl acrylate, neopentylglycol diacrylate hydroxypivalate, 2-acryloyloxyethylphthalic acid, methoxy-polyethyleneglycol acrylate, tetramethylolmethane triacrylate, 2-acryloyloxyethyl-2-hydroxyethylphthalic acid, dimethyloltricyclodecane diacrylate, ethoxylated phenylacrylate, 2-acryloyloxyethylsuccinic acid, nonylphenol ethylene oxide modified acrylate, modified glycerol triacrylate, bisphenol A diglycigyl ether acrylic acid adduct, modified bisphenol A diacrylate, phenoxy-polyethylene glycol acrylate, 2-acryloyloxyethylhexahydrophthalic acid, bisphenol A propylene oxide modified diacrylate, bisphenol A ethylene oxide modified diacrylate, dipentaerythritol hexaacrylate, pentaerythritol triacrylate tolylenediisocyanate urethane prepolymer, lactone modified flexible acrylate, butoxyethyl acrylate, propylene glycol digrycigyl ether acrylic acid adduct, pentaerythritol triacrylate hexametylenediisocyanate urethane prepolymer, 2-hydroxyethyl acrylate, methoxydipropylene grycol acrylate, ditrimetylolpropane tetraacrylate, pentaerythritol triacrylate hexametylenediisocyanate urethane prepolymer, stearyl acrylate, isoamyl acrylate, isomyristyl acrylate, isostearyl acrylate, etc.

These acrylate compounds can be relatively reduced viscosity, can be obtained stable stable ink dischargability, and have high polymerizable sensitivity and good adhesion to a recording medium than a polymerizable compound having been used for conventional UV curing type ink. In the present invention, in the case of using the above-mentioned acrylate compound as a polymerizable compound, the content of the acrylate compound in the ink composition is preferably in the range of 20 to 95 wt % relative to the total solids content of the composition, more preferably 50 to 95 wt %, and further more preferably 70 to 85 wt %.

In the present invention, the above-mentioned monomer as a polymerizable compound has high reactivity, low viscosity, and good adhesion to a recording medium.

Furthermore, in order to improve sensitivity, spreading, and adhesion to a recording medium, from the viewpoint of improving sensitivity and adhesion, it is preferable to use a combination of the above-mentioned monoacrylate and a polyfunctional acrylate monomer or a polyfunctional acrylate oligomer of molecular weight is at least 400, preferably at least 500. Furthermore, it is particularly preferable to use a combination of a monofunctional monomer, a difunctional monomer, and a polyfunctional monomer which is a trifunctional or more functional monomer. While maintaining safety, it can be improved sensitivity, spreading, and adhesion to a recording medium, which is preferable. A oligomer is particularly preferably a epoxy acrylate oligomer and a urethane oligomer.

In a recording to a flexible recording medium such as a PET film and a PP film, it is preferable to use a monoacrylate selected from the group consisting of the above-mentioned compounds and a polyfunctional acrylate monomer or a polyfunctional acrylate oligomer in combination in order to have flexibility of a membrane, improve adhesion, and improve strength of a membrane. The monoacrylate is preferably stearyl acrylate, isoamyl acrylate, isomyristyl acrylate or isostearyl acrylate from the viewpoint of high sensitivity, low shrinkage, suppressing curing, and preventing spreading, odor of a printed material, and cost-cutting of a irradiation device.

In the above-mentioned compounds, it is preferably to use less than 70 wt % of the content of an alcoxyacrylate and the other content of an acrylate in order to have high sensitivity, good spreading character, and good odor character.

(d) Colorant

The colorant that can be used in the present invention is not particularly limited, but a pigment and an oil-soluble dye that have excellent weather resistance and rich color reproduction are preferable, and it may be selected from any known colorant such as a soluble dye. It is preferable that the colorant that can be suitably used in the ink composition or the inkjet recording ink composition of the present invention does not function as a polymerization inhibitor in a polymerization reaction, which is a curing reaction. This is because the sensitivity of the curing reaction by actinic radiation should not be degraded.

<Pigment>

The pigment that can be used in the present invention is not particularly limited and, for example, organic and inorganic pigments having the numbers below described in the Color Index may be used.

That is, as a red or magenta pigment, Pigment Red 3, 5, 19, 22, 31, 38, 43, 48:1, 48:2, 48:3, 48:4, 48:5, 49:1, 53:1, 57:1, 57:2, 58:4, 63:1, 81, 81:1, 81:2, 81:3, 81:4, 88, 104, 108, 112, 122, 123, 144, 146, 149, 166, 168, 169, 170, 177, 178, 179, 184, 185, 208, 216, 226, or 257, Pigment Violet 3, 19, 23, 29, 30, 37, 50, or 88, and Pigment Orange 13, 16, 20, or 36; as a blue or cyan pigment, Pigment Blue 1, 15, 15:1, 15:2, 15:3, 15:4, 15:6, 16, 17-1, 22, 27, 28, 29, 36, or 60; as a green pigment, Pigment Green 7, 26, 36, or 50; as a yellow pigment, Pigment Yellow 1, 3, 12, 13, 14, 17, 34, 35, 37, 55, 74, 81, 83, 93, 94, 95, 97, 108, 109, 110, 137, 138, 139, 153, 154, 155, 157, 166, 167, 168, 180, 185, or 193; as a black pigment, Pigment Black 7, 28, or 26; as a white pigment, Pigment White 6, 18, or 21, etc. may be used according to the intended application.

<Oil-Soluble Dye>

The oil-soluble dye that can be used in the present invention is explained below.

The oil-soluble dye that can be used in the present invention means a dye that is substantially insoluble in water. Specifically, the solubility in water at 25° C. (the mass of dye that can be dissolved in 100 g of water) is no greater than 1 g, preferably no greater than 0.5 g, and more preferably no greater than 0.1 g. Therefore, the oil-soluble dye means a so-called water-insoluble pigment or an oil-soluble dye, and among these the oil-soluble dye is preferable.

In the present invention, the oil-soluble dye may be used singly or in a combination of two or more types. Furthermore, another colorant such as a water-soluble dye, a disperse dye, or a pigment may be contained as necessary in a range that does not interfere with the effects of the present invention.

Among the oil-soluble dyes that can be used in the present invention, as a yellow dye, any may be used. Examples thereof include aryl or heteryl azo dyes having a coupling component such as a phenol, a naphthol, an aniline, a pyrazolone, a pyridone, or an open-chain active methylene compound; azomethine dyes having a coupling component such as an open-chain active methylene compound; methine dyes such as benzylidene dyes and monomethineoxonol dyes; quinone dyes such as naphthoquinone dyes and anthraquinone dyes; and other dye species such as quinophthalone dyes, nitro/nitroso dyes, acridine dyes, and acridinone dyes.

Among the above-mentioned oil-soluble dyes that can be used in the present invention, as a magenta dye, any may be used. Examples thereof include aryl or heteryl azo dyes having a coupling component such as a phenol, a naphthol, or an aniline; azomethine dyes having a coupling component such as a pyrazolone or a pyrazolotriazole; methine dyes such as arylidene dyes, styryl dyes, merocyanine dyes, and oxonol dyes; carbonium dyes such as diphenylmethane dyes, triphenylmethane dyes, and xanthene dyes; quinone dyes such as naphthoquinones, anthraquinones, or anthrapyridones; and condensed polycyclic dyes such as dioxazine dyes.

Among the oil-soluble dyes that can be used in the present invention, as a cyan dye, any may be used. Examples thereof include indoaniline dyes, indophenol dyes, and azomethine dyes having a coupling component such as a pyrrolotriazole; polymethine dyes such as cyanine dyes, oxonol dyes, and merocyanine dyes; carbonium dyes such as diphenylmethane dyes, triphenylmethane dyes, and xanthene dyes; phthalocyanine dyes; anthraquinone dyes; aryl or heteryl azo dyes having a coupling component such as a phenol, a naphthol, or an aniline; and indigo/thioindigo dyes.

The above-mentioned dyes may be dyes that exhibit respective colors of yellow, magenta, and cyan only after a part of the chromophore dissociates, and in that case the counter cation may be an inorganic cation such as an alkali metal or ammonium, may be an organic cation such as pyridinium or a quaternary ammonium salt, or may be a polymer cation having the above cation as a partial structure.

Although not limited to the following, preferred specific examples thereof include CI Solvent Black 3, 7, 27, 29, and 34; CI Solvent Yellow 14, 16, 19, 29, 30, 56, 82, 93, and 162; CI Solvent Red 1, 3, 8, 18, 24, 27, 43, 49, 51, 72, 73, 109, 122, 132, and 218; CI Solvent Violet 3; CI Solvent Blue 2, 11, 25, 35, 38, 67, and 70; CI Solvent Green 3 and 7; and CI Solvent Orange 2. Particularly preferred examples thereof include Nubian Black PC-0850, Oil Black HBB, Oil Yellow 129, Oil Yellow 105, Oil Pink 312, Oil Red 5B, Oil Scarlet 308, Vali Fast Blue 2606, Oil Blue BOS (manufactured by Orient Chemical Industries, Ltd.), Aizen Spilon Blue GNH (manufactured by Hodogaya Chemical Co., Ltd.), Neopen Yellow 075, Neopen Magenta SE1378, Neopen Blue 808, Neopen Blue FF4012, and Neopen Cyan FF4238 (manufactured by BASF).

In the present invention, a disperse dye may be used in a range that enables it to be dissolved in a water-immiscible organic solvent. Specific preferred examples thereof include CI Disperse Yellow 5, 42, 54, 64, 79, 82, 83, 93, 99, 100, 119, 122, 124, 126, 160, 184:1, 186, 198, 199, 201, 204, 224, and 237; CI Disperse Orange 13, 29, 31:1, 33, 49, 54, 55, 66, 73, 118, 119, and 163; CI Disperse Red 54, 60, 72, 73, 86, 88, 91, 92, 93, 111, 126, 127, 134, 135, 143, 145, 152, 153, 154, 159, 164, 167:1, 177, 181, 204, 206, 207, 221, 239, 240, 258, 277, 278, 283, 311, 323, 343, 348, 356, and 362; CI Disperse Violet 33; CI Disperse Blue 56, 60, 73, 87, 113, 128, 143, 148, 154, 158, 165, 165:1, 165:2, 176, 183, 185, 197, 198, 201, 214, 224, 225, 257, 266, 267, 287, 354, 358, 365, and 368; and CI Disperse Green 6:1 and 9.

Particularly preferred examples of the oil-soluble dye include azo and azomethine dyes represented by Formulae (1) and (2) below. Dyes represented by Formula (2) below are known, in the photographic material area, as dyes that are generated from a coupler and a developing agent by oxidation.

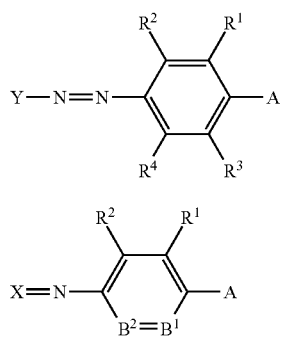

In Formulae (1) and (2) above, $R^1$, $R^2$, $R^3$ and $R^4$ independently denote a hydrogen atom, a halogen atom, an aliphatic group, an aromatic group, a heterocyclic group, a cyano group, a hydroxyl group, a nitro group, an amino group, an alkylamino group, an alkoxy group, an aryloxy group, an amide group, an arylamino group, a ureido group, a sulfamoylamino group, an alkylthio group, an arylthio group, an alkoxycarbonylamino group, a sulfonamide group, a carbamoyl group, a sulfamoyl group, a sulfonyl group, an alkoxycarbonyl group, a heterocyclooxy group, an azo group, an acyloxy group, a carbamoyloxy group, a silyloxy group, an aryloxycarbonyl group, an aryloxycarbonylamino group, an imide group, a heterocyclothio group, a sulfinyl group, a phosphoryl group, an acyl group, a carboxyl group, or a sulfo group.

In Formulae (1) and (2) above, in particular, $R^2$ is preferably, among the above-mentioned substituents, a hydrogen atom, a halogen atom, an aliphatic group, an alkoxy group, an aryloxy group, an amide group, a ureido group, a sulfamoylamino group, an alkoxycarbonylamino, or a sulfonamide group.

In the present specification, the aliphatic group denotes an alkyl group, a substituted alkyl group, an alkenyl group, a substituted alkenyl group, an alkynyl group, a substituted alkynyl group, an aralkyl group, or a substituted aralkyl group. The aliphatic group may have a branch or form a ring. The number of carbon atoms of the aliphatic group is preferably 1 to 20, and more preferably 1 to 18. The aryl moiety of the aralkyl group and the substituted aralkyl group is preferably phenyl or naphthyl, and particularly preferably phenyl. Examples of the substituents of the alkyl moieties of the substituted alkyl group, the substituted alkenyl group, the substituted alkynyl group, and the substituted aralkyl group include the substituents cited for explanation of $R^1$ to $R^4$.

Examples of the substituents of the aryl moiety of the substituted aralkyl group are the same as those of the substituent of the substituted aryl group below.

In the present specification, the aromatic group means an aryl group and a substituted aryl group. The aryl group is preferably phenyl or naphthyl, and particularly preferably phenyl. The aryl moiety of the substituted aryl group is the same as that of the above-mentioned aryl group. Examples of the substituent of the substituted aryl group include substituents cited for explanation of $R^1$ to $R^4$.

In Formulae (1) and (2) above, A denotes —$NR^5R^6$ or a hydroxyl group, and $R^5$ and $R^6$ independently denote a hydrogen atom, an aliphatic group, an aromatic group, or a heterocyclic group. A is preferably —$NR^5R^6$. $R^5$ and $R^6$ may be bonded together to form a ring. $R^5$ and $R^6$ preferably each denote a hydrogen atom, an alkyl group, a substituted alkyl group, an aryl group, or a substituted aryl group, and most preferably a hydrogen atom, an alkyl group having 1 to 18 carbon atoms, or a substituted alkyl group having 1 to 18 carbon atoms.

In Formula (2) above, $B^1$ denotes =$C(R^3)$— or =N—, and $B^2$ denotes —$C(R^4)$= or —N=. It is preferable that $B^1$ and $B^2$ are not —N= at the same time, and it is more preferable that $B^1$ is =$C(R^3)$— and $B^2$ is —$C(R^4)$=. Any of $R^1$ and $R^5$, $R^3$ and $R^6$, and $R^1$ and $R^2$ may be bonded together to form an aromatic ring or a hetero ring.

In Formula (1) above, Y denotes an unsaturated heterocyclic group. Y is preferably a five-membered or six-membered unsaturated hetero ring. The hetero ring may be condensed with an aliphatic ring, an aromatic ring, or another hetero ring. Examples of the hetero atom of the hetero ring include N, O, and S.

Preferred examples of the above-mentioned unsaturated hetero ring include a pyrazole ring, an imidazole ring, a thiazole ring, an isothiazole ring, a thiadiazole ring, a thiophene ring, a benzothiazole ring, a benzoxazole ring, a benzoisothiazole ring, a pyrimidine ring, a pyridine ring, and a quinoline ring. It is also possible for the unsaturated heterocyclic group to have a substituent cited above as $R^1$ to $R^4$.

In Formula (2) above, X denotes a color photographic coupler residue. Preferred examples of the color photographic coupler residue are as follows.

Yellow couplers: U.S. Pat. Nos. 3,933,501, 4,022,620, 4,326,024, and 4,401,752, couplers represented by Formulae (I) and (II) in U.S. Pat. No. 4,248,961, JP-B-58-10739, GB Pat. Nos. 1,425,020 and 1,476,760, U.S. Pat. Nos. 3,973,968, 4,314,023, and 4,511,649, and EP Pat. Nos. 249,473A and 502,424A; couplers represented by Formulae (1) and (2) in EP Pat. No. 513,496A (in particular, Y-28 on page 18); couplers represented by Formula (I) of Claim 1 in EP Pat. No. 568,037A; couplers represented by Formula (I) of lines 45 to 55 in Column 1 in U.S. Pat. No. 5,066,576; couplers represented by Formula (I) in Paragraph 0008 in JP-A-4-274425; couplers of Claim 1 on page 40 in EP Pat. No. 498,381A1 (in particular, D-35 on page 18); couplers represented by Formula (Y) on page 4 in EP Pat. No. 447,969A1 (in particular, Y-1 (page 17) and Y-54 (page 41)); and couplers represented by Formulae (II) to (IV) on lines 36 to 58 of Column 7 in U.S. Pat. No. 4,476,219 (in particular, II-17 and 19 (Column 17), and II-24 (Column 19)).

Magenta couplers: U.S. Pat. Nos. 4,310,619 and 4,351,897, EP Pat. No. 73,636, U.S. Pat. Nos. 3,061,432 and 3,725,067, Research Disclosure No. 24220 (June, 1984) and No. 24230 (June, 1984), JP-A-60-33552, JP-A-60-43659, JP-A-61-72238, JP-A-60-35730, JP-A-55-118034, JP-A-60-185951, U.S. Pat. Nos. 4,500,630, 4,540,654, and 4,556,630, WO88/04795, JP-A-3-39737 (L-57 (page 11, lower right), L-68 (page 12, lower right), L-77 (page 13, lower right)), EP Pat. No. 456,257 [A-4]-63 (p. 134), [A-4]-73, -75 (p. 139), EP Pat. No. 486,965 M-4, -6 (p. 26), M-7 (p. 27), EP Pat. No. 571,959A M-45 (p. 19), JP-A-5-204106 M-1 (p. 6), and JP-A-4-362631 paragraph No. 0237, M-22, and U.S. Pat. Nos. 3,061,432 and 3,725,067.

Cyan coupler: U.S. Pat. Nos. 4,052,212, 4,146,396, 4,228, 233, and 4,296,200, EP Pat. No. 73,636, JP-A-4-204843, CX-1, 3, 4, 5, 11, 12, 14, 15 (pp. 14 to 16); JP-A-4-43345 C-7, 10 (p. 35), 34, 35 (p. 37), (1-1), (1-17) (pp. 42 to 43); and couplers represented by Formula (Ia) or (Ib) of claim 1 in JP-A-6-67385.

Furthermore, couplers described in JP-A-62-215272 (p. 91), JP-A-2-33144 (p. 3 and 30), EP 355,660A (p. 4, 5, 45 and 47) are also useful.

Among the oil-soluble dyes represented by Formula (1) above, the magenta dyes particularly preferably used are dyes represented by Formula (3) below.

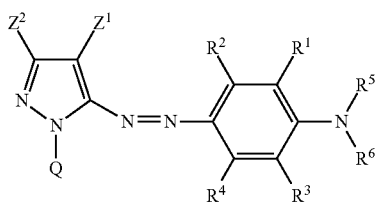

Formula (3)

In Formula (3) above, $Z^1$ denotes an electron-attracting group having a Hammett substituent constant σp value of equal to or greater than 0.20. $Z^1$ is preferably an electron-attracting group having a σp value of at least 0.30 but no greater than 1.0. Preferred specific examples of the substituent include electron-attracting substituents that are described later, and among them an acyl group having 2 to 12 carbons, an alkyloxy carbonyl group having 2 to 12 carbons, a nitro group, a cyano group, an alkylsulfonyl group having 1 to 12 carbons, an arylsulfonyl group having 6 to 18 carbons, a carbamoyl group having 1 to 12 carbons, and a haloalkyl group having 1 to 12 carbons are preferable. A cyano group, an alkylsulfonyl group having 1 to 12 carbons, and an arylsulfonyl group having 6 to 18 carbons are particularly preferable, and a cyano group is most preferable.

In Formula (3) above, $Z^2$ denotes a hydrogen atom, an aliphatic group, or an aromatic group.

In Formula (3) above, $R^1$ to $R^6$ are the same as the corresponding ones of Formula (1) above.

In Formula (3) above, Q denotes a hydrogen atom, an aliphatic group, an aromatic group, or a heterocyclic group. Among them, Q is preferably a group formed from a group of non-metal atoms necessary to form a 5- to 8-membered ring. Among them an aromatic group and a heterocyclic group are particularly preferable. The 5- to 8-membered ring may be substituted, may be a saturated ring, or may have an unsaturated bond. Preferred examples of the non-metal atom include a nitrogen atom, an oxygen atom, a sulfur atom, and a carbon atom. Specific examples of such ring structures include a benzene ring, a cyclopentane ring, a cyclohexane ring, a cycloheptane ring, a cyclooctane ring, a cyclohexene ring, a pyridine ring, a pyrimidine ring, a pyrazine ring, a pyridazine ring, a triazine ring, an imidazole ring, a benzoimidazole ring, an oxazole ring, a benzoxazole ring, an oxane ring, a sulfolane ring, and a thiane ring, and in a case where these rings have a further substituent, examples of the substituent include groups cited as examples of substituents $R^1$ to $R^4$ in Formula (1) above.

Preferred structures of the compounds represented by Formula (3) above are described in JP-A-2001-335714.

Among the dyes represented by Formula (2) above, the magenta dye particularly preferably employs a dye represented by Formula (4) below.

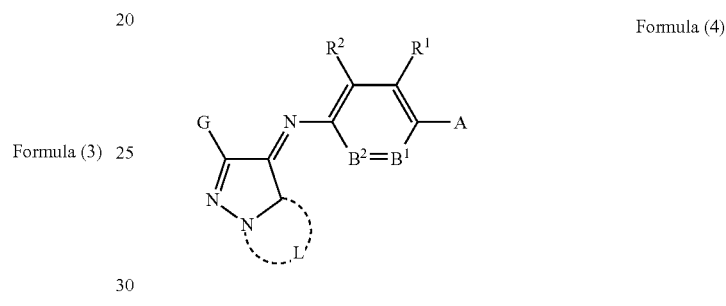

Formula (4)

In Formula (4) above, G denotes a hydrogen atom, an aliphatic group, an aromatic group, a heterocyclic group, a cyano group, an alkoxy group, an aryloxy group, an alkylthio group, an arylthio group, an ester group, an amino group, a carbamoyl group, a sulfonyl group, a sulfamoyl group, a ureido group, a urethane group, an acyl group, an amide group, or a sulfonamide group.

In Formula (4) above, $R^1$, $R^2$, A, $B^1$, and $B^2$ are the same as the corresponding ones of Formula (2) above, and preferred ranges are also the same.

In Formula (4) above, L denotes an atomic group forming a five-membered or six-membered nitrogen-containing hetero ring, which may be substituted with at least one of an aliphatic group, an aromatic group, a heterocyclic group, a cyano group, an alkoxy group, an aryloxy group, an alkylthio group, an arylthio group, an ester group, an amino group, a carbamoyl group, a sulfonyl group, a sulfamoyl group, a ureido group, a urethane group, an acyl group, an amide group, and a sulfonamide group, and this hetero ring may further form a condensed ring with another ring.

With regard to compounds represented by Formula (4) above, A is preferably —$NR^5R^6$, and L preferably forms a five-membered nitrogen-containing hetero ring; examples of the five-membered nitrogen-containing hetero ring include an imidazole ring, a triazole ring, and a tetrazole ring.

Among the dyes represented by Formula (1) and Formula (2) above, compound examples (M0, M-1 to 6, a-21 to 25) for a magenta dye are shown below, but these are only for explaining the present invention in detail, and the present invention should not be construed as being limited thereto.

In the present invention, M0, M-4, M-6, or a-21 may be used, and M-4, M-6, and a-21 are particularly preferable.

TABLE 1
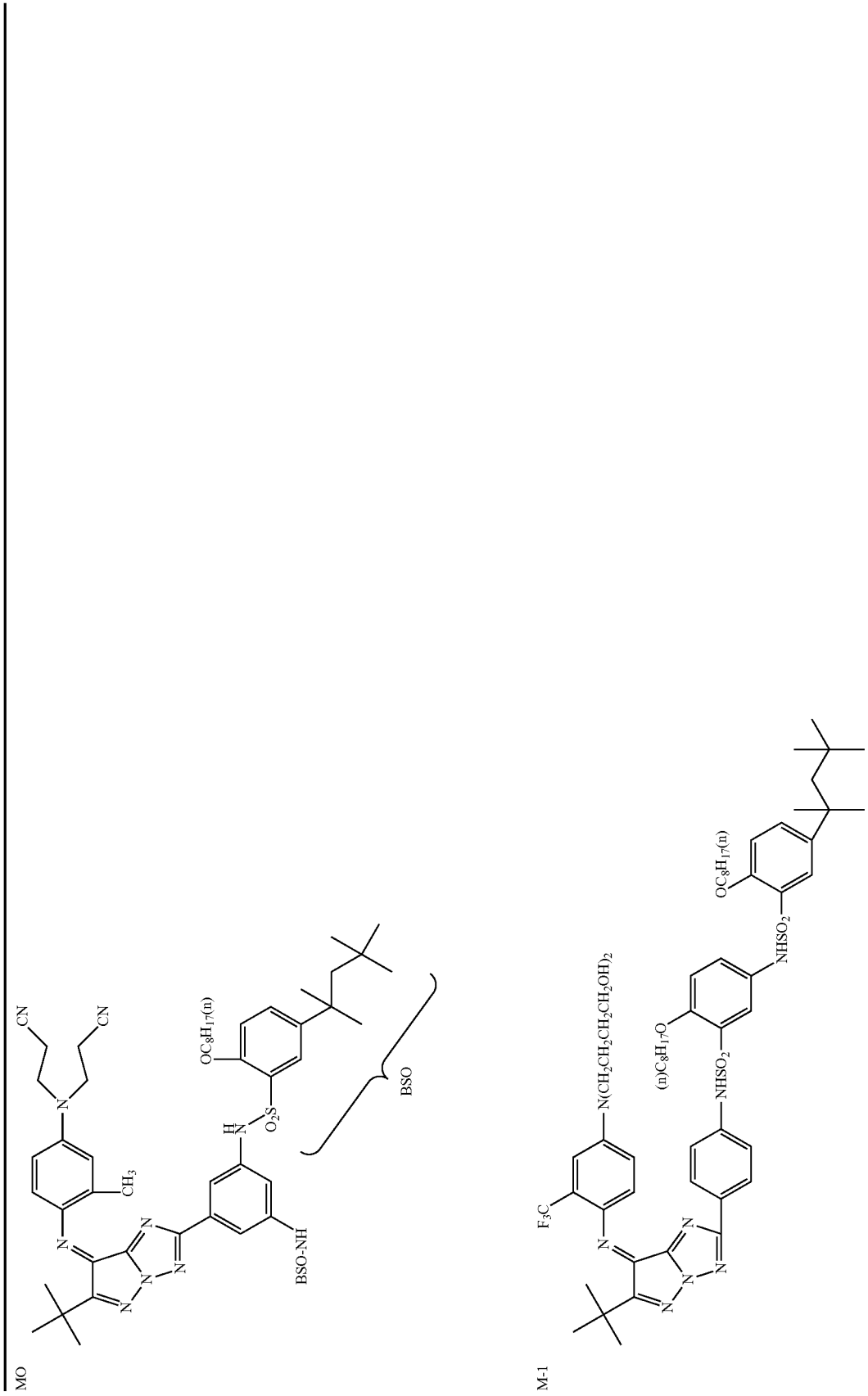

TABLE 1-continued
M-2
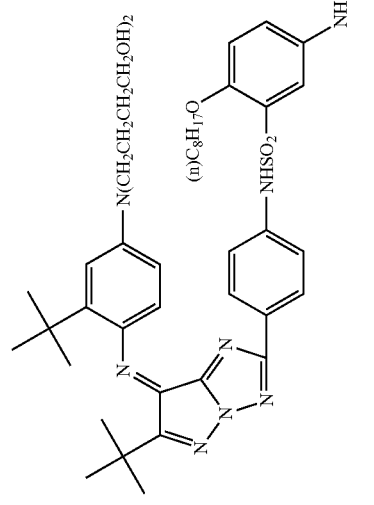
M-3
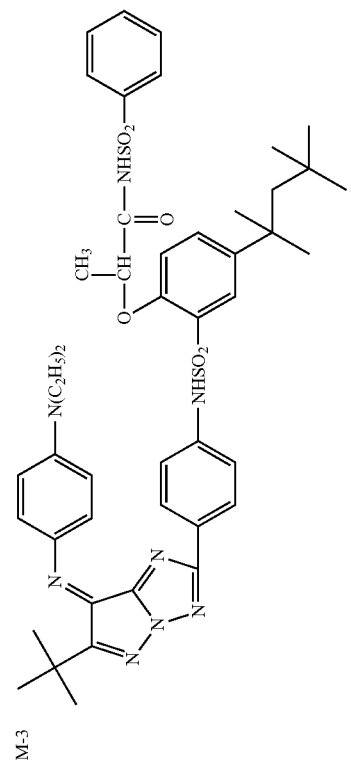

TABLE 1-continued
M-4
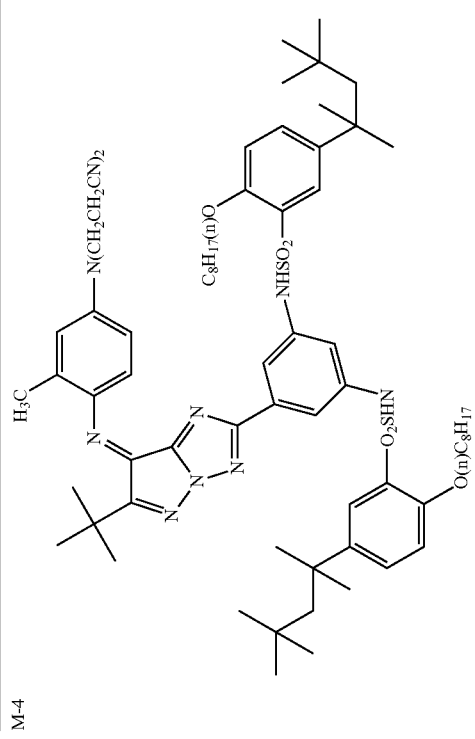
M-5
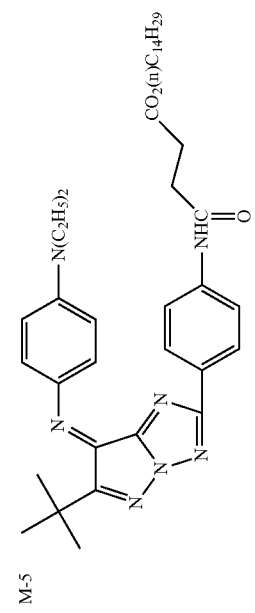

TABLE 1-continued
M-6
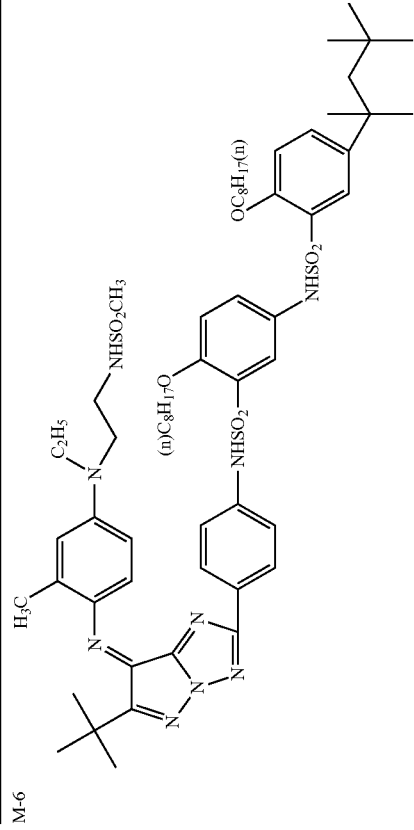
a-21
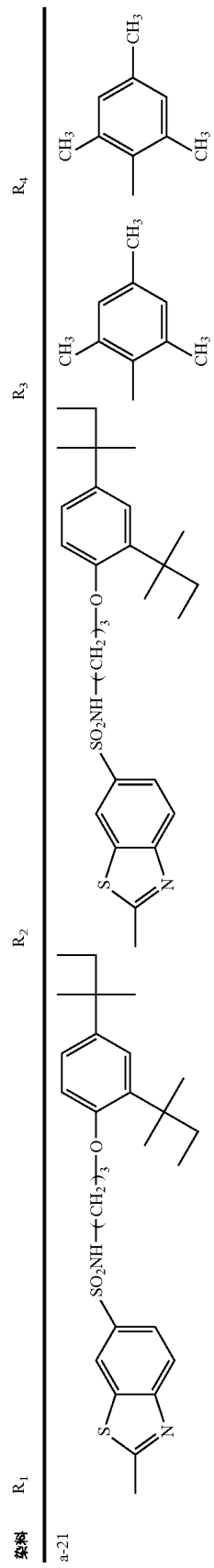

TABLE 1-continued

Other compound examples of the colorant that can be used in the present invention include those described in JP-A-2001-240763, 2001-181549, and JP-A-2001-335714, but the present invention should not be construed as being limited thereto.

The compound represented by Formula (3) above may be synthesized by reference to a method described in, for example, JP-A-2001-335714 or JP-A-55-161856. The compound represented by Formula (4) above may be synthesized by reference to a method described in, for example, JP-A-4-126772, JP-B-7-94180, or JP-A-2001-240763.

Among the dyes represented by Formula (2) above, as a cyan dye a pyrrolotriazole azomethine dye represented by Formula (5) below is particularly preferably used.

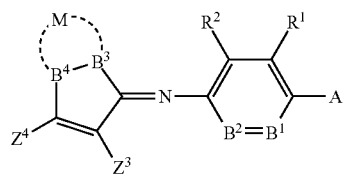

Formula (5)

In Formula (5) above, A, $R^1$, $R^2$, $B^1$, and $B^2$ are the same as the corresponding ones of Formula (2) above, and preferred ranges thereof are also the same.

In Formula (5) above, $Z^3$ and $Z^4$ are independently the same as G in Formula (4) above. $Z^3$ and $Z^4$ may be bonded together to form a ring structure. One in which $Z^3$ is an electron-attracting group having a Hammett substituent constant σp value of equal to or greater than 0.30 exhibits a sharp absorption and is more preferable. Moreover, one in which $Z^3$ is an electron-attracting group having a Hammett substituent constant σp value of equal to or greater than 0.45 is more preferable, and an electron-attracting group having a Hammett substituent constant σp value of equal to or greater than 0.60 is most preferable. Furthermore, one in which the sum of the Hammett substituent constant σp values of $Z^3$ and $Z^4$ is equal to or greater than 0.70 exhibits excellent hue of a cyan-color, and is more preferable.

In Formula (5) above, M is an atomic group forming a 1,2,4-triazole ring that is condensed with the 5-membered ring of Formula (5) above; either one of the two atoms $B^3$ and $B^4$ at the sites of condensation with the 5-membered ring is a nitrogen atom, and the other is a carbon atom.

The compound represented by Formula (5) above is preferably used as a cyan dye, but it may be used as a magenta dye by changing a substituent.

The Hammett substituent constant σp value used in the present specification is now explained. The Hammett rule is an empirical rule proposed by L. P. Hammett in 1935 in order to quantitatively deal with the influence of a substituent on a reaction or equilibrium of a benzene derivative, and the validity thereof is currently widely recognized. A σp value and a σm value are required for the substituent constant in the Hammett rule, and details of these values can be referred to in many general books, for example, 'Lange's Handbook of Chemistry', Ed. by J. A. Dean, 12th edition, 1979 (Mc Graw-Hill) or 'Kagakuno Ryouiki' (Journal of Japanese Chemistry), special issue, 122, pp. 96 to 103, 1979 (Nankodo Co., Ltd.). In the present invention, the substituents are limited or explained using the Hammett substituent constant σp, but this does not mean that they are limited to substituents whose values are described in published references, and a substituent whose value is not published in the references but is included in the range if it is measured in accordance with the Hammett rule is of course included. Among Formulae (1) to (5) above, those that are not benzene derivatives are also included, but the σp value is used as a scale showing the electronic effect of the substituent, irrespective of the position of substitution. The σp value in the present invention is used with the above-mentioned meaning.

Examples of electron-attracting groups having a Hammett substituent constant σp value of equal to or greater than 0.60 include a cyano group, a nitro group, an alkylsulfonyl group (e.g. a methanesulfonyl group), and an arylsulfonyl group (e.g. a benzenesulfonyl group). Examples of electron-attracting groups having a Hammett σp value of equal to or greater than 0.45 include, in addition to the above, an acyl group (e.g. an acetyl group), an alkoxycarbonyl group (e.g. a dodecyloxycarbonyl group), an aryloxycarbonyl group (e.g. m-chlorophenoxycarbonyl), an alkylsulfinyl group (e.g. n-propylsulfinyl), an arylsulfinyl group (e.g. phenylsulfinyl), a sulfamoyl group (e.g. N-ethylsulfamoyl, N,N-dimethylsulfamoyl), and a haloalkyl group (e.g. trifluoromethyl).

Examples of electron-attracting groups having a Hammett substituent constant σp value of equal to or greater than 0.30 include, in addition to the above, an acyloxy group (e.g. acetoxy), a carbamoyl group (e.g. N-ethylcarbamoyl, N,N-dibutylcarbamoyl), a haloalkoxy group (e.g. trifluoromethyloxy), a haloaryloxy group (e.g. pentafluorophenyloxy), a sulfonyloxy group (e.g. a methylsulfonyloxy group), a haloalkylthio group (e.g. difluoromethylthio), an aryl group substituted with two or more electron-attracting groups having a σp value of equal to or greater than 0.15 (e.g. 2,4-dinitrophenyl, pentachlorophenyl), and a hetero ring (e.g. 2-benzooxazolyl, 2-benzothiazolyl, 1-phenyl-2-benzimidazolyl). Specific examples of electron-attracting groups having a σp value of equal to or greater than 0.20 include, in addition to the above, a halogen atom.

Furthermore, in the present invention, an oil-soluble dye represented by Formula (A-I) below can be used preferably.

Formula (A-I)

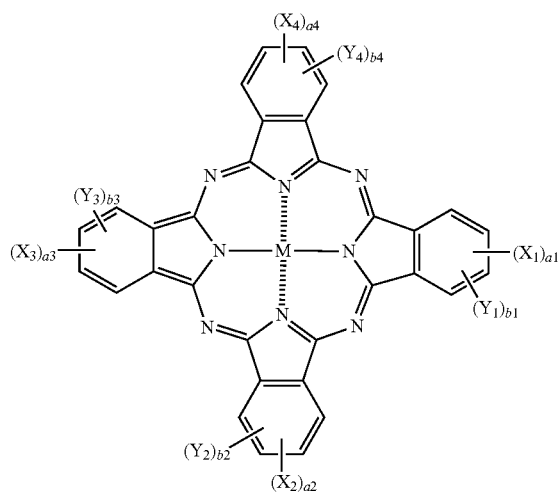

In Formula (A-I): $X_1$, $X_2$, $X_3$, and $X_4$ independently denote a group selected from —SO—Z, —$SO_2$—Z, —$SO_2NR_1R_2$, —$CONR_1R_2$, —$CO_2R_1$, and a sulfo group. Here, Z denotes a substituted or unsubstituted alkyl group, a substituted or unsubstituted cycloalkyl group, a substituted or unsubstituted alkenyl group, a substituted or unsubstituted aralkyl group, a substituted or unsubstituted aryl group, or a substituted or unsubstituted heterocyclic group. $R_1$ and $R_2$ independently denote a hydrogen atom, a substituted or unsubstituted alkyl group, a substituted or unsubstituted cycloalkyl group, a substituted or unsubstituted alkenyl group, a substituted or unsubstituted aralkyl group, a substituted or unsubstituted aryl group, or a substituted or unsubstituted heterocyclic group, provided that $R_1$ and $R_2$ are not both hydrogen atoms.

M denotes a hydrogen atom, a metal element, a metal oxide, a metal hydroxide, or a metal halide. $Y_1$, $Y_2$, $Y_3$, and $Y_4$ independently denote a hydrogen atom or a monovalent substituent. $a_1$ to $a_4$ and $b_1$ to $b_4$ denote the numbers of $X_1$ to $X_4$ and $Y_1$ to $Y_4$, and independently denote an integer of 0 to 4, provided that the sum total of $a_1$ to $a_4$ is equal to or greater than 2.

Among the oil-soluble dyes represented by Formula (A-I) above, an oil-soluble dye represented by Formula (A-II) below may particularly preferably be used.

Formula (A-II)

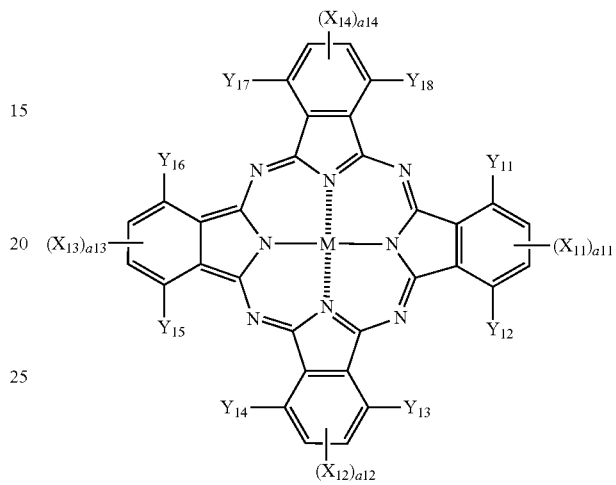

In Formula (A-II): $X_{11}$ to $X_{14}$, $Y_{11}$ to $Y_{18}$, and M are the same as $X_1$ to $X_4$, $Y_1$ to $Y_4$, and M in Formula (A-I) respectively. $a_{11}$ to $a_{14}$ independently denote an integer of 1 or 2.

As a specific example of Formula (A-II) above, a compound example (AII-17) is cited, but this is for explaining the present invention in detail, and the present invention should not be construed as being limited thereto.

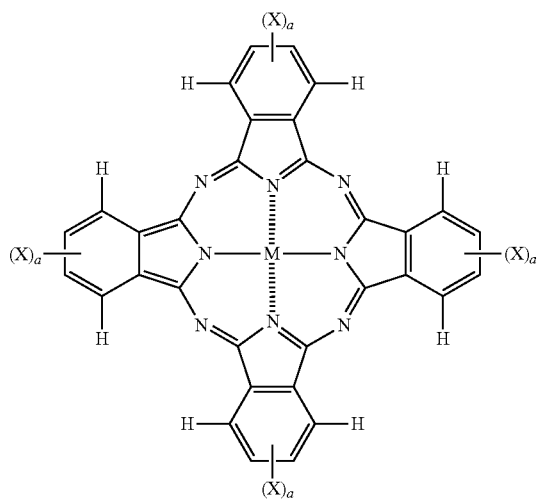

| Compound No. | M | X | a |
|---|---|---|---|
| AII-17 | Cu | —$SO_2$—(—$CH_2$—$)_3$—$SO_2NH$—(—$CH_2$—$)_3$—O—CH(CH$_3$)(CH$_3$) | 1 |

-continued

| | | | |
|---|---|---|---|
| AII-18 | Cu | —SO$_2$—(CH$_2$)$_3$—CO—CH(CH$_3$)—CH$_2$—CH$_3$ (with C=O) | 1 |
| AII-19 | Cu | —SO$_2$—(CH$_2$)$_3$—CO—CH(CH$_3$)—CH$_2$OCH$_3$ (with C=O) | 1 |
| AII-20 | Cu | —SO$_2$—CH$_2$CO—CH$_2$CH(C$_2$H$_5$)—C$_4$H$_9$ | 1 |
| AII-21 | Cu | (—SO$_2$NH—(CH$_2$)$_3$—N(—C$_3$H$_7$OC(=O)—C$_6$H$_4$—SO$_3$$^{\ominus}$N$^{\oplus}$H(C$_6$H$_{13}$)$_3$))$_3$ | 1 |
| AII-22 | Cu | —SO$_2$—CH$_2$CH$_2$NHC(=O)NH—C$_6$H$_{11}$ | 1 |
| AII-23 | Cu | —SO$_2$—(CH$_2$)$_3$—OC(=O)NH—C$_6$H$_5$ | 1 |

In the present invention, it is preferable to use an oil-soluble dye having an oxidation potential that is more noble than 1.0 V (SCE). The more noble the oxidation potential, the more preferable it is; it is more preferable to use one having an oxidation potential more noble than 1.1 V (SCE), and it is most preferable to use one having an oxidation potential more noble than 1.2 V (SCE).

The oxidation potential value (Eox) can be easily measured by one skilled in the art and a method therefor is described in, for example, P. Delahay, 'New Instrumental Methods in Electrochemistry', Interscience Publishers (1954), A. J. Bard et al., 'Electrochemical Methods', John Wiley & Sons (1980), and Akira Fujishima et al., 'Denkikagaku Sokuteihou' (Electrochemical Measurement Methods), Gihodo Shuppan Sha (1984).

More specifically, a test sample is dissolved to give a concentration of $1\times10^{-4}$ to $1\times10^{-6}$ mol/L in a solvent such as dimethylformamide or acetonitrile containing a supporting electrolyte such as sodium perchlorate or tetrapropylammonium perchlorate, an oxidation wave when sweeping toward the oxidation side (noble side) using carbon (GC) as a working electrode and a rotating platinum electrode as the counter electrode using cyclic voltammetry or direct current polarographic equipment is approximated to a straight line, and the oxidation potential of the midpoint of a line segment formed between an intersection point of the straight line and a residual current/potential straight line and an intersection point of the straight line and a saturated current straight line (or an intersection point with a straight line parallel to the ordinate passing through the potential peak value) is measured as a value relative to the SCE (saturated calomel electrode). This value sometimes deviates by on the order of tens of millivolts due to the effect of a liquid junction potential, the liquid resistance of the sample solution, or the like, but the reproducibility of the potential can be guaranteed by adding a standard sample (for example, hydroquinone). The support electrolyte and solvent used may be selected appropriately according to the oxidation potential and the solubility of the test sample. The support electrolyte and solvent that can be used here may be referred to in Akira Fujishima et al., 'Denkikagaku Sokuteihou' (Electrochemical Measurement Methods), Gihodo Shuppan Sha (1984), pp. 101 to 118.

In the concentration range of the above-mentioned measurement solvent and a phthalocyanine compound sample, the oxidation potential of a disassociated state is measured.

The value of Eox represents the ease of electron transfer from a sample to an electrode; the larger the value (the more noble the oxidation potential), the more difficult it is for electrons to transfer from the sample to the electrode, in other words, the more difficult it is to oxidize.

If a dye having a low oxidation potential is used, polymerization is greatly inhibited by the dye, and the curability is degraded. When a dye having a noble oxidation potential is used, there is hardly any inhibition of polymerization.

The colorant that can be used in the present invention is preferably added to the ink composition or the inkjet recording ink composition of the present invention and then dispersed in the ink to an appropriate degree. For dispersion of the colorant, for example, a dispersing machine such as a ball mill, a sand mill, an attritor, a roll mill, an agitator, a Henschel mixer, a colloidal mill, an ultrasonic homogenizer, a pearl mill, a wet type jet mill, or a paint shaker may be used.

When carrying out dispersion of the colorant, a dispersant may be added. The type of dispersant is not particularly limited, but it is preferable to use a polymeric dispersant, and examples of the polymeric dispersant include the Solsperse series manufactured by Avecia. Furthermore, as a dispersion adjuvant, it is also possible to use a synergist, according to the various types of pigment. In the present invention, the dispersant and dispersion adjuvant are preferably added at 1 to 50 parts by weight relative to 100 parts by weight of the pigment.

The colorant may be added directly to the ink composition of the present invention, but in order to improve dispersibility it may be added in advance to a solvent or a dispersing medium such as a polymerizable compound used in the present invention. In the present invention, in order to avoid the problem of the solvent resistance being degraded when the solvent remains in the cured image and the VOC (Volatile Organic Compound) problem of the residual solvent, it is preferable to add the colorant to a polymerizable compound. As a polymerizable compound used, it is preferable in terms of dispersion suitability to select a monomer having the lowest viscosity.

In the present invention, it is preferable for the average particle size of the colorant to be in the range of 0.005 to 0.5 µm, more preferably 0.01 to 0.45 µm, and yet more preferably, 0.015 to 0.3 µm. Furthermore, it is preferable for the maximum particle size of the colorant to be 0.3 to 10 µm, and more preferably 0.3 to 3 µm. It is preferable, in order to make the maximum particle size of the pigment particles be in the above-mentioned range, that the colorant, the dispersant, and the dispersing medium are selected, and dispersion conditions and filtration conditions are set. By such control of particle size, clogging of a head nozzle can be suppressed, and the ink storage stability, the ink transparency, and the curing sensitivity can be maintained, which is preferable.

(e) Cosensitizer

The ink composition of the present invention preferably comprises a cosensitizer. In the present invention, the cosensitizer has the function of further improving the sensitivity of the sensitizing dye to actinic radiation or the function of suppressing inhibition by oxygen of polymerization of a polymerizable compound, etc.

Examples of such a cosensitizer include amines such as compounds described in M. R. Sander et al., 'Journal of Polymer Society', Vol. 10, p. 3173 (1972), JP-B-44-20189, JP-A-51-82102, JP-A-52-134692, JP-A-59-138205, JP-A-60-84305, JP-A-62-18537, JP-A-64-33104, and Research Disclosure No. 33825, and specific examples thereof include triethanolamine, ethyl p-dimethylaminobenzoate, p-formyldimethylaniline, and p-methylthiodimethylaniline.

Other examples of the cosensitizer include thiols and sulfides such as thiol compounds described in JP-A-53-702, JP-B-55-500806, and JP-A-5-142772, and disulfide compounds of JP-A-56-75643, and specific examples thereof include 2-mercaptobenzothiazole, 2-mercaptobenzoxazole, 2-mercaptobenzimidazole, 2-mercapto-4(3H)-quinazoline, and mercaptonaphthalene.

Yet other examples of the cosensitizer include amino acid compounds (e.g. N-phenylglycine, etc.), organometallic compounds described in JP-B-48-42965 (e.g. tributyltin acetate, etc.), hydrogen-donating compounds described in JP-B-55-34414, sulfur compounds described in JP-A-6-308727 (e.g. trithiane, etc.), and phosphorus compounds described in JP-A-6-250387 (diethylphosphite, etc.).

(f) Other Components

The ink composition of the present invention may comprise other components as necessary. Examples of the other components include basic compounds, polymerization inhibitors, solvents, and cationically polymerizable monomers.

It is preferable to add the basic compound from the viewpoint of improving the storage stability of the ink composition. As the basic compound that can be used in the present invention, a known basic compound may be used and, for example, a basic inorganic compound such as an inorganic salt or a basic organic compound such as an amine is preferably used.

It is preferable to add the polymerization inhibitor from the viewpoint of enhancing the storage stability. When the ink composition of the present invention is used as an inkjet recording ink composition, it is preferably heated in the range of 40° C. to 80° C. to thus make it less viscous and then discharged, and in order to prevent clogging of a head due to thermal polymerization it is preferable to add a polymerization inhibitor. The polymerization inhibitor is preferably added at 200 to 20,000 ppm relative to the total amount of the ink composition of the present invention. Examples of the polymerization inhibitor include hydroquinone, benzoquinone, p-methoxyphenol, TEMPO, TEMPOL, and Al cupferron.

While taking into consideration the ink composition and the inkjet recording ink composition of the present invention being radiation curing type ink compositions, it is preferable for them not to contain any solvent so that the ink compositions can react quickly and be cured immediately after landing. However, as long as the curing speed, etc. of the ink composition is not affected, a specified solvent may be added. In the present invention, as a solvent, an organic solvent or water may be used. In particular, the organic solvent may be added in order to improve the adhesion to a recording medium (a support such as paper). Adding an organic solvent having a high boiling point is effective since the problem with VOC can be avoided. The amount of organic solvent is preferably 0.1 to 5 wt % relative to the total amount of the ink composition of the present invention, and more preferably 0.1 to 3 wt %.

As means for preventing the sensitivity from being degraded by a light blocking effect of the coloring agent, which may be added to the ink composition, a combination of a cationically polymerizable compound and a cationic polymerization initiator, a combination of a radically polymerizable compound and a radical polymerization initiator, or a radical/cationic hybrid curing ink combining a polymerizable compound and a polymerization initiator may be employed.

In addition to the above, the ink composition of the present invention may contain a known compound as necessary. Examples thereof include a surfactant (cationic, anionic, nonionic, fluorine-based, silicon-based), a leveling additive, a matting agent and, for adjusting film physical properties, a polyester resin, polyurethane resin, vinyl resin, acrylic resin, rubber resin, or wax, which may be appropriately selected and added. Furthermore, in order to improve the adhesion to a recording medium such as a polyolefin or PET, a tackifier that does not inhibit polymerization is preferably added. Specific examples of the tackifier include high molecular weight tacky polymers described on pp. 5 and 6 of JP-A-2001-49200 (e.g. a copolymer formed from an ester of (meth)acrylic acid and an alcohol having an alkyl group with 1 to 20 carbons, an ester of (meth)acrylic acid and an alicyclic alcohol having 3 to 14 carbons, or an ester of (meth)acrylic acid and an aromatic alcohol having 6 to 14 carbons), and a low molecular weight tackifying resin having a polymerizable unsaturated bond.

(2) Properties of Ink Composition

The ink composition of the present invention comprises as described above a condensed polycyclic aromatic compound, a polymerization initiator, and a cationically polymerizable compound, and as necessary a colorant. With regard to these components, relative to the total solids content of the ink composition, a condensed polycyclic aromatic compound is preferably 0.01 to 10 wt %, and more preferably 0.1 to 5 wt %, a polymerization initiator is preferably 0.01 to 30 wt %, and more preferably 0.1 to 20 wt %, a cationically polymerizable compound is preferably 1 to 97 wt %, and more preferably 30 to 95 wt %, and the colorant is preferably 1 to 10 wt %, and more preferably 2 to 8 wt %, and the total wt % including other optional components becomes 100 wt %.

When the ink composition thus obtained is used for inkjet recording, while taking into consideration dischargability, the viscosity of the ink composition at the discharge temperature (e.g. 25° C. to 80° C., preferably 25° C. to 40° C., and more preferably 25° C. to 30° C.) is preferably 5 to 30 mPa·s, and more preferably 7 to 15 mPa·s. For example, the ink composition of the present invention has a viscosity at room temperature (25° C. to 30° C.) of preferably 8 to 300 mPa·s, and more preferably 10 to 100 mPa·s. With regard to the ink composition of the present invention, it is preferable that its component ratio is appropriately adjusted so that the viscosity is in the above-mentioned range. When the viscosity at room temperature is set to be high, even when a porous recording medium is used, penetration of the ink into the recording medium can be prevented, uncured monomer can be reduced, and the odor can be reduced. Furthermore, ink spreading when ink droplets have landed can be suppressed, and as a result there is the advantage that the image quality is improved. When the viscosity at room temperature is set to be low, since it is unnecessary to heat the ink when discharging or it is possible to set the heating temperature at a relatively low temperature, there are the advantages that the load on inkjet equipment becomes small and the choice of inkjet heads that can be used is widened.

The surface tension of the ink composition of the present invention is preferably 20 to 30 mN/m, and yet more preferably 23 to 28 mN/m. When recording is carried out on various types of recording medium such as polyolefin, PET, coated paper, and uncoated paper, from the viewpoint of spread and penetration, it is preferably at least 20 mN/m, and from the viewpoint of wettability it is preferably not more than 30 mN/m.

(3) Inkjet Recording Method and Equipment

The ink composition of the present invention is preferably used for inkjet recording.

An inkjet recording method that can be suitably employed in the present invention is explained below.

(3-1) Inkjet Recording Method

The present invention provides a method for forming an image by discharging the above-mentioned ink composition onto a recording medium (support, recording material, etc.) and curing the ink composition by irradiating the ink composition so discharged onto the recording medium with actinic radiation. That is, the present invention relates to an inkjet recording method comprising:
(a') a step of discharging an ink composition onto a recording medium; and
(b') a step of curing the ink composition by irradiating the ink composition so discharged with actinic radiation,
wherein the ink composition is the ink composition of the present invention.

The cured ink composition forms an image on the recording medium.

The peak wavelength of the actinic radiation is preferably 200 to 600 nm, more preferably 300 to 450 nm, and yet more preferably 350 to 420 nm. The output of the actinic radiation is preferably no greater than 2,000 mJ/cm$^2$, and is more preferably 10 to 2,000 mJ/cm$^2$, yet more preferably 20 to 1,000 mJ/cm$^2$, and particularly preferably 50 to 800 mJ/cm$^2$.

The inkjet recording method of the present invention is explained by taking as an example a process for producing a lithographic printing plate, the process comprising discharging an ink composition onto the lithographic printing plate so as to form an image.

A process for producing a lithographic printing plate of the present invention comprises:
(a") a step of discharging the ink composition of the present invention onto a hydrophilic support, and
(b") a step of irradiating the discharged ink composition with radiation so as to cure the ink composition, thus forming a hydrophobic image on the hydrophilic support by curing the ink composition.

(3-1-1) Hydrophilic support used for lithographic printing plate

The lithographic printing plate comprises a support and an image formed on the support.

Conventionally, as the lithographic printing plate, a so-called PS plate in which an oleophilic photosensitive resin layer is provided on a hydrophilic support has been widely used. In a process for producing this PS plate, normally, after a mask exposure (surface exposure) is carried out via a lith film, non-exposed areas are dissolved and removed to give a desired printing plate. However, in recent years, a technique of digitizing image information using a computer by electronically processing, storing, and outputting the information has become widespread, and a new image output system that can be used for the above technique has been desired. In particular, a computer to plate (CTP) technique in which a printing plate is directly produced by scanning according to digitized image information with highly coherent light such as laser light without using a lith film has been developed.

As a system for obtaining a lithographic printing plate that makes possible the above scanning exposure, a process for directly producing a lithographic printing plate using an ink composition or an inkjet recording ink composition can be cited. This process involves obtaining a printing plate having a desired image (preferably a hydrophobic image) by discharging an ink onto a support, and preferably a hydrophilic support, using an inkjet system, etc., and exposing this to actinic radiation so as to expose an area with the ink composition or the inkjet recording ink to light. The ink composition or the inkjet recording ink suitable for such a system is the ink composition or the inkjet recording ink of the present invention.

The support (recording medium) onto which the ink composition or the inkjet recording ink composition of the present invention is discharged is not particularly limited, and a dimensionally stable sheet-form support may be used. The support is preferably a hydrophilic support. The support used in the lithographic printing plate of the present invention is not particularly limited, and a dimensionally stable sheet-form support may be used. It is preferable that a material forming the support has a hydrophilic surface. Examples of materials forming the support include paper, paper laminated with a plastic (e.g. polyethylene, polypropylene, polystyrene, etc.), a metal sheet (e.g. aluminum, zinc, copper, etc.), a plastic film (e.g. cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or plastic film on which the above-mentioned metal is laminated or vapor-deposited. Preferred examples of the support include a polyester film and aluminum sheet. Among these, aluminum sheet is particularly preferable since the dimensional stability is good and it is relatively inexpensive.

The aluminum sheet is a pure aluminum sheet, an alloy sheet containing aluminum as a main component and a small amount of a different element, or a thin film of aluminum or an aluminum alloy laminated with a plastic. Examples of the different element contained in the aluminum alloy include silicon, iron, manganese, copper, magnesium, chromium, zinc, bismuth, nickel, and titanium. The content of the different element in the alloy is preferably equal to or less than 10 wt %. In the present invention, a pure aluminum sheet is preferable, but since it is difficult to produce completely pure aluminum because of the refining technique, a trace amount of a different element may be contained. The composition of the aluminum sheet is not specified, and a known generally used material may be utilized as appropriate.

The support preferably has a thickness of 0.1 to 0.6 mm, and more preferably 0.15 to 0.4 mm.

Prior to the aluminum sheet being used, it is preferably subjected to a surface treatment such as a surface roughening treatment or an anodizing treatment. Surface treatment makes it easy to improve the hydrophilicity and ensure that there is good adhesion between an image recording layer and the support. Prior to the aluminum sheet being subjected to the surface roughening treatment, it may be subjected as desired to a degreasing treatment using a surfactant, an organic solvent, an aqueous alkaline solution, etc. in order to remove rolling oil on the surface.

The surface roughening treatment for the aluminum sheet surface may be carried out by various types of methods, and examples thereof include a mechanical surface roughening treatment, an electrochemical surface roughening treatment (a surface roughening treatment involving dissolving the surface electrochemically), and a chemical surface roughening treatment (a surface roughening treatment involving selectively dissolving the surface chemically).

As a method for the mechanical surface roughening treatment, a known method such as a ball grinding method, a brush grinding method, a blast grinding method, or a buff grinding method may be used. It is also possible to use a transfer method in which an irregular shape is transferred using a roller provided with irregularities in an aluminum rolling stage.

As a method for the electrochemical surface roughening treatment, for example, a method in which alternating current or direct current is applied in an electrolyte solution containing an acid such as hydrochloric acid or nitric acid can be cited. It is also possible to employ a method as described in JP-A-54-63902 in which a mixed acid is used.

The aluminum sheet subjected to a surface roughening treatment is subjected as necessary to an alkali etching treatment using an aqueous solution of potassium hydroxide, sodium hydroxide, etc.; furthermore, after neutralization, it may be subjected to an anodizing treatment as desired in order to improve the abrasion resistance.

As an electrolyte that may be used for the anodizing treatment of the aluminum sheet, various types of electrolytes that form a porous oxide film may be used. In general, sulfuric acid, hydrochloric acid, oxalic acid, chromic acid, or a mixed acid thereof may be used. The concentration of the electrolyte may be determined as appropriate according to the type of electrolyte.

Conditions for the anodizing treatment depend on the type of electrolyte used and cannot be specified, but in general the electrolyte solution concentration is 1 to 80 wt %, the solution temperature is 5° C. to 70° C., the current density is 5 to 60 A/dm$^2$, the voltage is 1 to 100V, and the electrolysis time is 10 sec. to 5 min. The amount of anodized film formed is preferably 1.0 to 5.0 g/m$^2$, and more preferably 1.5 to 4.0 g/m$^2$. It is preferable for it to be in this range since good plate life and good scratch resistance of a non-image area of a lithographic printing plate can be obtained.

As the support that can be used in the present invention, a substrate that has been subjected to the above-mentioned surface treatment and has an anodized film may be used as it is, but in order to further improve the adhesion to an upper layer, and the hydrophilicity, the contamination resistance, the thermal insulation, etc., the substrate may appropriately be subjected as necessary to a treatment for enlarging micropores of the anodized film, a sealing treatment, or a surface hydrophilization treatment involving immersion in an aqueous solution containing a hydrophilic compound, which are described in JP-A-2001-253181 or JP-A-2001-322365. These enlarging and sealing treatments are not limited to those described therein, and any conventionally known methods may be employed.

Sealing Treatment

The sealing treatment may be vapor sealing, a treatment with an aqueous solution containing an inorganic fluorine compound such as a single treatment with fluorozirconic acid or a treatment with sodium fluoride, vapor sealing with added lithium chloride, or a sealing treatment with hot water.

Among these, the sealing treatment with an aqueous solution containing an inorganic fluorine compound, the sealing treatment with vapor, and the sealing treatment with hot water are preferable. Each thereof is explained below.

<Sealing Treatment with Aqueous Solution Containing Inorganic Fluorine Compound>

In the sealing treatment with an aqueous solution containing an inorganic fluorine compound, a metal fluoride can suitably be used as the inorganic fluorine compound.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid, and ammonium fluorophosphate. Among them, sodium fluorozirconate, sodium fluorotitanate, fluorozirconic acid, and fluorotitanic acid are preferable.

The concentration of the inorganic fluorine compound in the aqueous solution is preferably at least 0.01 wt % from the viewpoint of sealing of micropores on an anodized coating being carried out sufficiently, and more preferably at least 0.05 wt %, and it is preferably no greater than 1 wt % from the viewpoint of contamination resistance, and more preferably no greater than 0.5 wt %.

The aqueous solution containing an inorganic fluorine compound preferably further contains a phosphate compound. It is preferable for a phosphate compound to be contained since the hydrophilicity of the surface of the anodized coating improves and the machine developability and the contamination resistance can be improved.

Preferred examples of the phosphate compound include phosphates of a metal such as an alkali metal or an alkaline earth metal.

Specific examples thereof include zinc phosphate, aluminum phosphate, ammonium phosphate, diammonium hydrogenphosphate, ammonium dihydrogenphosphate, potassium dihydrogenphosphate, dipotassium hydrogenphosphate, calcium phosphate, ammonium sodium hydrogenphosphate, magnesium hydrogenphosphate, magnesium phosphate, ferrous phosphate, ferric phosphate, sodium dihydrogenphosphate, sodium phosphate, disodium hydrogenphosphate, lead phosphate, diammonium phosphate, calcium dihydrogenphosphate, lithium phosphate, phosphotungstic acid, ammonium phosphotungstate, sodium phosphotungstate, ammonium phosphomolybdate, sodium phosphomolybdate, sodium phosphite, sodium tripolyphosphate, and sodium pyrophosphate. Among these, sodium dihydrogenphosphate, disodium hydrogenphosphate, potassium dihydrogenphosphate, and dipotassium hydrogenphosphate are preferable.

The combination of the inorganic fluorine compound and the phosphate compound is not particularly limited, but the aqueous solution preferably comprises at least sodium fluorozirconate as the inorganic fluorine compound and at least sodium dihydrogen phosphate as the phosphate compound.

The concentration of the phosphate compound in the aqueous solution is preferably at least 0.01 wt % from the viewpoint of improving machine developability and contamination resistance, and more preferably at least 0.1 wt %, and it is preferably no greater than 20 wt % from the viewpoint of solubility, and more preferably no greater than 5 wt %.

The proportion of each compound in the aqueous solution is not particularly limited, but the ratio by weight of the inorganic fluorine compound and the phosphate compound is preferably 1/200 to 10/1, and more preferably 1/30 to 2/1.

Furthermore, the temperature of the aqueous solution is preferably at least 20° C., and more preferably at least 40° C., and it is preferably no higher than 100° C., and more preferably no higher than 80° C.

Moreover, the pH of the aqueous solution is preferably at least 1, and more preferably at least 2, and it is preferably no greater than 11, and more preferably no greater than 5.

A method for the sealing treatment with the aqueous solution containing an inorganic fluorine compound is not particularly limited and, for example, an immersion method and a spray method may be used. They may be employed once or a plurality of times, or in a combination of two or more types.

Among these, the immersion method is preferable. When the treatment is carried out by the immersion method, the treatment time is preferably at least 1 sec., and more preferably at least 3 sec., and it is preferably no greater than 100 sec., and more preferably no greater than 20 sec.

<Sealing Treatment with Steam>

With regard to the sealing treatment with steam, for example, a method in which an anodized coating is contacted with steam at high pressure or normal pressure continuously or discontinuously can be cited.

The temperature of the steam is preferably at least 80° C., and more preferably at least 95° C., and it is preferably no greater than 105° C.

The pressure of the steam is preferably in the range of (atmospheric pressure−50 mmAq) to (atmospheric pressure+300 mmAq) ($1.008 \times 10^5$ to $1.043 \times 10^5$ Pa).

Furthermore, the time for which the coating is contacted with steam is preferably at least 1 sec., and more preferably at least 3 sec., and it is preferably no greater than 100 sec., and more preferably no greater than 20 sec.

<Sealing Treatment with Hot Water>

With regard to the sealing treatment with hot water, for example, a method in which an aluminum plate having an anodized coating formed thereon is immersed in hot water can be cited.

The hot water may contain an inorganic salt (e.g. a phosphate) or an organic salt.

The temperature of the hot water is preferably at least 80° C., and more preferably at least 95° C., and it is preferably no greater than 100° C.

Furthermore, the time for which immersion in hot water is carried out is preferably at least 1 sec., and more preferably at least 3 sec., and it is preferably no greater than 100 sec., and more preferably no greater than 20 sec.

With regard to a hydrophilization treatment that is used in the present invention, there is an alkali metal silicate method, as disclosed in U.S. Pat. Nos. 2,714,066, 3,181,461, 3,280,734, and 3,902,734. In this method, a support is immersed in an aqueous solution of sodium silicate, etc., or subjected to electrolysis. In addition, there is a method in which a support is treated with potassium fluorozirconate, as described in JP-B-36-22063, and a method in which a support is treated with polyvinylphosphonic acid, as described in UP Pat. Nos. 3,276,868, 4,153,461, and 4,689,272.

In the present invention, it is preferable for the support to have a center line average roughness of 0.10 to 1.2 µm. It is preferable for it to be in this range since good adhesion to an image recording layer, good plate life, and good contamination resistance can be obtained.

(3-1-2) Step of Discharging Ink Composition onto Hydrophilic Support

When the ink composition or the inkjet recording ink composition of the present invention is discharged onto the surface of the above-mentioned hydrophilic support, the ink composition or the inkjet recording ink composition is preferably discharged after being heated to preferably 40° C. to 80° C., and more preferably 25° C. to 30° C., so as to reduce the viscosity of the ink composition to preferably 7 to 30 mPa·s, and more preferably 7 to 20 mPa·s. In particular, it is preferable to use the ink composition having an ink viscosity at 25° C. of 35 to 500 mPa·s since a large effect can be obtained. By employing this method, high discharge stability can be realized. The radiation curing type ink composition such as the ink composition of the present invention generally has a viscosity that is higher than that of a normal ink composition or a water-based ink used for an inkjet recording ink, and variation in viscosity due to a change in temperature at the time of discharge is large. Viscosity variation in the ink has a large effect on changes in liquid droplet size and changes in liquid droplet discharge speed and, consequently, causes the image quality to be degraded. It is therefore necessary to maintain the ink discharge temperature as constant as possible. In the present invention, the control range for the temperature is desirably ±5° C. of a set temperature, preferably ±2° C. of the set temperature, and more preferably ±1° C. of the set temperature.

(3-1-3) Step of Curing Ink Composition by Irradiating Discharged Ink Composition with Actinic Radiation so as to form Hydrophobic Image on Hydrophilic Support by Curing Ink Composition The ink composition discharged onto the surface of the hydrophilic support is cured by irradiating with actinic radiation. This results from a sensitizing dye in a polymerization initiation system contained in the above-mentioned ink composition of the present invention absorbing actinic radiation, attaining an excited state, and coming into contact with a polymerization initiator in the polymerization initiation system to thus decompose the polymerization initiator, and a polymerizable compound undergoing radical polymerization and being cured.

The actinic radiation used in this process may include α rays, γ rays, an electron beam, X rays, UV rays, visible light, and IR rays. Although it depends on the absorption characteristics of the sensitizing dye, the peak wavelength of the actinic radiation is, for example, 200 to 600 nm, preferably 300 to 450 nm, and more preferably 350 to 450 nm. Furthermore, in the present invention, the polymerization initiation system has sufficient sensitivity for low output actinic radiation. The output of the actinic radiation as irradiation energy is therefore, for example, 2,000 mJ/cm$^2$ or less, and is preferably 10 to 2,000 mJ/cm$^2$, more preferably 20 to 1,000 mJ/cm$^2$, and yet more preferably 50 to 800 mJ/cm$^2$. Moreover, the actinic radiation is applied so that the illumination intensity on the exposed surface is, for example, 10 to 2,000 mW/cm$^2$, and preferably 20 to 1,000 mW/cm$^2$.

The ink composition of the present invention is desirably exposed to such actinic radiation for, for example, 0.01 to 120 sec., and preferably 0.1 to 90 sec.

Irradiation conditions and a basic method for irradiation with actinic radiation are disclosed in JP-A-60-132767. Specifically, a light source is provided on either side of a head unit that includes an ink discharge device, and the head unit and the light source are made to scan by a so-called shuttle system. Irradiation with actinic radiation is carried out after a certain time (e.g. 0.01 to 0.5 sec., preferably 0.01 to 0.3 sec., and more preferably 0.01 to 0.15 sec.) has elapsed from when the ink has landed. By controlling the time from ink landing to irradiation so as to be a minimum in this way, it becomes possible to prevent, the ink that has landed on a recording medium from spreading before being cured. Furthermore, since the ink can be exposed before it reaches a deep area of a porous recording medium that the light source cannot reach, it is possible to prevent monomer from remaining unreacted, and as a result the odor can be reduced.

Furthermore, curing may be completed using another light source that is not driven. WO99/54415 discloses, as an irradiation method, a method employing an optical fiber and a method in which a collimated light source is incident on a mirror surface provided on a head unit side face, and a recorded area is irradiated with UV light.

By employing such a recording method, it is possible to maintain a uniform dot diameter for landed ink even for various types of recording media having different surface wettability, thereby improving the image quality. In order to obtain a color image, it is preferable to superimpose colors in order from those with a low lightness. By superimposing inks in order from one with low lightness, it is easy for radiation to reach a lower ink, the curing sensitivity is good, the amount of residual monomer decreases, odor is reduced, and an improvement in adhesion can be expected. Furthermore, although it is possible to discharge all colors and then expose them at the same time, it is preferable to expose one color at a time from the viewpoint of promoting curing.

In this way, the above-mentioned ink composition of the present invention is cured by irradiation with actinic radiation to thus form a hydrophobic image on the surface of the hydrophilic support.

(3-2) Inkjet Recording Device

The inkjet recording device used in the present invention is not particularly restricted, and a commercial inkjet recording device may be used. That is, in the present invention, recording on a recording medium may be carried out using a commercial inkjet recording device.

The inkjet recording device that can be used in the present invention is equipped with, for example, an ink supply system, a temperature sensor, and an actinic radiation source.

The ink supply comprises, for example, a main tank containing the ink composition of the present invention, a supply pipe, an ink supply tank immediately before an inkjet head, a filter, and a piezo system inkjet head. The piezo system inkjet head may be driven so as to discharge a multisize dot of 1 to 100 pL, and preferably 8 to 30 pL, at a resolution of 320×320 to 4,000×4,000 dpi, preferably 400×400 to 1,600×1,600 dpi, and more preferably 720×720 dpi. Here, dpi referred to in the present invention means the number of dots per 2.54 cm.

As described above, since it is desirable for the radiation curing type ink to be discharged at a constant temperature, a section from the ink supply tank to the inkjet head is thermally insulated and heated. A method of controlling temperature is not particularly limited, but it is preferable to provide, for example, temperature sensors at a plurality of pipe section positions, and control heating according to the ink flow rate and the temperature of the surroundings. The temperature sensors may be provided on the ink supply tank and in the vicinity of the inkjet head nozzle. Furthermore, the head unit that is to be heated is preferably thermally shielded or insulated so that the device main body is not influenced by the temperature of the outside air. In order to reduce the printer start-up time required for heating, or in order to reduce the thermal energy loss, it is preferable to thermally insulate the head unit from other sections and also to reduce the heat capacity of the entire heated unit.

As an actinic radiation source, a mercury lamp, a gas/solid laser, etc. are mainly used, and for UV photocuring inkjet a mercury lamp and a metal halide lamp are widely known. However, from the viewpoint of protection of the environment, there has recently been a strong desire for mercury not to be used, and replacement by a GaN semiconductor UV light emitting device is very useful from industrial and environmental viewpoints. Furthermore, LEDs (UV-LED) and LDs (UV-LD) have small dimensions, long life, high efficiency, and low cost, and their use as a photocuring inkjet light source can be expected.

Furthermore, light-emitting diodes (LED) and laser diodes (LD) may be used as the source of actinic radiation. In particular, when a UV ray source is needed, a UV-LED or a UV-LD may be used. For example, Nichia Corporation has marketed a violet LED having a wavelength of the main emission spectrum of between 365 nm and 420 nm. Furthermore, when a shorter wavelength is needed, U.S. Pat. No. 6,084,250 discloses an LED that can emit actinic radiation whose wavelength is centered between 300 nm and 370 nm. Furthermore, another violet LED is available, and irradiation can be carried out with radiation of a different UV bandwidth. The actinic radiation source particularly preferable in the present invention is a UV-LED, and a UV-LED having a peak wavelength at 350 to 420 nm is particularly preferable.

The maximum illumination intensity of the LED on a recording medium is preferably 10 to 2,000 mW/cm$^2$, more preferably 20 to 1,000 mW/cm$^2$, and particularly preferably 50 to 800 mJ/cm$^2$.

In accordance with the present invention, it is possible to provide an ink composition that cures with high sensitivity when exposed to radiation, can form a high quality image, has excellent adhesion to a recording medium, and has good storage stability, and an inkjet recording method employing the ink composition. In particular, a cationically polymerizable type ink composition is preferable from the viewpoint of sensitivity.

Furthermore, a printed material obtained using the ink composition having excellent storage stability, and being capable of curing with high sensitivity when exposed to ultraviolet rays has high image quality and excellent strength for an image area. Similarly, in accordance with use of the ink composition of the present invention, there is exhibited the effect that a lithographic printing plate having a long plate life and high image quality can be produced based on digital data.

EXAMPLES

The present invention is explained in further detail by reference to Examples and Comparative Examples. However, the present invention should not be construed as being limited to these Examples.

IRGACURE 907, IRGACURE 784, IRGACURE OXE01, IRGACURE 250, Darocur TPO (polymerization initiator), and Darocur ITX (sensitizer) used in the present invention are commercial products manufactured by Ciba Specialty Chemicals (CSC).

Furthermore, reagents that are used for synthesis of a compound and whose manufacturer is not specified are commercial products manufactured by Tokyo Chemical Industry Co., Ltd., Aldrich, etc.

Preparation of Pigment Dispersions

Yellow, magenta, cyan, and black pigment dispersions 1 were prepared in accordance with the methods described below. Dispersion conditions were appropriately adjusted using a known dispersing machine so that the average particle size of pigment particles was in the range of 0.2 to 0.3 μm, and they were subsequently filtered using a filter while heating.

Yellow Pigment Dispersion 1

| | |
|---|---|
| CI Pigment Yellow 13 | 20 parts by weight |
| Polymeric dispersant (Solsperse series manufactured by Zeneca) | 20 parts by weight |
| Diethylene glycol divinyl ether (manufactured by BASF) | 60 parts by weight |

Magenta Pigment Disoersion 1

| | |
|---|---|
| CI Pigment Red 57:1 | 20 parts by weight |
| Polymeric dispersant (Solsperse series manufactured by Zeneca) | 20 parts by weight |
| Diethylene glycol divinyl ether (manufactured by BASF) | 60 parts by weight |

Cyan Pigment Dispersion 1

| | |
|---|---|
| CI Pigment Blue 15:3 | 20 parts by weight |
| Polymeric dispersant (Solsperse series manufactured by Zeneca) | 20 parts by weight |
| Diethylene glycol divinyl ether (manufactured by BASF) | 60 parts by weight |

Black Pigment Dispersion 1

| | |
|---|---|
| CI Pigment black 7 | 20 parts by weight |
| Polymeric dispersant (Solsperse series manufactured by Zeneca) | 20 parts by weight |
| Diethylene glycol divinyl ether (manufactured by BASF) | 60 parts by weight |

Example 1-1

Preparation of Inks

Yellow Ink 1-1

| | |
|---|---|
| Yellow pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |

-continued

| | |
|---|---|
| Sensitizing dye A (1-I-26) below | 3 parts by weight |
| Polymerization inhibitor (cupferron Al, (manufactured by Wako Pure Chemical Industries, Ltd.)) | 1 part by weight |

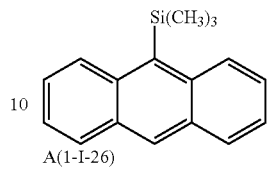

A(1-I-26)

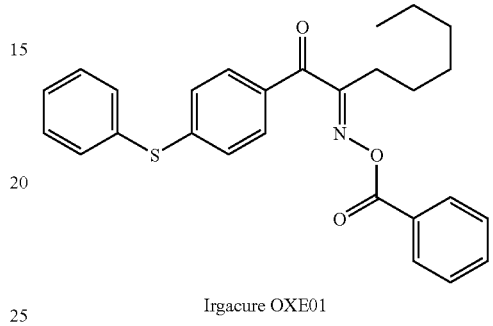

Irgacure OXE01

Magenta Ink 1-1

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Sensitizing dye A above | 3 parts by weight |
| Polymerization inhibitor (cupferron Al, (manufactured by Wako Pure Chemical Industries, Ltd.)) | 1 part by weight |

Cyan Ink 1-1

| | |
|---|---|
| Cyan pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Sensitizing dye A above | 3 parts by weight |
| Polymerization inhibitor (cupferron Al, (manufactured by Wako Pure Chemical Industries, Ltd.)) | 1 part by weight |

Black Ink 1-1

| | |
|---|---|
| Black pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Sensitizing dye A above | 3 parts by weight |
| Polymerization inhibitor (cupferron Al, (manufactured by Wako Pure Chemical Industries, Ltd.)) | 1 part by weight |

Inks 1-1 of each color prepared above were filtered using a filter having an absolute filtration accuracy of 2 μm to give Inks 1-1 of each color.

Inkjet Image Recording

Subsequently, recording was carried out on a recording medium using a commercial inkjet recording device having a piezo system inkjet nozzle. The ink supply system comprised a main tank, a supply pipe, an ink supply tank immediately before an inkjet head, a filter, and a piezo system inkjet head, and a section from the ink supply tank to the inkjet head was thermally insulated and heated. Temperature sensors were provided on the ink supply tank and in the vicinity of the nozzle of the inkjet head, and the temperature was controlled so that the nozzle section was always at 70° C.±2° C. The piezo system inkjet head was driven so as to discharge a multisize dot of 8 to 30 pL at a resolution of 720×720 dpi. The exposure system, the main scanning speed, and the discharge frequency were adjusted so that, after landing, UV light was focused to give an exposure area illumination intensity of 100 mW/cm$^2$, and irradiation started 0.1 sec. after the ink landed on the recording medium. Furthermore, the exposure time was made variable, and exposure energy was applied. Here, dpi referred to in the present invention denotes the number of dots per 2.54 cm.

The inks of each color prepared above were discharged in the order black, cyan, magenta, and yellow at an environmental temperature of 25° C., and each color was irradiated with UV rays using a VZero 085 metal halide lamp manufactured by Integration Technology so that the total exposure energy per color was 200 mJ/cm$^2$ for all the colors. As recording media, a grained aluminum support, a transparent biaxially stretched polypropylene film whose surface had been treated so as to impart printability, a soft vinyl chloride sheet, a cast coat paper, and a commercial recycled paper were used, each color image was recorded, and an image having high resolution without dot spreading was obtained in all cases. Furthermore, for high quality paper, the ink did not penetrate to the reverse side, the ink was sufficiently cured, and there was hardly any odor due to unreacted monomer. Moreover, the ink recorded on the film had sufficient flexibility, the ink did not crack when bent, and there was no problem in an adhesion test involving peeling with Sellotape (registered trademark).

Examples 1-2 to 8 and Comparative Examples 1-1 to 3

Image Formation by Radical Polymerization

Example 1-2

Magenta Ink 1-1

Magenta ink 1-1 prepared in Example 1-1 was used as Example 1-2.
Preparation of Inks
Magenta inks 1-2 to 10 were prepared in accordance with the methods described below.

Example 1-3

Magenta Ink 1-2

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Sensitizing dye B(1-I-1) below | 3 parts by weight |
| Polymerization inhibitor (cupferron Al, (manufactured by Wako Pure Chemical Industries, Ltd.)) | 1 part by weight |

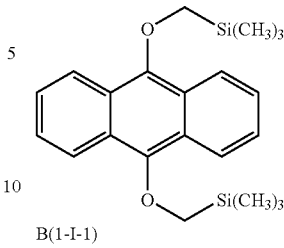

B(1-I-1)

Example 1-4

Magenta Ink 1-3

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Sensitizing dye C (1-I-8) below | 3 parts by weight |

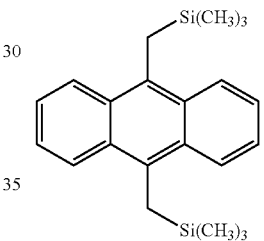

C(1-I-8)

Example 1-5

Magenta Ink 1-4

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Triazine polymerization initiator A below | 5 parts by weight |
| Sensitizing dye A above | 3 parts by weight |
| Polymerization inhibitor (cupferron Al, (manufactured by Wako Pure Chemical Industries, Ltd.)) | 1 part by weight |

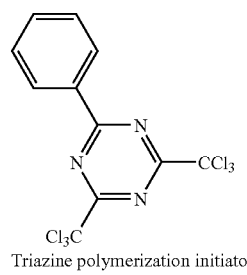

Triazine polymerization initiator A

Example 1-6

Magenta Ink 1-5

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator below (IRGACURE 907, manufactured by CSC) | 5 parts by weight |
| Sensitizing dye A above | 3 parts by weight |
| Polymerization inhibitor (cupferron Al, (manufactured by Wako Pure Chemical Industries, Ltd.)) | 1 part by weight |

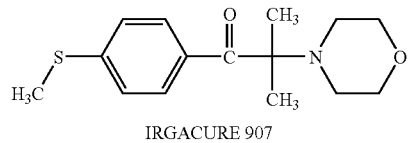

IRGACURE 907

Comparative Example 1-1

Magenta Ink 1-6

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| 9,10-Dibutoxyanthracene | 3 parts by weight |
| Polymerization inhibitor (cupferron Al, (manufactured by Wako Pure Chemical Industries, Ltd.)) | 1 part by weight |

Comparative Example 1-2

Magenta Ink 1-7

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| 9,10-Dimethylanthracene | 3 parts by weight |
| Polymerization inhibitor (cupferron Al, (manufactured by Wako Pure Chemical Industries, Ltd.)) | 1 part by weight |

Magenta inks 1-2 to 7 prepared above were filtered using a filter having an absolute filtration accuracy of 2 μm to give mangenta inks 1-2 or 7.

Example 1-7

Magenta Ink 1-9

Magenta ink 1-9 was prepared in the same manner as for magenta ink 1-1 except that Compound M-1 below (oxidation potential +1.37 V) was used as an oil-soluble dye instead of magenta pigment dispersion 1, and filtration was carried out using a filter having an absolute filtration accuracy of 2 μm.

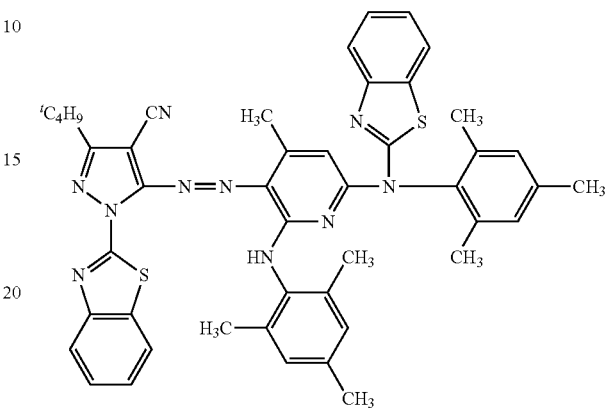

M-1

Example 1-8

Magenta Ink 1-10

Magenta ink 1-10 was prepared in the same manner as for magenta ink 1-1 except that Compound M-2 below (oxidation potential +0.94V) was used as an oil-soluble dye instead of magenta pigment dispersion 1, and filtration was carried out using a filter having an absolute filtration accuracy of 2 μm.

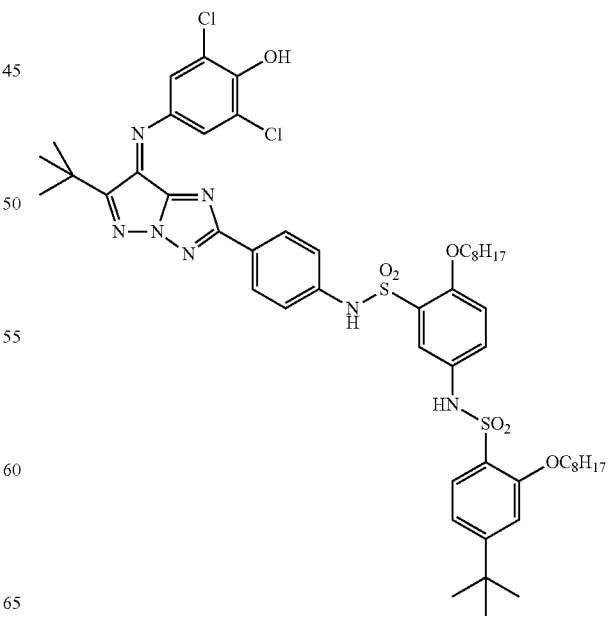

M-2

Inkjet Image Recording

Images of each color were produced by the same method as in Example 1-1 using the magenta inks 1-2 to 10 prepared as above.

Evaluation of Inkjet Image

The images thus formed were subjected to evaluation in accordance with the methods described below in terms of sensitivity required for curing, penetration into commercial recycled paper, ink spreading on a grained aluminum support, adhesion, plate life, and storage stability.

Curing Sensitivity Measurement

The exposure energy intensity (mJ/cm$^2$) when a feeling of tackiness disappeared on the image surface after irradiation with ultraviolet rays was defined as the curing sensitivity. The smaller the value, the higher the sensitivity.

Evaluation of Penetration into Commercial Recycled Paper

Images printed on commercial recycled paper were evaluated in terms of penetration in accordance with the criteria below.

Good: Hardly any penetration, no odor of residual monomer.
Fair: Slight penetration, slight odor of residual monomer.
Poor: Ink obviously penetrated to the reverse side, and strong odor of residual monomer.

Evaluation of Ink Spread on Grained Aluminum Support

With respect to an image printed on a grained aluminum support, ink spread was evaluated in accordance with the criteria below.

Good: no spread between adjacent dots.
Fair: dots slightly spread.
Poor: dots spread and image was obviously blurred.

Evaluation of Adhesion to Grained Aluminum Support

With regard to the printed images formed above, a completely undamaged sample and a sample whose printed surface was crosshatched with 11 cuts in both lengthwise and widthwise directions at intervals of 1 mm in accordance with JIS K 5400 to give 100 1 mm squares were prepared, Sellotape was affixed to the printed surface of each sample and peeled off quickly at an angle of 90 degrees, and the condition of the remaining printed image or squares that had not been peeled off was evaluated in accordance with the criteria below.

Good: printed image was not peeled off at all in the crosshatch test.
Fair: the ink was slightly peeled off in the crosshatch test, but unless the ink surface was damaged little was peeled off.
Poor: easily peeled off by Sellotape under both conditions.

Evaluation of Plate Life

An image printed on a grained aluminum support prepared above was used as a printing plate, printing was carried out using a Heidel KOR-D machine, and a relative comparison of the number of prints completed was used as an index for the plate life (the number obtained for Example 1-2 was defined as 100). The larger the number, the longer the plate life, which is preferable.

Storage Stability Evaluation

After storing the prepared ink at 75% RH and 60° C. for 3 days, the ink viscosity at the discharge temperature was measured, and an increase in the ink viscosity was expressed as a viscosity ratio (after storage/before storage). When the viscosity was unchanged and the ratio was close to 1.0, the storage stability was good, and if the ratio exceeded 1.5, clogging might undesirably be caused during discharge.

These evaluation results are shown in Table 2.

TABLE 2

| Ex. | Ink No. | Curing sensitivity (mJ/cm$^2$) | Penetration | Ink spreading | Adhesion | Plate life | Storage stability |
|---|---|---|---|---|---|---|---|
| Ex. 1-2 | Magenta 1-1 | 200 | Good | Good | Good | 100 | 1.2 |
| Ex. 1-3 | Magenta 1-2 | 220 | Good | Good | Good | 80 | 1.2 |
| Ex. 1-4 | Magenta 1-3 | 200 | Good | Good | Good | 100 | 1.2 |
| Ex. 1-5 | Magenta 1-4 | 220 | Good | Good | Good | 80 | 1.2 |
| Ex. 1-6 | Magenta 1-5 | 230 | Good | Good | Good | 90 | 1.2 |
| Ex. 1-7 | Magenta 1-9 | 180 | Good | Good | Good | 120 | 1.2 |
| Ex. 1-8 | Magenta 1-10 | 160 | Good | Good | Good | 130 | 1.2 |
| Comp. Ex. 1-1 | Magenta 1-6 | 400 | Fair | Fair | Poor | 50 | 1.5 |
| Comp. | Magenta | 450 | Fair | Fair | Poor | 50 | 1.5 |

TABLE 2-continued

| Ex. | Ink No. | Curing sensitivity (mJ/cm$^2$) | Penetration | Ink spreading | Adhesion | Plate life | Storage stability |
|---|---|---|---|---|---|---|---|
| Ex. 1-2 | 1-7 | | | | | | |
| Comp. Ex. 1-3 | Magenta 1-8 | 400 | Fair | Fair | Poor | 50 | 1.5 |

Example 1-9

Preparation of Inks

Yellow Ink 1-2

| | |
|---|---|
| Yellow pigment dispersion 1 | 5 parts by weight |
| Initiator (UVI-6992, manufactured by The Dow Chemical Company) | 6 parts by weight |
| Sensitizing dye A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 (Amine-1 below) | 1 part by weight |

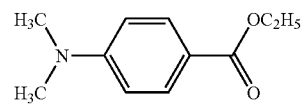

Amine-1
(Compound described in JP-A-2003-305839)

Magenta Ink 1-11

| | |
|---|---|
| Magenta pigment dispersion 1 | 5 parts by weight |
| Initiator (UVI-6992, manufactured by The Dow Chemical Company) | 6 parts by weight |
| Sensitizing dye A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Cyan Ink 1-2

| | |
|---|---|
| Cyan pigment dispersion 1 | 5 parts by weight |
| Initiator (UVI-6992, manufactured by The Dow Chemical Company) | 6 parts by weight |
| Sensitizing dye A above | 3 parts by weight |
| Polymerizable compounds | 40 parts by weight |
| Monomer: 3,4-epoxycyclohexylmethyl-3',4'-epoxycyclohexanecarboxylate (Celloxide 2021A: manufactured by Diacel-UCB Co., Ltd.) | |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Black Ink 1-2

| | |
|---|---|
| Black pigment dispersion 1 | 5 parts by weight |
| Initiator (UVI-6992, manufactured by The Dow Chemical Company) | 6 parts by weight |
| Sensitizing dye A above | 3 parts by weight |
| Polymerizable compounds | 40 parts by weight |
| Monomer: 3,4-epoxycyclohexylmethyl-3',4'-epoxycyclohexanecarboxylate (Celloxide 2021A: manufactured by Daicel-UCB Co., Ltd.) | |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Crude yellow ink 1-2, magenta ink 1-11, cyan ink 1-2, and black ink 1-2 prepared above were filtered using a filter having an absolute filtration accuracy of 2 μm to give yellow ink 1-2, magenta ink 1-11, cyan ink 1-2, and black ink 1-2.

In the same manner as in Example 1-1, yellow ink 1-2, magenta ink 1-11, cyan ink 1-2, and black ink 1-2 prepared above were discharged in the order black, cyan, magenta, and yellow at an environmental temperature of 25° C., and each color was irradiated with UV rays using a VZero 085 metal halide lamp manufactured by Integration Technology so that the total exposure energy per color was 100 mJ/cm$^2$ for all the colors. As recording media, a grained aluminum support, a transparent biaxially stretched polypropylene film whose surface had been treated so as to impart printability, a soft vinyl chloride sheet, a cast coat paper, and a commercial recycled paper were used, each color image was recorded, and an image having high resolution without dot spreading was obtained in all cases. Furthermore, for high quality paper, the ink did not penetrate to the reverse side, the ink was sufficiently cured, and there was hardly any odor due to unreacted monomer. Moreover, the ink recorded on the film had sufficient flexibility, the ink did not crack when bent, and there was no problem in an adhesion test involving peeling with Sellotape (registered trademark).

Examples 1-10 to 16 and Comparative Examples 1-4 to 6

Image Formation by Cationic Polymerization

Magenta ink 1-11 prepared in Example 1-9 was used as Example 1-10.
Preparation of Inks
Magenta inks 1-12 to 20 were prepared in accordance with the methods described below.

Example 1-11

Magenta Ink 1-12

Magenta ink 1-12 was prepared in the same manner as for magenta ink 1-11 except that sensitizing dye B above was used instead of sensitizing dye A.

Example 1-12

Magenta Ink 1-13

Magenta ink 1-13 was prepared in the same manner as for magenta ink 1-11 except that sensitizing dye C above was used instead of sensitizing dye A.

Example 1-13

Magenta Ink 1-14

Magenta ink 1-14 was prepared in the same manner as for magenta ink 1-11 except that IRGACURE 250 manufactured by CSC was used instead of the initiator (UVI-6992, manufactured by The Dow Chemical Company).

Example 1-14

Magenta Ink 1-15

Magenta ink 1-15 was prepared in the same manner as for magenta ink 1-11 except that sensitizing dye E (1-I-13) below was used instead of sensitizing dye A.

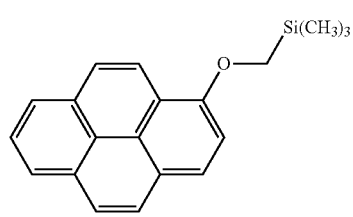

E(1-I-13)

Comparative Example 1-4

Magenta Ink 1-16

| | |
|---|---|
| Magenta pigment dispersion 1 | 5 parts by weight |
| Initiator (UVI-6992, manufactured by The Dow Chemical Company) | 6 parts by weight |
| Sensitizing dye: 9,10-dibutoxyanthracene | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Comparative Example 1-5

Magenta Ink 1-17

Magenta ink 1-17 was prepared in the same manner as for magenta ink 1-16 except that initiator (IRGACURE 250, manufactured by CSC) was used instead of the initiator (UVI-6992, manufactured by The Dow Chemical Company).

Comparative Example 1-6

Magenta Ink 18

Magenta ink 1-18 was prepared in the same manner as for magenta ink 1-16 except that Darocur ITX (manufactured by CSC) was used instead of 9,10-dibutoxyanthracene.

Crude magenta inks 1-12 to 18 prepared above were filtered using a filter having an absolute filtration accuracy of 2 μm to give magenta inks 1-12 to 18.

Example 1-15

Magenta Ink 1-19

Magenta ink 1-19 was prepared in the same manner as for magenta ink 1-11 except that Compound M-1 below (oxidation potential +1.37 V) was used as an oil-soluble dye instead of the magenta pigment dispersion, and filtration was carried out using a filter having an absolute filtration accuracy of 2 μm.

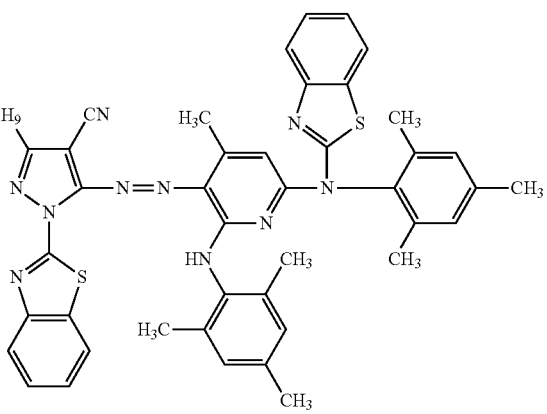

M-1

Example 1-16

Magenta Ink 1-20

Magenta ink 1-20 was prepared in the same manner as for magenta ink 1-11 except that Compound M-2 below (oxidation potential +0.94 V) was used as an oil-soluble dye instead of magenta pigment dispersion 1, and filtration was carried out using a filter having an absolute filtration accuracy of 2 μm.

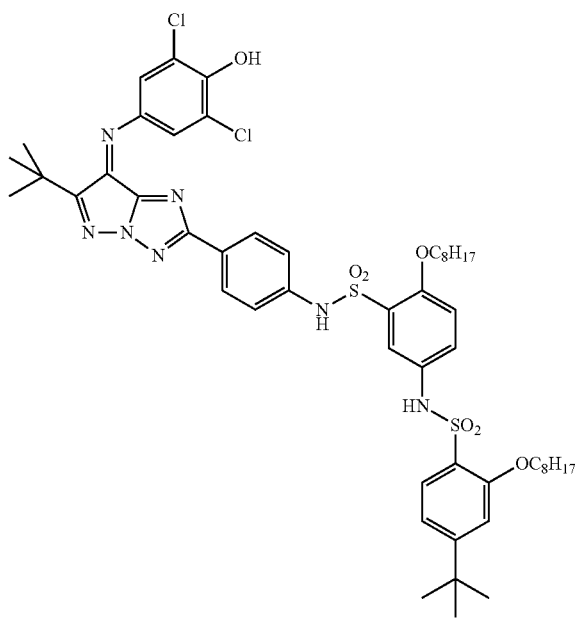

M-2

Inkjet Image Recording

Images of each color were produced in the same manner as in the method described in Example 1-9 using the magenta inks 1-11 to 20 prepared as above.

Evaluation of Inkjet Image

The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 1-2 was defined as 100.

These evaluation results are given in Table 3.

TABLE 3

| Ex. | Ink No. | Curing sensitivity (mJ/cm$^2$) | Penetration | Ink spreading | Adhesion | Plate life | Storage stability |
|---|---|---|---|---|---|---|---|
| Ex. 1-10 | Magenta 1-11 | 100 | Good | Good | Good | 200 | 1.2 |
| Ex. 1-11 | Magenta 1-12 | 110 | Good | Good | Good | 200 | 1.2 |
| Ex. 1-12 | Magenta 1-13 | 100 | Good | Good | Good | 200 | 1.2 |
| Ex. 1-13 | Magenta 1-14 | 100 | Good | Good | Good | 200 | 1.3 |
| Ex. 1-14 | Magenta 1-15 | 100 | Good | Good | Good | 200 | 1.2 |
| Ex. 1-15 | Magenta 1-19 | 90 | Good | Good | Good | 230 | 1.2 |
| Ex. 1-16 | Magenta 1-20 | 80 | Good | Good | Good | 240 | 1.2 |
| Comp. Ex. 1-4 | Magenta 1-16 | 300 | Fair | Fair | Poor | 70 | 1.5 |
| Comp. Ex. 1-5 | Magenta 1-17 | 300 | Fair | Fair | Poor | 70 | 1.7 |
| Comp. Ex. 1-6 | Magenta 1-18 | 350 | Fair | Fair | Poor | 70 | 1.5 |

It is clear from Table 2 and Table 3 that the ink composition of the present invention comprising a compound represented by Formula (1-I) has high sensitivity toward radiation, can form a high quality image in terms of image formation properties on paper, and has good storage stability, and even when applied to the production of a printing plate a high quality image with high plate life can be formed.

Examples 1-17 and 18 and Comparative Examples 1-7 and 8

Production of Image by Light Emitting Diode (LED)

Example 1-17

Inkjet image recording was carried out using Magenta ink 1-1 by the same method as in Example 1 except that a UV light-emitting diode (UV-LED) was used instead of the VZero 085 metal halide lamp manufactured by Integration Technology.

In this embodiment, an NCCU033 manufactured by Nichia Corporation was used as the UV-LED. The LED emits UV light at a wavelength of 365 nm from 1 chip, and by applying a current of about 500 mA, light of about 100 mW is emitted from the chip. A plurality thereof were aligned at intervals of 7 mm to give a power of 0.3 W/cm$^2$ on the surface of a recording medium (hereinafter, also called a medium). The time from landing to irradiation and the exposure time can be varied by the transport speed of the medium and the distance between a head and the LED in the transport direction. In this embodiment, irradiation was carried out about 0.5 sec. after landing.

The exposure energy on the medium was adjustable in the range of 0.01 to 15 J/cm² by setting the distance from the medium and the transport speed.

Example 1-18

Inkjet image recording was carried out in the same manner as in Example 1-17 except that Magenta ink 1-11 was used instead of Magenta ink 1-1.

Comparative Example 1-7

Inkjet image recording was carried out in the same manner as in Example 1-17 except that Magenta ink 1-6 was used instead of Magenta ink 1-1.

Comparative Example 1-8

Inkjet image recording was carried out in the same manner as in Example 1-17 except that Magenta ink 1-16 was used instead of Magenta ink 1-1.
Evaluation of Inkjet Image The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 1-2 was defined as 100.

These evaluation results are given in Table 4.

Example 1-19

Magenta ink 1-21 was prepared in the same manner as for Magenta ink 1-11 except that Initiator A below was used instead of the initiator (UVI-6992, manufactured by The Dow Chemical Company).

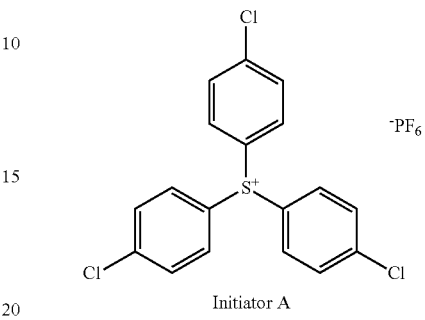

Initiator A

Initiator A above was synthesized by mixing a methanol solution of the bromide salt with an aqueous solution of KPF₆ salt in accordance with a method described in JP-A-2004-315430.

Inkjet Image Recording

Images of each color were produced in the same manner as in the method described in Example 1-9 using Magenta ink 1-21 prepared as above.

TABLE 4

| Ex. | Ink No. | Curing sensitivity (mJ/cm²) | Penetration | Ink spreading | Adhesion | Plate life | Storage stability |
|---|---|---|---|---|---|---|---|
| Ex. 1-17 | Magenta 1-1 | 180 | Good | Good | Good | 110 | 1.2 |
| Ex. 1-18 | Magenta 1-11 | 90 | Good | Good | Good | 220 | 1.2 |
| Comp. Ex. 1-7 | Magenta 1-6 | 500 | Fair | Fair | Poor | 70 | 1.5 |
| Comp. Ex. 1-8 | Magenta 1-16 | 300 | Fair | Fair | Poor | 50 | 1.5 |

It is clear from comparison of the cases shown in Table 2 and Table 3 in which the ultraviolet lamp was used with the case shown in Table 4 in which the UV light emitting diode was used that the use of the UV light emitting diode gave higher sensitivity toward radiation, and even when applied to the production of a printing plate an image with high plate life can be formed.

Evaluation of Inkjet Image

The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 1-2 was defined as 100.

These evaluation results are given in Table 5.

TABLE 5

| Ex. | Ink No. | Curing sensitivity (mJ/cm$^2$) | Penetration | Ink spreading | Adhesion | Plate life | Storage stability |
|---|---|---|---|---|---|---|---|
| Ex. 1-19 | Magenta 1-21 | 90 | Good | Good | Good | 230 | 1.2 |

Synthetic Example 2-1

Synthetic Example of Polyoxyanthracene Compound 2-A 2.5 g of anthrarufin (1,5-dihydroxyanthraquinone, manufactured by Aldrich), 3.2 g of potassium carbonate, and 7.4 g of iodomethane were added to 50 mL of dimethylacetamide and stirred at 80° C. for 12 hours. After being allowed to cool, 20 mL of a saturated aqueous solution of sodium hydrogen carbonate was added thereto, and crystals thus precipitated were filtered. Subsequently, the precipitate was washed with 20 mL of water twice and 20 mL of methanol once, and dried by means of a vacuum pump for 30 minutes, thus giving 2.4 g of Compound 2-X.

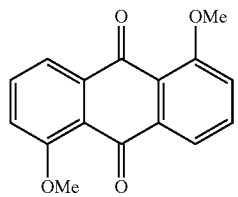

Compound 2-X 2.4 g of Compound 2-X was added to a solution of 20 mL of chloroform and 20 mL of distilled water, subsequently 6.6 g of sodium dithionite (Na$_2$S$_2$O$_4$) and 8.9 g of Adogen 464 (manufactured by Aldrich) were added thereto, and stirring was carried out under a flow of nitrogen at room temperature for 5 minutes. Subsequently, 7.5 g of sodium hydroxide was added thereto, and stirring was carried out under a flow of nitrogen at room temperature for 10 minutes. 16.5 g of butyl bromide and 100 mg of potassium iodide were further added, and stirring was carried out under a flow of nitrogen at room temperature for 12 hours. After the reaction, a precipitate was filtered off, purification was carried out by silica gel chromatography (ethyl acetate/hexane eluent), and concentration was carried out. A slurry was further washed with methanol, and then dried by means of a vacuum pump for 30 minutes, thus giving 1.5 g of Compound 2-A.

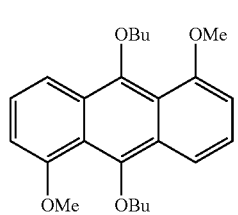

Compound 2-A (2-I-29)

Synthetic Example 2-2

1.3 g of Compound 2-B was synthesized in the same manner as in the synthetic method for polyoxyanthracene compound 2-A except that 2.5 g of anthraflavic acid (2,6-dihydroxyanthraquinone, manufactured by Aldrich) was used instead of 2.5 g of anthrarufin.

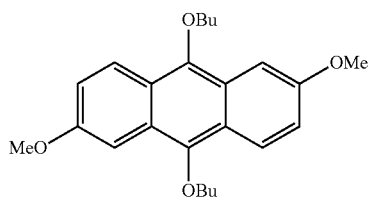

Compound 2-B (2-I-21)

Synthetic Example 2-3

1.1 g of Compound 2-C was synthesized in the same manner as in the synthetic method for polyoxyanthracene compound 2-A except that 2.5 g of alizarin (1,2-dihydroxyanthraquinone, manufactured by Aldrich) was used instead of 2.5 g of anthrarufin.

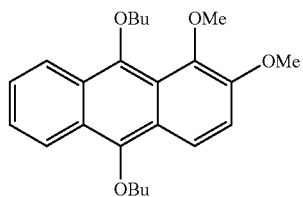

Compound 2-C (2-I-22)

Synthetic Example 2-4

1.6 g of Compound 2-D was synthesized in the same manner as in the synthetic method for polyoxyanthracene compound 2-A except that 15.3 g of benzyl bromide was used instead of 12.3 g of butyl bromide.

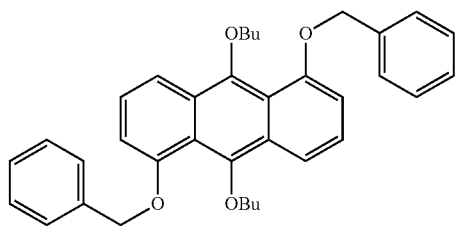

Compound 2-D (2-I-19)

Synthetic Example 2-5

1.3 g of Compound 2-E was synthesized in the same manner as in the synthetic method for polyoxyanthracene compound 2-A except that 2.7 g of purpurin (1,2,4-trihydroxyanthraquinone, manufactured by Aldrich) was used instead of 2.5 g of anthrarufin.

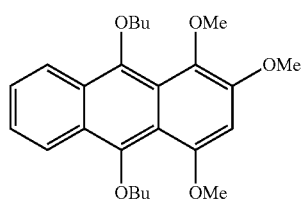

Compound 2-E (2-I-30)

Example 2-1

Preparation of Inks
Yellow Ink 2-1

| | |
|---|---|
| Yellow pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Compound 2-A above | 3 parts by weight |
| Polymerization inhibitor (cupferron Al, (manufactured by Wako Pure Chemical Industries, Ltd.)) | 1 part by weight |

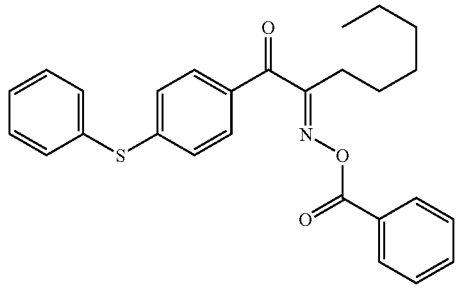

Irgacure OXE01

Magenta Ink 2-1

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Compound 2-A above | 3 parts by weight |
| Polymerization inhibitor (cupferron Al, (manufactured by Wako Pure Chemical Industries, Ltd.)) | 1 part by weight |

Cyan Ink 2-1

| | |
|---|---|
| Cyan pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Compound 2-A above | 3 parts by weight |
| Polymerization inhibitor (cupferron Al, (manufactured by Wako Pure Chemical Industries, Ltd.)) | 1 part by weight |

Black Ink 2-1

| | |
|---|---|
| Black pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Compound 2-A above | 3 parts by weight |
| Polymerization inhibitor (cupferron Al, (manufactured by Wako Pure Chemical Industries, Ltd.)) | 1 part by weight |

Inks 2-1 of each color prepared above were filtered using a filter having an absolute filtration accuracy of 2 μm to give Inks 2-1 of each color.

Inkjet Image Recording

Subsequently, recording was carried out on a recording medium using a commercial inkjet recording device having a piezo system inkjet nozzle. The ink supply system comprised a main tank, a supply pipe, an ink supply tank immediately before an inkjet head, a filter, and a piezo system inkjet head, and a section from the ink supply tank to the inkjet head was thermally insulated and heated. Temperature sensors were provided on the ink supply tank and in the vicinity of the nozzle of the inkjet head, and the temperature was controlled so that the nozzle section was always at 70° C.±2° C. The piezo system inkjet head was driven so as to discharge a multisize dot of 8 to 30 pL at a resolution of 720×720 dpi. The exposure system, the main scanning speed, and the discharge frequency were adjusted so that, after landing, UV light was focused to give an exposure area illumination intensity of 100 mW/cm$^2$, and irradiation started 0.1 sec. after the ink landed on the recording medium. Furthermore, the exposure time was made variable, and exposure energy was applied. Here, dpi referred to in the present invention denotes the number of dots per 2.54 cm.

The inks of each color prepared above were discharged in the order black, cyan, magenta, and yellow at an environmental temperature of 25° C., and each color was irradiated with UV rays using a VZero 085 metal halide lamp manufactured by Integration Technology so that the total exposure energy per color was 200 mJ/cm$^2$ for all the colors. As recording media, a grained aluminum support, a transparent biaxially stretched polypropylene film whose surface had been treated so as to impart printability, a soft vinyl chloride sheet, a cast coat paper, and a commercial recycled paper were used, each color image was recorded, and an image having high resolution without dot spreading was obtained in all cases. Furthermore, for high quality paper, the ink did not penetrate to the reverse side, the ink was sufficiently cured, and there was hardly any odor due to unreacted monomer. Moreover, the ink recorded on the film had sufficient flexibility, the ink did not crack when bent, and there was no problem in an adhesion test involving peeling with Sellotape (registered trademark).

Examples 2-2 to 8 and Comparative Examples 2-1 and 2

Image Formation by Radical Polymerization

Magenta ink 2-1 prepared in Example 2-1 was used as Example 2-2.

Preparation of Inks

Magenta inks 2-2 to 9 were prepared in accordance with the methods described below.

Example 2-3

Magenta Ink 2-2

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Compound 2-B above | 3 parts by weight |
| Polymerization inhibitor (cupferron Al, (manufactured by Wako Pure Chemical Industries, Ltd.)) | 1 part by weight |

Example 2-4

Magenta Ink 2-3

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Compound 2-C above | 3 parts by weight |

Example 2-5

Magenta Ink 2-4

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Triazine polymerization initiator A below | 5 parts by weight |
| Compound 2-A above | 3 parts by weight |
| Polymerization inhibitor (cupferron Al, (manufactured by Wako Pure Chemical Industries, Ltd.)) | 1 part by weight |

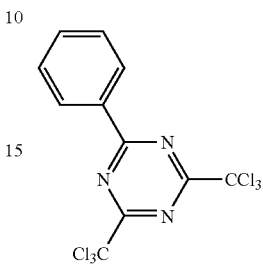

Triazine porimerization initiator A

Example 2-6

Magenta Ink 2-5

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator below (IRGACURE 907, manufactured by CSC) | 5 parts by weight |
| Compound 2-A above | 3 parts by weight |
| Polymerization inhibitor (cupferron Al, (manufactured by Wako Pure Chemical Industries, Ltd.)) | 1 part by weight |

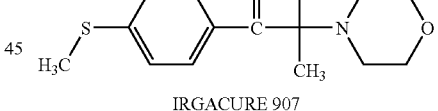

IRGACURE 907

Comparative Example 2-1

Magenta Ink 2-6

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| 9,10-Dibutoxyanthracene | 3 parts by weight |
| Polymerization inhibitor (cupferron Al, (manufactured by Wako Pure Chemical Industries, Ltd.)) | 1 part by weight |

Comparative Example 2-2

Magenta Ink 2-7

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE OXE01, manufactured by CSC) | 5 parts by weight |
| Anthracene | 3 parts by weight |
| Polymerization inhibitor (cupferron Al, (manufactured by Wako Pure Chemical Industries, Ltd.)) | 1 part by weight |

Example 2-7

Magenta Ink 2-8

Magenta ink 2-8 was prepared in the same manner as for magenta ink 2-1 except that Compound M-1 below (oxidation potential +1.37 V) was used as an oil-soluble dye instead of magenta pigment dispersion 1, and filtration was carried out using a filter having an absolute filtration accuracy of 2 μm.

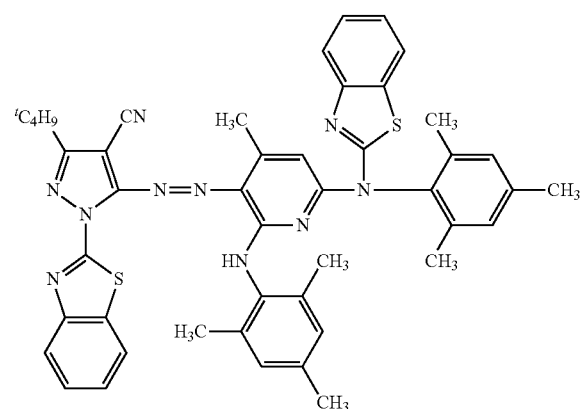

M-1

Example 2-8

Magenta Ink 2-9

Magenta ink 2-9 was prepared in the same manner as for magenta ink 2-1 except that Compound M-2 below (oxidation potential +0.94V) was used as an oil-soluble dye instead of magenta pigment dispersion 1, and filtration was carried out using a filter having an absolute filtration accuracy of 2 μm.

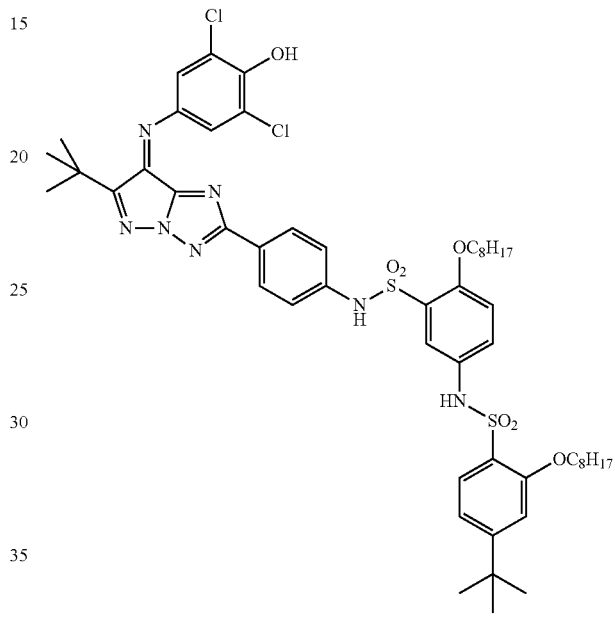

M-2

Crude magenta inks 2-2 to 9 prepared above were filtered using a filter having an absolute filtration accuracy of 2 μm to give magenta inks 2-2 to 9.

Inkjet Image Recording

Images of each color were produced by the same method as in Example 2-1 using the magenta inks 2-2 to 9 prepared as above, and the yellow ink 2-1, cyan ink 2-1, and black ink 2-1 used in Example 2-1.

Evaluation of Inkjet Image

The images thus formed were subjected to evaluation in accordance with the methods described below in terms of sensitivity required for curing, penetration into commercial recycled paper, ink spreading on a grained aluminum support, adhesion, plate life, and storage stability.

Curing Sensitivity Measurement

The exposure energy intensity (mJ/cm$^2$) when a feeling of tackiness disappeared on the image surface after irradiation with ultraviolet rays was defined as the curing sensitivity. The smaller the value, the higher the sensitivity.

Evaluation of Penetration into Commercial Recycled Paper

Images printed on commercial recycled paper were evaluated in terms of penetration in accordance with the criteria below.

Good: Hardly any penetration, no odor of residual monomer.
Fair: Slight penetration, slight odor of residual monomer.
Poor: Ink obviously penetrated to the reverse side, and strong odor of residual monomer.

Evaluation of Ink Spread on Grained Aluminum Support

With respect to an image printed on a grained aluminum support, ink spread was evaluated in accordance with the criteria below.

Good: no spread between adjacent dots.
Fair: dots slightly spread.
Poor: dots spread and image was obviously blurred.

Evaluation of Adhesion to Grained Aluminum Support

With regard to the printed images formed above, a completely undamaged sample and a sample whose printed surface was crosshatched with 11 cuts in both lengthwise and widthwise directions at intervals of 1 mm in accordance with JIS K 5400 to give 100 1 mm squares were prepared, Sellotape was affixed to the printed surface of each sample and peeled off quickly at an angle of 90 degrees, and the condition of the remaining printed image or squares that had not been peeled off was evaluated in accordance with the criteria below.

Good: printed image was not peeled off at all in the crosshatch test.
Fair: the ink was slightly peeled off in the crosshatch test, but unless the ink surface was damaged little was peeled off.
Poor: easily peeled off by Sellotape under both conditions.

Evaluation of Plate Life

An image printed on a grained aluminum support prepared above was used as a printing plate, printing was carried out using a Heidel KOR-D machine, and a relative comparison of the number of prints completed was used as an index for the plate life (the number obtained for Example 2-2 was defined as 100). The larger the number, the longer the plate life, which is preferable.

Storage Stability Evaluation

After storing the prepared ink at 75% RH and 60° C. for 3 days, the ink viscosity at the discharge temperature was measured, and an increase in the ink viscosity was expressed as a viscosity ratio (after storage/before storage). When the viscosity was unchanged and the ratio was close to 1.0, the storage stability was good, and if the ratio exceeded 1.5, clogging might undesirably be caused during discharge.

These evaluation results are shown in Table 6.

TABLE 6

| Ex. | Ink No. | Curing sensitivity (mJ/cm$^2$) | Penetration | Ink spreading | Adhesion | Plate life | Storage stability |
|---|---|---|---|---|---|---|---|
| Ex. 2-2 | Magenta 2-1 | 200 | Good | Good | Good | 100 | 1.2 |
| Ex. 2-3 | Magenta 2-2 | 220 | Good | Good | Good | 80 | 1.2 |
| Ex. 2-4 | Magenta 2-3 | 220 | Good | Good | Good | 80 | 1.2 |
| Ex. 2-5 | Magenta 2-4 | 200 | Good | Good | Good | 100 | 1.2 |
| Ex. 2-6 | Magenta 2-5 | 190 | Good | Good | Good | 110 | 1.2 |
| Ex. 2-7 | Magenta 2-8 | 180 | Good | Good | Good | 120 | 1.2 |
| Ex. 2-8 | Magenta 2-9 | 160 | Good | Good | Good | 130 | 1.2 |
| Comp. Ex. 2-1 | Magenta 2-6 | 400 | Fair | Fair | Poor | 50 | 1.5 |
| Comp. Ex. 2-2 | Magenta 2-7 | 450 | Fair | Fair | Poor | 50 | 1.5 |

Example 2-9

Preparation of Inks

Yellow Ink 2-2

| | |
|---|---|
| Yellow pigment dispersion 1 | 5 parts by weight |
| Initiator (UVI-6992, manufactured by The Dow Chemical Company) | 6 parts by weight |
| Compound 2-A above | 3 parts by weight |
| Polymerizable compounds | 40 parts by weight |
| Monomer: 3,4-epoxycyclohexylmethyl-3',4'-epoxycyclohexanecarboxylate (Celloxide 2021A: manufactured by Daicel-UCB Co., Ltd.) | |
| Monomer: 3,7-bis(3-oxetanyl)-5-Oxanonane (OXT-221: manufactured by Toagosei Co., Ltd.) | 45 parts by weight |
| Basic compound: a-1 (Amine-1 below) | 1 part by weight |

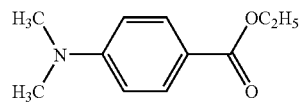

Amine-1
(Compound described in JP-A-2003-305839)

Magenta Ink 2-10

| | |
|---|---|
| Magenta pigment dispersion 1 | 5 parts by weight |
| Initiator (UVI-6992, manufactured by The Dow Chemical Company) | 6 parts by weight |
| Compound 2-A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Cyan Ink 2-2

| | |
|---|---|
| Cyan pigment dispersion 1 | 5 parts by weight |
| Initiator (UVI-6992, manufactured by The Dow Chemical Company) | 6 parts by weight |
| Compound 2-A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Black Ink 2-2

| | |
|---|---|
| Black pigment dispersion 1 | 5 parts by weight |
| Initiator (UVI-6992, manufactured by The Dow Chemical Company) | 6 parts by weight |
| Compound 2-A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

In the same manner as in Example 2-1, yellow ink 2-2, magenta ink 2-10, cyan ink 2-2, and black ink 2-2 prepared above were discharged in the order black, cyan, magenta, and yellow at an environmental temperature of 25° C., and each color was irradiated with UV rays using a VZero 085 metal halide lamp manufactured by Integration Technology so that the total exposure energy per color was 100 mJ/cm$^2$ for all the colors. As recording media, a grained aluminum support, a transparent biaxially stretched polypropylene film whose surface had been treated so as to impart printability, a soft vinyl chloride sheet, a cast coat paper, and a commercial recycled paper were used, each color image was recorded, and an image having high resolution without dot spreading was obtained in all cases. Furthermore, for high quality paper, the ink did not penetrate to the reverse side, the ink was sufficiently cured, and there was hardly any odor due to unreacted monomer. Moreover, the ink recorded on the film had sufficient flexibility, the ink did not crack when bent, and there was no problem in an adhesion test involving peeling with Sellotape (registered trademark).

Examples 2-10 to 16 and Comparative Examples 2-3 to 5

Image Formation by Cationic Polymerization

Magenta ink 2-10 prepared in Example 2-9 was used as Example 2-10.

Preparation of Inks

Magenta inks 2-12 to 19 were prepared in accordance with the methods described below.

Example 2-11

Magenta Ink 2-11

Magenta ink 2-11 was prepared in the same manner as for magenta ink 2-10 except that Compound 2-B above was used instead of Compound 2-A above.

Example 2-12

Magenta Ink 2-12

Magenta ink 2-12 was prepared in the same manner as for magenta ink 2-10 except that Compound 2-D above was used instead of Compound 2-A above.

Example 2-13

Magenta Ink 2-13

Magenta ink 2-13 was prepared in the same manner as for magenta ink 2-10 except that IRGACURE 250 manufactured by CSC was used instead of the initiator (UVI-6992, manufactured by The Dow Chemical Company).

Example 2-14

Magenta Ink 2-14

Magenta ink 2-14 was prepared in the same manner as for magenta ink 2-10 except that Compound 2-E above was used instead of Compound 2-A above.

Comparative Example 2-3

Magenta Ink 2-15

| | |
|---|---|
| Magenta pigment dispersion 1 | 5 parts by weight |
| Initiator (UVI-6992, manufactured by The Dow Chemical Company) | 6 parts by weight |
| Sensitizing dye: 9,10-dibutoxyanthracene | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Comparative Example 2-4

Magenta Ink 2-16

Magenta ink 2-16 was prepared in the same manner as for magenta ink 2-15 except that initiator (IRGACURE 250) was used instead of the initiator (UVI-6992, manufactured by The Dow Chemical Company).

Comparative Example 2-5

Magenta Ink 2-17

Magenta ink 2-17 was prepared in the same manner as for magenta ink 2-15 except that anthracene was used instead of 9,10-dibutoxyanthracene.

Example 2-15

Magenta Ink 2-18

Magenta ink 2-18 was prepared in the same manner as for magenta ink 2-10 except that Compound M-1 below (oxidation potential +1.37 V) was used as an oil-soluble dye instead of the magenta pigment dispersion 1.

M-1

Example 2-16

Magenta Ink 2-19

Magenta ink 2-19 was prepared in the same manner as for magenta ink 2-10 except that Compound M-2 below (oxidation potential +0.94 V) was used as an oil-soluble dye instead of magenta pigment dispersion 1.

M-2

Crude magenta inks 2-11 to 19 prepared above were filtered using a filter having an absolute filtration accuracy of 2 μm to give magenta inks 2-11 to 19.

Inkjet Image Recording

Images of each color were produced in the same manner as in the method described in Example 2-9 using the magenta inks 2-10 to 19 prepared as above, and the yellow ink 2-2, cyan ink 2-2, and black ink 2-2 used in Example 2-9.

Evaluation of Inkjet Image

The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 2-2 was defined as 100.

These evaluation results are given in Table 7.

TABLE 7

| Ex. | Ink No. | Curing sensitivity (mJ/cm$^2$) | Penetration | Ink spreading | Adhesion | Plate life | Storage stability |
|---|---|---|---|---|---|---|---|
| Ex. 2-10 | Magenta 2-10 | 100 | Good | Good | Good | 200 | 1.2 |
| Ex. 2-11 | Magenta 2-11 | 110 | Good | Good | Good | 200 | 1.2 |
| Ex. 2-12 | Magenta 2-12 | 90 | Good | Good | Good | 200 | 1.2 |
| Ex. 2-13 | Magenta 2-13 | 85 | Good | Good | Good | 200 | 1.3 |
| Ex. 2-14 | Magenta 2-14 | 100 | Good | Good | Good | 200 | 1.2 |
| Ex. 2-15 | Magenta 2-18 | 90 | Good | Good | Good | 230 | 1.2 |
| Ex. 2-16 | Magenta 2-19 | 80 | Good | Good | Good | 240 | 1.2 |
| Comp. Ex. 2-3 | Magenta 2-15 | 300 | Fair | Fair | Poor | 70 | 1.5 |
| Comp. Ex. 2-4 | Magenta 2-16 | 250 | Fair | Fair | Poor | 70 | 1.7 |
| Comp. Ex. 2-5 | Magenta 2-17 | 350 | Fair | Fair | Poor | 70 | 1.5 |

It is clear from Table 6 and Table 7 that the ink composition comprising the compound (a-2) having at least three hydroxy groups, alkoxy groups, and/or aryloxy groups on a condensed polycyclic aromatic ring of the present invention has high sensitivity toward radiation, can form a high quality image in terms of image formation properties on paper, and has good storage stability, and even when applied to the production of a printing plate a high quality image with high plate life can be formed.

Examples 2-17 and 18 and Comparative Examples 2-6 and 7

Production of Image by Light Emitting Diode (LED)

Example 2-17

Inkjet image recording was carried out using Magenta ink 2-1 by the same method as in Example 2-1 except that a UV light-emitting diode (UV-LED) was used instead of the VZero 085 metal halide lamp manufactured by Integration Technology.

In this embodiment, an NCCU033, manufactured by Nichia Corporation was used as the UV-LED. The LED emits UV light at a wavelength of 365 nm from 1 chip, and by applying a current of about 500 mA, light of about 100 mW is emitted from the chip. A plurality thereof were aligned at intervals of 7 mm to give a power of 0:3 W/cm$^2$ on the surface of a recording medium (hereinafter, also called a medium). The time from landing to irradiation and the exposure time can be varied by the transport speed of the medium and the distance between a head and the LED in the transport direction. In this embodiment, irradiation was carried out about 0.5 sec. after landing.

The exposure energy on the medium was adjustable in the range of 0.01, to 15 J/cm$^2$ by setting the distance from the medium and the transport speed.

Example 2-18

Inkjet image recording was carried out in the same manner as in Example 2-17 except that Magenta ink 2-10 was used instead of Magenta ink 2-1.

Comparative Example 2-6

Inkjet image recording was carried out in the same manner as in Example 2-17 except that Magenta ink 2-6 was used instead of Magenta ink 2-1.

Comparative Example 2-7

Inkjet image recording was carried out in the same manner as in Example 2-17 except that Magenta ink 2-15 was used instead of Magenta ink 2-1.

Evaluation of Inkjet Image

The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 2-2 was defined as 100.

These evaluation results are given in Table 8.

TABLE 8

| Ex. | Ink No. | Curing sensitivity (mJ/cm$^2$) | Penetration | Ink spreading | Adhesion | Plate life | Storage stability |
|---|---|---|---|---|---|---|---|
| Ex. 2-17 | Magenta 2-1 | 180 | Good | Good | Good | 110 | 1.2 |
| Ex. 2-18 | Magenta 2-10 | 90 | Good | Good | Good | 220 | 1.2 |

TABLE 8-continued

| Ex. | Ink No. | Curing sensitivity (mJ/cm²) | Penetration | Ink spreading | Adhesion | Plate life | Storage stability |
|---|---|---|---|---|---|---|---|
| Comp. Ex. 2-6 | Magenta 2-6 | 500 | Fair | Fair | Poor | 45 | 1.5 |
| Comp. Ex. 2-7 | Magenta 2-15 | 300 | Fair | Fair | Poor | 65 | 1.5 |

It is clear from comparison of the cases shown in Table 6 and Table 7 in which the ultraviolet lamp was used with the case shown in Table 8 in which the UV light emitting diode was used that the use of the UV light emitting diode gave higher sensitivity toward radiation, and even when applied to the production of a printing plate an image with high plate life can be formed.

Example 2-19

Magenta ink 2-20 was prepared in the same manner as for Magenta ink 2-10 except that Initiator A above was used instead of the initiator (UVI-6992, manufactured by The Dow Chemical Company).

Inkjet Image Recording

Images of each color were produced in the same manner as in the method described in Example 2-10 using Magenta ink 2-20 prepared as above.

Evaluation of Inkjet Image

The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 2-2 was defined as 100.

These evaluation results are given in Table 9.

TABLE 9

| Ex. | Ink No. | Curing sensitivity (mJ/cm²) | Penetration | Ink spreading | Adhesion | Plate life | Storage stability |
|---|---|---|---|---|---|---|---|
| Ex. 2-19 | Magenta 2-20 | 85 | Good | Good | Good | 230 | 1.2 |

Synthetic Example 3-1

1.5 g of 9,10-ditoxyethane and 11 g of dodecanethiol were dissolved in 50 g of toluene, 100 mL of $BF_3.Et_2O$ was added thereto, and stirring was carried out at room temperature for 1 hour. Stirring was further carried out at 80° C. for 12 hours. After allowing to cool, 20 mL of a saturated aqueous solution of sodium hydrogen carbonate was added thereto, and the organic layer was extracted with ethyl acetate. Subsequently, drying with magnesium sulfate was carried out, crystals were filtered, distillation under vacuum was carried out, and purification by silica gel chromatography was carried out (ethyl acetate/hexane eluent), thus giving 1.5 g of Compound 3-A (3-I-1) below.

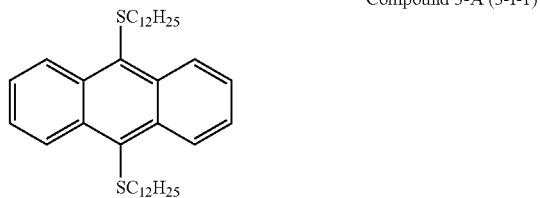

Compound 3-A (3-I-1)

Synthetic Example 3-2

Compound 3-B (3-I-3) was synthesized in the same manner as in the synthetic method for Compound 3-A except that hexanethiol was used instead of dodecanethiol.

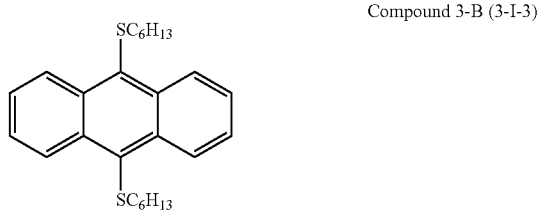

Compound 3-B (3-I-3)

Synthetic Example 3-3

Compound 3-C (3-I-2) was synthesized in the same manner as in the synthetic method for Compound 3-A except that butanethiol was used instead of dodecanethiol.

Compound 3-C (3-I-2)

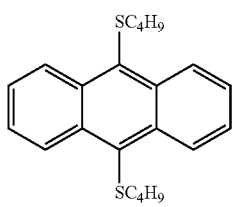

Compound 3-D (3-I-6) and Compound 3-E (3-I-5) below employed 9,10-dibromoanthracene and 9-bromoanthracene manufactured by Tokyo Chemical Industry Co., Ltd.

Compound 3-D (3-I-6)

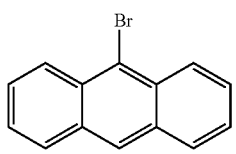

Compound 3-E (3-I-5)

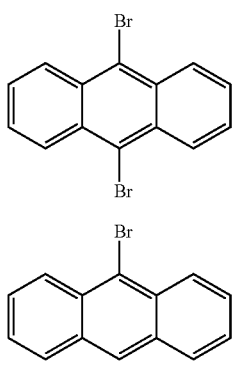

Example 3-1

Preparation of Inks
Yellow Ink 3-1

| | |
|---|---|
| Yellow pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907, manufactured by CSC) | 5 parts by weight |
| Compound 3-A above | 3 parts by weight |
| Polymerization inhibitor (cupferron Al, (manufactured by Wako Pure Chemical Industries, Ltd.)) | 1 part by weight |

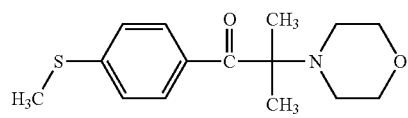

IRGACURE 907

Magenta Ink 3-1

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907, manufactured by CSC) | 5 parts by weight |
| Compound 3-A above | 3 parts by weight |
| Polymerization inhibitor (cupferron Al, (manufactured by Wako Pure Chemical Industries, Ltd.)) | 1 part by weight |

Cyan Ink 3-1

| | |
|---|---|
| Cyan pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907, manufactured by CSC) | 5 parts by weight |
| Compound 3-A above | 3 parts by weight |
| Polymerization inhibitor (cupferron Al, (manufactured by Wako Pure Chemical Industries, Ltd.)) | 1 part by weight |

Black Ink 3-1

| | |
|---|---|
| Black pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907, manufactured by CSC) | 5 parts by weight |
| Compound 3-A above | 3 parts by weight |
| Polymerization inhibitor (cupferron Al, (manufactured by Wako Pure Chemical Industries, Ltd.)) | 1 part by weight |

Inks 3-1 of each color prepared above were filtered using a filter having an absolute filtration accuracy of 2 μm to give Inks 3-1 of wach color.

Inkjet Image Recording

Subsequently, recording was carried out on a recording medium using a commercial inkjet recording device having a piezo system inkjet nozzle. The ink supply system comprised a main tank, a supply pipe, an ink supply tank immediately before an inkjet head, a filter, and a piezo system inkjet head, and a section from the ink supply tank to the inkjet head was thermally insulated and heated. Temperature sensors were provided on the ink supply tank and in the vicinity of the nozzle of the inkjet head, and the temperature was controlled so that the nozzle section was always at 70° C.±2° C. The piezo system inkjet head was driven so as to discharge a multisize dot of 8 to 30 pL at a resolution of 720×720 dpi. The exposure system, the main scanning speed, and the discharge frequency were adjusted so that, after landing, UV light was focused to give an exposure area illumination intensity of 100 mW/cm$^2$, and irradiation started 0.1 sec. after the ink landed on the recording medium. Furthermore, the exposure time was made variable, and exposure energy was applied. Here, dpi referred to in the present invention denotes the number of dots per 2.54 cm.

The inks of each color prepared above were discharged in the order black, cyan, magenta, and yellow at an environmental temperature of 25° C., and each color was irradiated with UV rays using a VZero 085 metal halide lamp manufactured by Integration Technology so that the total exposure energy per color was 150 mJ/cm$^2$ for all the colors. As recording media, a grained aluminum support, a transparent biaxially stretched polypropylene film whose surface had been treated so as to impart printability, a soft vinyl chloride sheet, a cast coat paper, and a commercial recycled paper were used, each color image was recorded, and an image having high resolution without dot spreading was obtained in all cases. Furthermore, for high quality paper, the ink did not penetrate to the reverse side, the ink was sufficiently cured, and there was hardly any odor due to unreacted monomer. Moreover, the ink recorded on the film had sufficient flexibility, the ink did not crack when bent, and there was no problem in an adhesion test involving peeling with Sellotape (registered trademark).

Examples 3-2 to 8 and Comparative Examples 3-1 and 2

Image Formation by Radical Polymerization

Magenta ink 3-1 prepared in Example 3-1 was used as Example 3-2.

Preparation of Inks

Magenta inks 3-2 to 9 were prepared in accordance with the methods described below.

Example 3-3

Magenta Ink 3-2

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907) | 5 parts by weight |
| Compound 3-B above | 3 parts by weight |
| Polymerization inhibitor (cupferron Al, (manufactured by Wako Pure Chemical Industries, Ltd.)) | 1 part by weight |

Example 3-4

Magenta Ink 3-3

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907, manufactured by CSC) | 5 parts by weight |
| Compound 3-C above | 3 parts by weight |

Example 3-5

Magenta Ink 3-4

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Darocur TPO | 5 parts by weight |
| Compound 3-B above | 3 parts by weight |
| Polymerization inhibitor (cupferron Al, (manufactured by Wako Pure Chemical Industries, Ltd.)) | 1 part by weight |

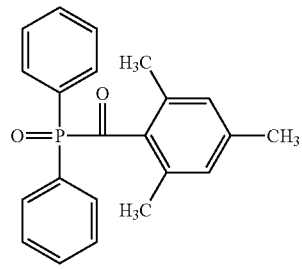

Darocur TPO

Example 3-6

Magenta Ink 3-5

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator below (Darocur TPO manufactured by CSC) | 5 parts by weight |
| Compound 3-D above | 3 parts by weight |
| Polymerization inhibitor (cupferron Al, (manufactured by Wako Pure Chemical Industries, Ltd.)) | 1 part by weight |

Comparative Example 3-1

Magenta Ink 3-6

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907, manufactured by CSC) | 5 parts by weight |
| 9,10-Dibutoxyanthracene | 3 parts by weight |
| Polymerization inhibitor (cupferron Al, (manufactured by Wako Pure Chemical Industries, Ltd.)) | 1 part by weight |

Comparative Example 3-2

Magenta Ink 3-7

| | |
|---|---|
| Magenta pigment dispersion 1 | 5 parts by weight |
| Triethylene glycol diacrylate | 45 parts by weight |
| 1,4-Butanediol diacrylate | 41 parts by weight |
| Polymerization initiator (IRGACURE 907, manufactured by CSC) | 5 parts by weight |

-continued

| Darocur ITX | 3 parts by weight |
| Polymerization inhibitor (cupferron Al; (manufactured by Wako Pure Chemical Industries, Ltd.)) | 1 part by weight |

Example 3-7

Magenta Ink 3-8

Magenta ink 3-8 was prepared in the same manner as for magenta ink 3-1 except that Compound M-1 below (oxidation potential +1.37 V) was used as an oil-soluble dye instead of magenta pigment dispersion 1, and filtration was carried out using a filter having an absolute filtration accuracy of 2 µm.

M-1

Example 3-8

Magenta Ink 3-9

Magenta ink 3-9 was prepared in the same manner as for magenta ink 3-1 except that Compound M-2 below (oxidation potential +0.94V) was used as an oil-soluble dye instead of magenta pigment dispersion 1, and filtration was carried out using a filter having an absolute filtration accuracy of 2 µm.

M-2

Crude magenta inks 3-2 to 9 prepared above were filtered using a filter having an absolute filtration accuracy of 2 µm to give magenta inks 3-2 to 9.

Inkjet Image Recording

Images of each color were produced by the same method as in Example 3-1 using the magenta inks 3-2 to 9 prepared as above and inks 3-1 of each color used in Example 3-1.

Evaluation of Inkjet Image

The images thus formed were subjected to evaluation in accordance with the methods described below in terms of sensitivity required for curing, penetration into commercial recycled paper, ink spreading on a grained aluminum support, adhesion, plate life, and storage stability.

Curing Sensitivity Measurement

The exposure energy intensity ($mJ/cm^2$) when a feeling of tackiness disappeared on the image surface after irradiation with ultraviolet rays was defined as the curing sensitivity. The smaller the value, the higher the sensitivity.

Evaluation of Penetration into Commercial Recycled Paper

Images printed on commercial recycled paper were evaluated in terms of penetration in accordance with the criteria below.

Good: Hardly any penetration, no odor of residual monomer.
Fair: Slight penetration, slight odor of residual monomer.
Poor: Ink obviously penetrated to the reverse side, and strong odor of residual monomer.

Evaluation of Ink Spread on Grained Aluminum Support

With respect to an image printed on a grained aluminum support, ink spread was evaluated in accordance with the criteria below.

Good: no spread between adjacent dots.
Fair: dots slightly spread.
Poor: dots spread and image was obviously blurred.

Evaluation of Adhesion to Grained Aluminum Support

With regard to the printed images formed above, a completely undamaged sample and a sample whose printed surface was crosshatched with 11 cuts in both lengthwise and widthwise directions at intervals of 1 mm in accordance with JIS K 5400 to give 100 1mm squares were prepared, Sellotape was affixed to the printed surface of each sample and peeled off quickly at an angle of 90 degrees, and the condition of the remaining printed image or squares that had not been peeled off was evaluated in accordance with the criteria below.

Good: printed image was not peeled off at all in the crosshatch test.
Fair: the ink was slightly peeled off in the crosshatch test, but unless the ink surface was damaged little was peeled off.
Poor: easily peeled off by Sellotape under both conditions.

Evaluation of Plate Life

An image printed on a grained aluminum support prepared above was used as a printing plate, printing was carried out using a Heidel KOR-D machine, and a relative comparison of the number of prints completed was used as an index for the plate life (the number obtained for Example 3-2 was defined as 100). The larger the number, the longer the plate life, which is preferable.

Storage Stability Evaluation

After storing the prepared ink at 75% RH and 60° C. for 3 days, the ink viscosity at the discharge temperature was measured, and an increase in the ink viscosity was expressed as a viscosity ratio (after storage/before storage). When the viscosity was unchanged and the ratio was close to 1.0, the storage stability was good, and if the ratio exceeded 1.5, clogging might undesirably be caused during discharge.

These evaluation results are shown in Table 10.

TABLE 10

| Ex. | Ink No. | Curing sensitivity (mJ/cm$^2$) | Penetration | Ink spreading | Adhesion | Plate life | Storage stability |
|---|---|---|---|---|---|---|---|
| Ex. 3-2 | Magenta 3-1 | 150 | Good | Good | Good | 100 | 1.2 |
| Ex. 3-3 | Magenta 3-2 | 140 | Good | Good | Good | 110 | 1.2 |
| Ex. 3-4 | Magenta 3-3 | 140 | Good | Good | Good | 110 | 1.2 |
| Ex. 3-5 | Magenta 3-4 | 140 | Good | Good | Good | 110 | 1.2 |
| Ex. 3-6 | Magenta 3-5 | 160 | Good | Good | Good | 90 | 1.2 |
| Ex. 3-7 | Magenta 3-8 | 140 | Good | Good | Good | 110 | 1.2 |
| Ex. 3-8 | Magenta 3-9 | 130 | Good | Good | Good | 120 | 1.2 |
| Comp. Ex. 3-1 | Magenta 3-6 | 500 | Fair | Fair | Poor | 50 | 1.5 |
| Comp. Ex. 3-2 | Magenta 3-7 | 400 | Fair | Fair | Poor | 60 | 1.5 |

Example 3-9

Preparation of Inks

Yellow Ink 3-2

| | |
|---|---|
| Yellow pigment dispersion 1 | 5 parts by weight |
| Initiator (UVI-6992, manufactured by The Dow Chemical Company) | 6 parts by weight |
| Compound 3-A above | 3 parts by weight |
| Polymerizable compounds | 40 parts by weight |
| Monomer: 3,4-epoxycyclohexylmethyl-3',4'-epoxycyclohexanecarboxylate (Celloxide 2021A: manufactured by Daicel-UCB Co., Ltd.) | |
| Monomer: 3,7-bis(3-oxetanyl)-5-oxanonane (OXT-221: manufactured by Toagosei Co., Ltd.) | 45 parts by weight |
| Basic compound: a-1 (Amine-1 below) | 1 part by weight |

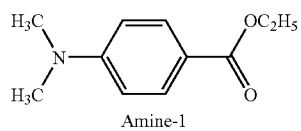

Amine-1
(Compound described in JP-A-2003-305839)

Magenta Ink 3-10

| | |
|---|---|
| Magenta pigment dispersion 1 | 5 parts by weight |
| Initiator (UVI-6992, manufactured by The Dow Chemical Company) | 6 parts by weight |
| Compound 3-A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Cyan Ink 3-2

| | |
|---|---|
| Cyan pigment dispersion 1 | 5 parts by weight |
| Initiator (UVI-6992, manufactured by The Dow Chemical Company) | 6 parts by weight |
| Compound 3-A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Black Ink 3-2

| | |
|---|---|
| Black pigment dispersion 1 | 5 parts by weight |
| Initiator (UVI-6992, manufactured by The Dow Chemical Company) | 6 parts by weight |
| Compound 3-A above | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

In the same manner as in Example 3-1, yellow ink 3-2, magenta ink 3-10, cyan ink 3-2, and black ink 3-2 prepared above were discharged in the order black, cyan, magenta, and yellow at an environmental temperature of 25° C., and each color was irradiated with UV rays using a VZero 085 metal halide lamp manufactured by Integration Technology so that the total exposure energy per color was 150 mJ/cm$^2$ for all the colors. As recording media, a grained aluminum support, a transparent biaxially stretched polypropylene film whose surface had been treated so as to impart printability, a soft vinyl chloride sheet, a cast coat paper, and a commercial recycled paper were used, each color image was recorded, and an image having high resolution without dot spreading was obtained in all cases. Furthermore, for high quality paper, the ink did not penetrate to the reverse side, the ink was sufficiently cured, and there was hardly any odor due to unreacted monomer. Moreover, the ink recorded on the film had sufficient flexibility, the ink did not crack when bent, and there was no problem in an adhesion test involving peeling with Sellotape (registered trademark).

Examples 3-10 to 16 and Comparative Examples 3-3 to 5

Image Formation by Cationic Polymerization

Magenta ink 3-10 prepared in Example 3-9 was used as Example 3-10.
Preparation of Inks
Magenta inks 3-11 to 19 were prepared in accordance with the methods described below.

Example 3-11

Magenta Ink 3-11

Magenta ink 3-11 was prepared in the same manner as for magenta ink 3-10 except that Compound 3-B above was used instead of Compound 3-A above.

Example 3-12

Magenta Ink 3-12

Magenta ink 3-12 was prepared in the same manner as for magenta ink 3-10 except that Compound 3-C above was used instead of Compound 3-A above.

Example 3-13

Magenta Ink 3-13

Magenta ink 3-13 was prepared in the same manner as for magenta ink 3-10 except that IRGACURE 250 was used instead of UVI-6992, manufactured by The Dow Chemical Company.

Example 3-14

Magenta Ink 3-14

Magenta ink 3-14 was prepared in the same manner as for magenta ink 3-10 except that Compound 3-D above was used instead of Compound 3-A above.

Comparative Example 3-3

Magenta Ink 3-15

| | |
|---|---|
| Magenta pigment dispersion 1 | 5 parts by weight |
| Initiator: UVI-6992 (manufactured by The Dow Chemical Company) | 6 parts by weight |
| Sensitizing dye: 9,10-dibutoxyanthracene | 3 parts by weight |
| Polymerizable compounds | |
| Monomer: 3,4-epoxycyclohexylmethyl-3',4'-epoxycyclohexanecarboxylate (Celloxide 2021A: manufactured by Daicel-UCB Co., Ltd.) | 40 parts by weight |
| Monomer: 3,7-bis(3-oxetanyl)-5-oxanonane (OXT-221: manufactured by Toagosei Co., Ltd.) | 45 parts by weight |
| Basic compound: a-1 above | 1 part by weight |

Comparative Example 3-4

Magenta Ink 3-16

Magenta ink 3-16 was prepared in the same manner as for magenta ink 3-15 except that IRGACURE 250 was used instead of UVI-6992 (manufactured by The Dow Chemical Company).

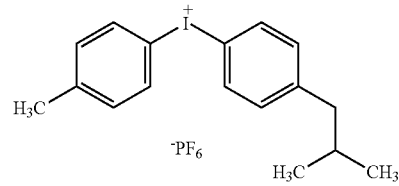

IRGACURE 250

Comparative Example 3-5

Magenta Ink 3-17

Magenta ink 3-17 was prepared in the same manner as for magenta ink 3-15 except that Darocur ITX was used instead of 9,10-dibutoxyanthracene.

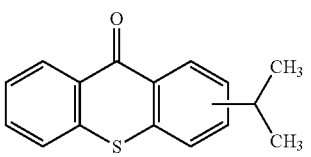

Mixture of 2-isopropyl form and 4-isopropyl form
Darocur ITX

Example 3-15

Magenta Ink 3-18

Magenta ink 3-18 was prepared in the same manner as for magenta ink 3-10 except that Compound M-1 below (oxidation potential +1.37 V) was used as an oil-soluble dye instead of the magenta pigment dispersion 1, and filtration was carried out using a filter having an absolute filtration accuracy of 2 µm.

M-1

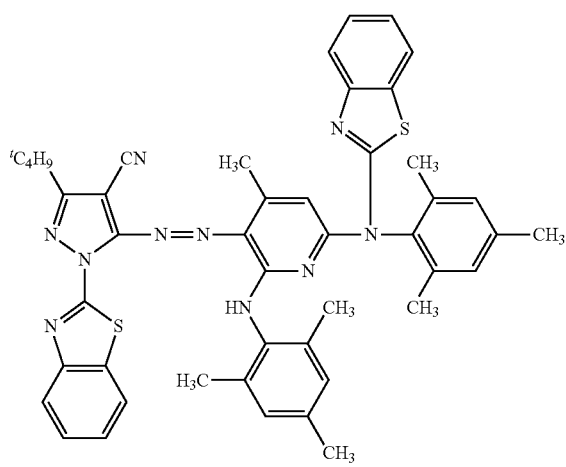

Example 3-16

Magenta Ink 3-19

Magenta ink 3-19 was prepared in the same manner as for magenta ink 3-10 except that Compound M-2 below (oxidation potential +0.94 V) was used as an oil-soluble dye instead of magenta pigment dispersion 1, and filtration was carried out using a filter having an absolute filtration accuracy of 2 µm.

M-2

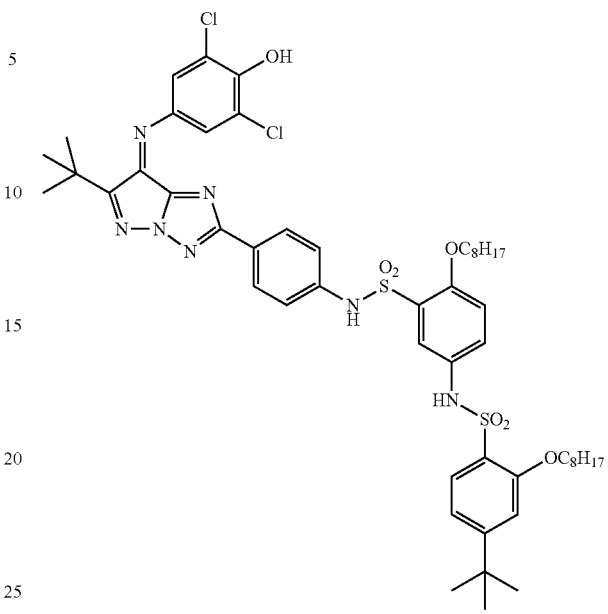

Crude magenta inks 3-11 to 19 prepared above were filtered using a filter having an absolute filtration accuracy of 2 µm to give magenta inks 3-11 to 19.

Inkjet Image Recording

Images of each color were produced in the same manner as in the method described in Example 3-9 using the magenta inks 3-10 to 19 prepared as above and inks 3-2 of each color used in Example 3-9.

Evaluation of Inkjet Image

The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 3-2 was defined as 100.

These evaluation results are given in Table 11.

TABLE 11

| Ex. | Ink No. | Curing sensitivity (mJ/cm²) | Penetration | Ink spreading | Adhesion | Plate life | Storage stability |
|---|---|---|---|---|---|---|---|
| Ex. 3-10 | Magenta 3-10 | 120 | Good | Good | Good | 150 | 1.2 |
| Ex. 3-11 | Magenta 3-11 | 110 | Good | Good | Good | 160 | 1.2 |
| Ex. 3-12 | Magenta 3-12 | 110 | Good | Good | Good | 160 | 1.2 |
| Ex. 3-13 | Magenta 3-13 | 100 | Good | Good | Good | 180 | 1.3 |
| Ex. 3-14 | Magenta 3-14 | 130 | Good | Good | Good | 140 | 1.2 |
| Ex. 3-15 | Magenta 3-18 | 110 | Good | Good | Good | 160 | 1.2 |
| Ex. 3-16 | Magenta 3-19 | 100 | Good | Good | Good | 180 | 1.2 |
| Comp. Ex. 3-3 | Magenta 3-15 | 300 | Fair | Fair | Poor | 70 | 1.5 |
| Comp. Ex. 3-4 | Magenta 3-16 | 250 | Fair | Fair | Poor | 70 | 1.7 |
| Comp. Ex. 3-5 | Magenta 3-17 | 500 | Fair | Fair | Poor | 50 | 1.5 |

It is clear from Table 10 and Table 11 that the ink composition comprising the compound (a-3) having at least one atom having an atomic weight of 32 or greater bonded to a condensed polycyclic aromatic ring and/or one group bonded to the condensed polycyclic aromatic ring via an atom having an atomic weight of 32 or greater has high sensitivity toward radiation, can form a high quality image in terms of image formation properties on paper, and has good storage stability, and even when applied to the production of a printing plate a high quality image with high plate life can be formed.

Examples 3-17 and 18 and Comparative Examples 3-6 and 7

Production of Image by Light Emitting Diode (LED)

Example 3-17

Inkjet image recording was carried out using Magenta ink 3-1 by the same method as in Example 3-1 except that a UV light-emitting diode (UV-LED) was used instead of the VZero 085 metal halide lamp manufactured by Integration Technology.

In this embodiment, an NCCU033 manufactured by Nichia Corporation was used as the UV-LED. The LED emits UV light at a wavelength of 365 nm from 1 chip, and by applying a current of about 500 mA, light of about 100 mW is emitted from the chip. A plurality thereof were aligned at intervals of 7 mm to give a power of 0.3 W/cm$^2$ on the surface of a recording medium (hereinafter, also called a medium). The time from landing to irradiation and the exposure time can be varied by the transport speed of the medium and the distance between a head and the LED in the transport direction. In this embodiment, irradiation was carried out about 0.5 sec. after landing.

The exposure energy on the medium was adjustable in the range of 0.01 to 15 J/cm$^2$ by setting the distance from the medium and the transport speed.

Example 3-18

Inkjet image recording was carried out in the same manner as in Example 3-17 except that Magenta ink 3-10 was used instead of Magenta ink 3-1.

Comparative Example 3-6

Inkjet image recording was carried out in the same manner as in Example 3-17 except that Magenta ink 3-6 was used instead of Magenta ink 3-1.

Comparative Example 3-7

Inkjet image recording was carried out in the same manner as in Example 3-17 except that Magenta ink 3-15 was used instead of Magenta ink 3-1.

Evaluation of Inkjet Image

The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 3-2 was defined as 100.

These evaluation results are given in Table 12.

TABLE 12

| Ex. | Ink No. | Curing sensitivity (mJ/cm$^2$) | Penetration | Ink spreading | Adhesion | Plate life | Storage stability |
|---|---|---|---|---|---|---|---|
| Ex. 3-17 | Magenta 3-1 | 140 | Good | Good | Good | 110 | 1.2 |
| Ex. 3-18 | Magenta 3-10 | 110 | Good | Good | Good | 160 | 1.2 |
| Comp. Ex. 3-6 | Magenta 3-6 | 500 | Fair | Fair | Poor | 70 | 1.5 |
| Comp. Ex. 3-7 | Magenta 3-15 | 300 | Fair | Fair | Poor | 50 | 1.5 |

It is clear from comparison of the cases shown in Table 10 and Table 11 in which the ultraviolet lamp was used with the case shown in Table 12 in which the UV light emitting diode was used that the use of the UV light emitting diode gave higher sensitivity toward radiation, and even when applied to the production of a printing plate an image with high plate life can be formed.

Example 3-19

Magenta ink 3-20 was prepared in the same manner as for Magenta ink 3-10 except that Initiator A above was used instead of the initiator (UVI-6992, manufactured by The Dow Chemical Company).
Inkjet Image Recording Images of each color were produced in the same manner as in the method described in Example 3-10 using, Magenta ink 3-20 prepared as above.
Evaluation of Inkjet Image The images thus formed were subjected to evaluation in accordance with the methods described above in terms of sensitivity required for curing, penetration into commercial recycled paper, ink spreading on a grained aluminum support, adhesion, plate life, and storage stability. As an index for the plate life, the number obtained for Example 3-2 was defined as 100.

These evaluation results are given in Table 13.

TABLE 13

| Ex. | Ink No. | Curing sensitivity (mJ/cm$^2$) | Penetration | Ink spreading | Adhesion | Plate life | Storage stability |
|---|---|---|---|---|---|---|---|
| Ex. 3-19 | Magenta 3-20 | 100 | Good | Good | Good | 180 | 1.2 |

What is claimed is:

1. An ink composition comprising:
(a) a condensed polycyclic aromatic compound selected from the group consisting of:
(a-1) a compound represented by Formula (1-I), wherein the Formula (1-I) has the following structure:

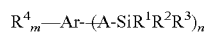
(1-I)

wherein,
Ar denotes a group formed by removing (m+n) hydrogen atoms from the condensed polycyclic aromatic ring;
A denotes a divalent connecting group;
$R^1$ to $R^3$ independently denote a hydrogen atom, a hydrocarbon group, or an alkoxy group;
$R^4$ denotes a monovalent organic group;
the substitution number n for -(A-SiR$^1$R$^2$R$^3$) denotes an integer of 1 or greater; and
the substitution number m for $R^4$ denotes an integer of 0 or greater, provided that (m+n) is no greater than the number of aromatic hydrogen atoms on the condensed polycyclic aromatic ring; and
wherein the condensed polycyclic aromatic ring of the condensed polycyclic aromatic compound (a) is selected from the group consisting of anthracene, phenanthrene, triphenylene, and pyrene;
(a-2) a compound having at least three alkoxy groups and/or aryloxy groups on a condensed polycyclic aromatic ring, and
(a-3) a compound having at least one —SR$^5$ group bonded to a condensed polycyclic aromatic ring via a sulfur atom, in which R$^5$ denotes a hydrogen atom, a hydrocarbon group, or a heterocyclic group;
(b) a polymerization initiator; and
(c) a polymerizable compound.

2. The ink composition according to claim 1, wherein the ink composition comprises a colorant.

3. The ink composition according to claim 2, wherein the colorant is a pigment or an oil-soluble dye.

4. The ink composition according to claim 3, wherein the oil-soluble dye has an oxidation potential of 1.0 V versus a saturated calomel electrode or greater.

5. The ink composition according to claim 1, wherein it is for inkjet recording.

6. An inkjet recording method comprising:
(a') a step of discharging an ink composition onto a recording medium; and
(b') a step of curing the ink composition by irradiating the discharged ink composition with actinic radiation,
wherein the ink composition comprises:
(a) a condensed polycyclic aromatic compound selected from the group consisting of:
(a-1) a compound represented by Formula (1-I), wherein the Formula (1-I) has the following structure:

(1-I)

wherein,
Ar denotes a group formed by removing (m+n) hydrogen atoms from the condensed polycyclic aromatic ring;
A denotes a divalent connecting group;
$R^1$ to $R^3$ independently denote a hydrogen atom, a hydrocarbon group, or an alkoxy group;
$R^4$ denotes a monovalent organic group;
the substitution number n for -(A-SiR$^1$R$^2$R$^3$) denotes an integer of 1 or greater; and
the substitution number m for $R^4$ denotes an integer of 0 or greater, provided that (m+n) is no greater than the number of aromatic hydrogen atoms on the condensed polycyclic aromatic ring; and
wherein the condensed polycyclic aromatic ring of the condensed polycyclic aromatic compound (a) is selected from the group consisting of anthracene, triphenylene, pyrene, and phenanthrene;
(a-2) a compound having at least three alkoxy groups and/or aryloxy groups on a condensed polycyclic aromatic ring, and
(a-3) a compound having at least one SR$^5$ bonded to a condensed polycyclic aromatic ring via a sulfur atom, in which R$^5$ denotes a hydrogen atom, a hydrocarbon group, or a heterocyclic group;
(b) a polymerization initiator; and
(c) a polymerizable compound.

7. The inkjet recording method according to claim 6, wherein the actinic radiation is ultraviolet radiation emitted by a light emitting diode that has a light emission peak wavelength in the range of 350 to 420 nm and generates ultraviolet radiation whose maximum illumination intensity on the surface of a recording medium is 10 to 2,000 mW/cm².

8. A process for producing a lithographic printing plate, the process comprising:

(a″) a step of discharging an ink composition onto a hydrophilic support; and (b″) a step of curing the ink composition by irradiating the discharged ink composition with actinic radiation so as to form a hydrophobic image on the hydrophilic support from the cured ink composition wherein, the ink composition comprises:

(a) a condensed polycyclic aromatic compound selected from the group consisting of:

(a-1) a compound represented by Formula (1-I), wherein the Formula (1-I) has the following structure:

(1-I)

wherein,

Ar denotes a group formed by removing (m + n) hydrogen atoms from the condensed polycyclic aromatic ring;

A denotes a divalent connecting group;

$R^1$ to $R^3$ independently denote a hydrogen atom, a hydrocarbon group, or an alkoxy group;

$R^4$ denotes a monovalent organic group;

the substitution number n for -(A-SiR$^1$R$^2$R$^3$) denotes an integer of 1 or greater; and the substitution number m for $R^4$ denotes an integer of 0 or greater, provided that (m+n) is no greater than the number of aromatic hydrogen atoms on the condensed polycyclic aromatic ring, and wherein the condensed polycyclic aromatic ring of the condensed polycyclic aromatic compound (a) is selected from the group consisting of anthracene, triphenylene, pyrene, and phenanthrene;

(a-2) a compound having at least three alkoxy groups and/or aryloxy groups on a condensed polycyclic aromatic ring; and (a-3) a compound having at least one SR$^5$ group bonded to a condensed polycyclic aromatic ring via a sulfur atom, in which R$^5$ denotes a hydrogen atom, a hydrocarbon group, or a heterocyclic group;

(b) a polymerization initiator; and (c) a polymerizable compound.

\* \* \* \* \*